United States Patent
Boyden et al.

(10) Patent No.: US 8,254,719 B2
(45) Date of Patent: *Aug. 28, 2012

(54) INPUT COMPENSATING FOR IMAGING DISTORTION

(75) Inventors: Edward S. Boyden, Cambridge, MA (US); Roderick A. Hyde, Redmond, WA (US); Muriel Y. Ishikawa, Livermore, CA (US); Edward K. Y. Jung, Bellevue, WA (US); Eric C. Leuthardt, St. Louis, MO (US); Nathan P. Myhrvold, Medina, WA (US); Dennis J. Rivet, St. Louis, MO (US); Michael A. Smith, San Gabriel, CA (US); Clarence T. Tegreene, Bellevue, WA (US); Thomas A. Weaver, San Mateo, CA (US); Charles Whitmer, North Bend, WA (US); Lowell L. Wood, Jr., Bellevue, WA (US); Victoria Y. H. Wood, Livermore, CA (US)

(73) Assignee: The Invention Science Fund I, LLC

( * ) Notice: Subject to any disclaimer, the term of this patent is extended or adjusted under 35 U.S.C. 154(b) by 0 days.

This patent is subject to a terminal disclaimer.

(21) Appl. No.: 12/928,252

(22) Filed: Dec. 6, 2010

(65) Prior Publication Data
US 2011/0188777 A1    Aug. 4, 2011

Related U.S. Application Data

(63) Continuation of application No. 11/598,214, filed on Nov. 9, 2006, now Pat. No. 7,873,234.

(51) Int. Cl.
*G06K 9/40* (2006.01)
*G06K 9/00* (2006.01)
(52) U.S. Cl. ...................... 382/275; 382/131
(58) Field of Classification Search .......... 382/128–134, 382/254–255, 260, 274–275, 289, 299, 305, 382/312; 345/647; 356/492; 600/411, 547
See application file for complete search history.

(56) References Cited

U.S. PATENT DOCUMENTS

| | | | |
|---|---|---|---|
| 6,594,516 B1 * | 7/2003 | Steckner et al. | 600/411 |
| 6,683,456 B1 | 1/2004 | Kinanen | |
| 6,720,767 B2 | 4/2004 | Yamazaki | |
| 6,809,619 B1 | 10/2004 | Xu et al. | |
| 6,828,792 B1 | 12/2004 | Danby et al. | |
| 6,965,236 B2 | 11/2005 | Havens | |
| 6,980,000 B2 | 12/2005 | Wong et al. | |
| 7,109,711 B2 | 9/2006 | Kiefer | |

OTHER PUBLICATIONS

U.S. Appl. No. 11/588,193, Boyden et al.

(Continued)

*Primary Examiner* — Kanjibhai Patel

(57) ABSTRACT

Certain aspects can relate to obtaining at least some input compensating information at least partially based on the distortion characterizing imaging information that when applied to an imaging modality used to obtain the at least one image information can limit distortions to the at least the portion of the at least one image information resulting from at least a portion of at least one distorting feature, wherein the at least some input compensating information is characterized based at least in part on the at least one relative orientation of the at least the portion of the at least one distorting feature relative to the at least one image information.

50 Claims, 17 Drawing Sheets

OTHER PUBLICATIONS

Balac, S. et al.; "Mathematic modeling and numerical simulation of magnetic susceptibility artifacts in magnetic resonance imaging"; Computer Methods Biomechanics and Biomedical Engineering ;2000; pp. 335-359; vol. 3.

Banks, Scott A. et al.; "Accurate Measurement of Three-Dimensional Knee Replacement Kinematics Using Single-Plane Fluoroscopy"; IEEE Transactions on Biomedical Engineering; Jun. 1996; pp. 638-649; vol. 43, No. 6.

Budinger, Thomas F.; Vanbrocklin, Henry F.; "Positron-Emission Tomography (PET)"; The Biomedical Engineering Handbook, Second Edition; bearing a date of 2000; pp. 67-1 to 67-17; vol. 1; CRC Press LLC.

Chang, Hsuan; Fitzpatrick, J. Michael; "A Technique for Accurate Magnetic Resonance Imaging in the Presence of Field Inhomogeneities"; IEEE Transactions on Medical Imaging; bearing a date of Sep. 1992; pp. 319-329; vol. 11, No. 3; IEEE.

Hornak, PH.D., Joseph P.; "The Basics of MRI"; bearing a date of 1996-2006; printed on Sep. 13, 2006; pp. 1-117; located at http://www.cis.rit.edu/htbooks/mri/inside.htm.

Graf, Hansjörg; Steidle, Günter; Martirosian, Petros; Lauer, Ulrike A.; Schick, Fritz; "Metal artifacts caused by gradient switching"; Wiley InterScience; bearing dates of Oct. 8, 2004, Jan. 25, 2005, Jan. 27, 2005, Jun. 20, 2005 and 1999-2006, printed on Sep. 14, 2006; pp. 1-3; John Wiley & Sonc, Inc.; located at http://www3.interscience.wiley.com/cgi-bin/abstract/110541530/ABSTRACT#search=%22Magnetic%20Resonance%20in%20Medicine%20Metal%20artifacts%20caused%20by%20gradient%20switching%22.

Mathieu, J-B.; Martel, S.; Yahia, L'H.; Soulez, G.; Beaudoin, G.; "MRI Systems as a Mean of Propulsion for a Microdevice in Blood Vessels"; pp. 3419-3422; located at http://www.nano.polymtl.ca/Articles/2003/MRI%20Syst%20Mean%20Prop%20Microdev%20Blood%20Vess%20proceedings%20P3419.pdf.

Müller-Bierl, Bernd; Graf, Hansjörg; Steidle, Günter; Schick, Fritz; "Compensation of magnetic field distortions from paramagnetic instruments by added diamagnetic material: Measurements and numerical simulations"; Medical Physics Online; bearing dates of Apr. 29, 2004, Oct. 13, 2004, Dec. 16, 2004, Jan. 2005, and 2006; pp. 1-2; The American Association of Physicists in Medicine; located at http://scitation.aip.org/getabs/servlet/GetabsServlet?prog=normal&id=MPHYA6000032000001000076000001&idtype=cvips&gifs=yes.

Pauchard, Yves; Smith, Michael R.; Mintchev, Martin P.; "Improving Geometric Accuracy in the Presence of Susceptibility Difference Artifacts Produced by Metallic Implants in Magnetic Resonance Imaging"; IEEE Transactions on Medical Imaging; bearing a date of Oct. 2005; pp. 1387-1399; vol. 24, No. 10; IEEE.

Stroh, Albrecht; Faber, Cornelius; Neuberger; Thomas; Lorenz, Peer; Sieland, Katharina; Jakob, Peter M.; Webb, Andrew; Pilgrimm, Herbert; Schober, Ralf; Pohl, Elena E.; Zimmer, Claus; "In vivo detection limits of magnetically labeled embryonic stem cells in the rat brain using high-field (17.6 T) magnetic resonance imaging"; Elsevier, NeuroImage; bearing dates of 2004 and 2005; pp. 635-645; vol. 24; Elsevier Inc.

Rawat, Banmali S.; Kong, Jin Au; Bate, Geoffrey; Kryder, Mark H.; "Electromagnetics", "Electromagnetic Fields", "Magnetism and Magnetic Fields"; The Electrical Engineering Handbook, Second Edition; bearing a date of 1997; pp. 887-914 (pp. 898 intentionally left blank by publisher); CRC Press LLC.

Woo, Joseph; "Obstetric Ultrasound, A Comprehensive Guide"; Ob-ultrasound.net; printed on Oct. 11, 2006; pp. 1-14; located at http://www.ob-ultrasound.net/.

\* cited by examiner

Legend to FIG. 18

| FIG. 18a | FIG. 18b |
| FIG. 18c |
| FIG. 18d |
| FIG. 18e |
| FIG. 18f |

2100 obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information 2102 imaging the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information 2120 retrieving from a memory storage device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information 2121 receiving from another device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information 2122 obtaining at least one non-optical electromagnetic image information that can be distorted at least partially resulting from the at least the portion of the at least one distorting feature, wherein the at least the portion of the at least one distorting feature can be characterized based at least in part on an electromagnetic distortion characterizing imaging information whose characterizing can vary, at least in part, based on the at least one relative orientation of the at least the portion of the at least one distorting feature relative to the at least one non-optical electromagnetic image information 2124

FIG. 18a

Legend to FIG. 18

| FIG. 18a | FIG. 18b |
|---|---|
| FIG. 18c | |
| FIG. 18d | |
| FIG. 18e | |
| FIG. 18f | |

2100 →

(G) obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information 2102 obtaining at least one X-ray based image information that can be distorted at least partially resulting from the at least the portion of the at least one distorting feature, wherein the at least the portion of the at least one distorting feature can be characterized based at least in part on an X-ray distortion characterizing imaging information whose characterizing can vary, at least in part, based on the at least one relative orientation of the at least the portion of the at least one distorting feature relative to the at least one X-ray image information 2126 obtaining at least one magnetic-resonance based image information that can be distorted at least partially resulting from the at least the portion of the at least one distorting feature, wherein the at least the portion of the at least one distorting feature can be characterized based at least in part on a magnetic-resonance based distortion characterizing imaging information whose characterizing can vary, at least in part, based on the at least one relative orientation of the at least the portion of the at least one distorting feature relative to the at least one magnetic-resonance based image information 2128 obtaining at least one nuclear resonant image information that can be distorted at least partially resulting from the at least the portion of the at least one distorting feature, wherein the at least the portion of the at least one distorting feature can be characterized based at least in part on a nuclear resonant distortion characterizing imaging information whose characterizing can vary, at least in part, based on the at least one relative orientation of the at least the portion of the at least one distorting feature relative to the at least one nuclear resonant image information 2130 obtaining at least one tomography-based image information that can be distorted at least partially resulting from the at least the portion of the at least one distorting feature, wherein the at least the portion of the at least one distorting feature can be characterized based at least in part on a tomography-based distortion characterizing imaging information whose characterizing can vary, at least in part, based on the at least one relative orientation of the at least the portion of the at least one distorting feature relative to the at least one tomography-based image information 2132

| Legend to FIG. 18 |
|---|
| FIG. 18a \| FIG. 18b |
| FIG. 18c |
| FIG. 18d |
| FIG. 18e |
| FIG. 18f | obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information 2106 obtaining at least some input particle tracker compensating information at least partially based on the distortion characterizing imaging information that when applied to the imaging modality used to obtain the at least one image information can limit the distortions to the at least one image information resulting from the at least the portion of the at least one distorting feature, wherein the obtaining the at least some input particle tracker compensating information is based at least in part on the at least one relative orientation of the at least the portion of the at least one distorting feature relative to the at least one image information 2153 obtaining at least some input Maxwell solver compensating information at least partially based on the distortion characterizing imaging information that when applied to the imaging modality used to obtain the at least one image information can limit the distortions to the at least one image information resulting from the at least the portion of the at least one distorting feature, wherein the obtaining the at least some input Maxwell solver compensating information is based at least in part on the at least one relative orientation of the at least the portion of the at least one distorting feature relative to the at least one image information 2152 obtaining at least some input time domain/frequency domain transform compensating information at least partially based on the distortion characterizing imaging information that when applied to the imaging modality used to obtain the at least one image information can limit the distortions to the at least one image information resulting from the at least the portion of the at least one distorting feature, wherein the obtaining the at least some input time domain/frequency domain transform compensating information is based at least in part on the at least one relative orientation of the at least the portion of the at least one distorting feature relative to the at least one image information 2150

Legend to FIG. 18

| FIG. 18a | FIG. 18b |
|---|---|
| FIG. 18c | |
| FIG. 18d | |
| FIG. 18e | |
| FIG. 18f | |

2100

(K)

predicting the at least some input compensating information based at least in part on an orientation of the at least the portion of the at least one distorting feature 2160 predicting the at least some input compensating information based at least in part on a position of the at least the portion of the at least one distorting feature 2162 predicting the at least some input compensating information based at least in part on an angle of the at least the portion of the at least one distorting feature 2164 predicting the at least some input compensating information based at least in part on a surface or material characteristic of the at least the portion of the at least one distorting feature 2166 predicting the at least some input compensating information based at least in part on a degrading environment which the at least the portion of the at least one distorting feature has been exposed 2168 predicting the at least some input compensating information based at least in part on a duration which the at least the portion of the at least one distorting feature has been exposed to a degrading environment 2170 predicting the at least some input compensating information based at least in part on at least one other element which the at least the portion of the at least one distorting feature at least partially contacts 2172 establishing a library of the distortion characterizing imaging information associated with at least some of the at least the portion of the at least one distorting feature 2174 establishing a library of the input compensating information associated with at least some of the at least the portion of the at least one distorting feature 2175

| FIG. 18a | FIG. 18b |
|---|---|
| FIG. 18c | |
| FIG. 18d | |
| FIG. 18e | |
| FIG. 18f | |

Legend to FIG. 18

2100 modifying the at least some input compensating information associated with at least some of the at least the portion of the at least one distorting feature 2176 associating the at least some input compensating information with the at least one image information 2178 modifying a non-optical electromagnetic field at least partially generated utilizing the at least some input compensating information in a dynamic fashion 2180 filtering the distortion at least partially resulting from the at least the portion of the at least one distorting feature at least partially based upon the at least some input compensating information 2182 filtering out the distortion at least partially resulting from the at least the portion of the at least one distorting feature at least partially based upon the at least some input compensating information 2184 filtering out the distortion at least partially resulting from the at least the portion of the at least one distorting feature at least partially based upon the at least some input compensating information to limit at least some effects of the distortion on imaging of the at least the portion of the at least one distorting feature 2186 filtering out the distortion at least partially resulting from the at least the portion of the at least one distorting feature at least partially based upon the at least some input compensating information to limit at least some effects of the distortion on imaging of an at least a portion of an individual 2188 observing an interface between one or more surfaces of the at least the portion of the at least one distorting feature and at least a portion of an individual 2190 observing an interface between two or more surfaces of at least one of the at least the portion of the at least one distorting feature 2192 altering a non-optical electromagnetic, magnetic, or X-ray effect as applied in proximity to the at least the portion of the at least one distorting feature at least partially in response to the at least one image information 2194 altering a non-optical electromagnetic, magnetic, or X-ray effect as applied in proximity to the at least the portion of the at least one distorting feature at least partially in response to the at least one image information 2195

FIG. 18f

INPUT COMPENSATING FOR IMAGING DISTORTION

For purposes of the USPTO extra-statutory requirements, the present application constitutes a continuation of U.S. patent application No. 11/598,214, entitled INPUT COMPENSATING FOR IMAGING DISTORTION, naming EDWARD S. BOYDEN, RODERICK A. HYDE, MURIEL Y. ISHIKAWA, EDWARD K.Y. JUNG, ERIC C. LEUTHARDT, NATHAN P. MYHRVOLD, DENNIS J. RIVET, MICHAEL A. SMITH, CLARENCE T. TEGREENE, THOMAS A. WEAVER, CHARLES WHITMER, LOWELL L. WOOD, JR. AND VICTORIA Y.H. WOOD as inventors, filed 9 Nov. 2006, now U.S. Pat. No. 7,873,234 which is currently or is an application of which a currently application is entitled to the benefit of the filing date.

TECHNICAL FIELD

Certain aspects of this disclosure can relate to, but are not limited to, distortion compensator(s), and associated mechanisms and/or techniques.

DETAILED DESCRIPTION

Figure 1:
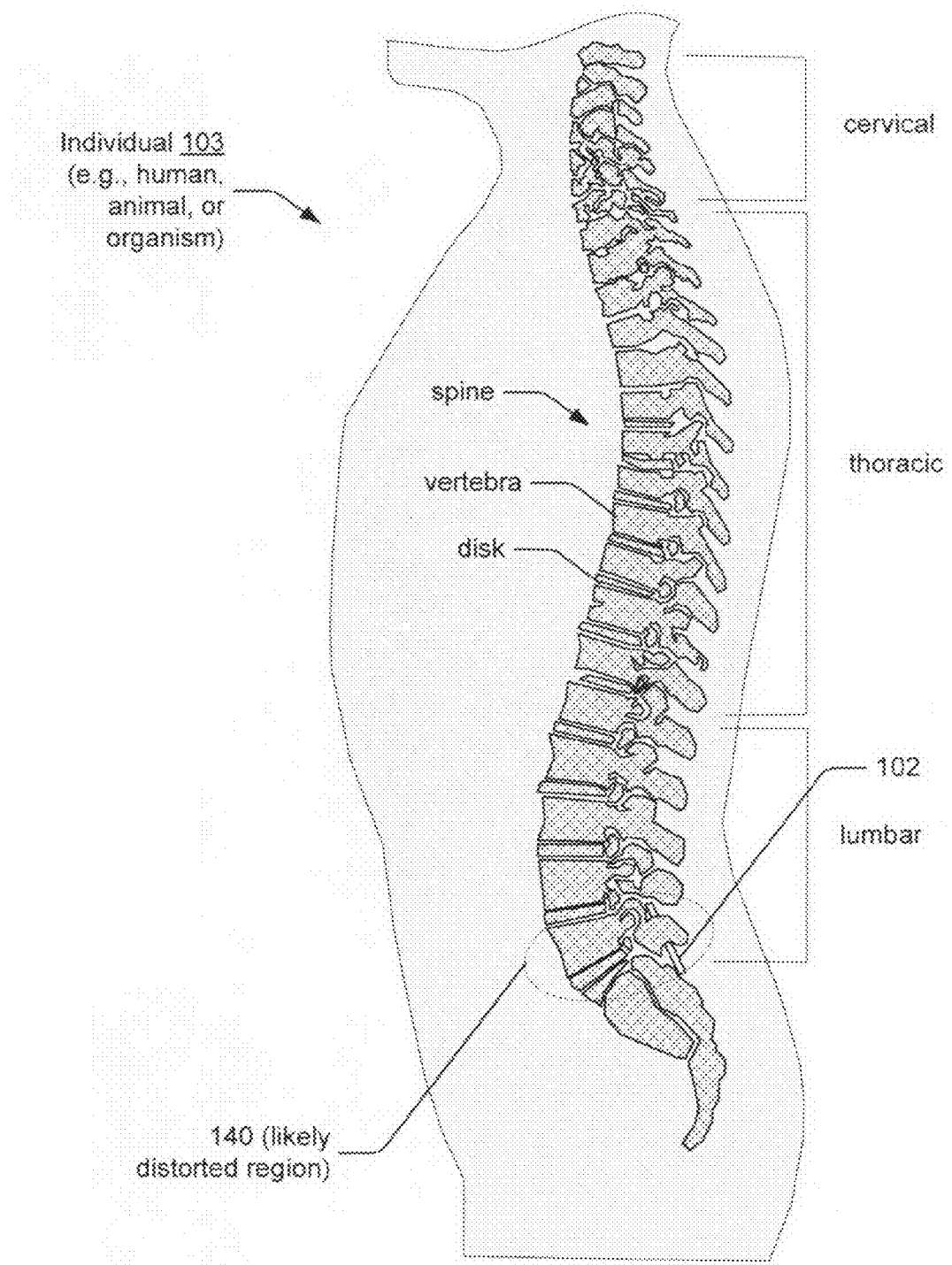
FIG. 1 is a diagram of an embodiment of a distorting feature as associated with (e.g., inserted within or otherwise associated with) an individual that can distort an image taken by a distortion susceptible imaging device.

At least certain portions of the text of this disclosure (e.g., claims and/or detailed description and/or drawings as set forth herein) can support various different claim groupings and/or various different applications. Although, for sake of convenience and understanding, the detailed description can include section headings that generally track various different concepts associated with claims or general concepts contained therein, and is not intended to limit the scope of the invention as set forth by each particular claim. It is to be understood that support for the various applications or portions thereof thereby can appear throughout the text and/or drawings at one or more locations, irrespective of the section headings.

It is to be noted that distortion compensating systems and methods have been suggested as a basis for limiting distortion as resulting from a distorting feature. In that regard, see the subject matter of the following commonly assigned related applications which are incorporated herein by reference: U.S. Ser. No. 11/588,193, filed 25 Oct. 2006, entitled Distorting Feature Compensating (incorporated herein by reference in its entirety).

1. Certain Embodiments Of A Distortion Compensator

This disclosure describes a number of embodiments of, and a number of applications for, a distortion compensator 100. Certain embodiments of the distortion compensator 100 can limit distortion of imaging which can result at least partially from, for example, a variety of embodiments of an at least one distortion susceptible imaging device(s) 104. Within this disclosure, the term "imaging" can include, but is not limited to, any type of imaging or image capturing, photographing, etc. Certain embodiments of the at least one distortion susceptible imaging device(s) 104 may be configured as a variety of imaging, photographing, video, moving image, or other such mechanims, as described in this disclosure with respect to FIG. 3 as well as at other locations throughout this disclosure. As such, certain embodiments of the distortion susceptible imaging device(s) 104, as well as certain embodiments of the distortion compensator 100, can utilize a variety of computer, imager, non-optical electromagnetic, electronic, cell phone based, X-ray, electro-mechanical, mechanical mechanisms or imaging modalities and/or other techniques, mechanisms, or imaging modalities, as described in this disclosure. Certain aspects of such non-optical electromagnetic, X-ray, or particle bombardment imaging techniques or imaging modalities are generally understood by those skilled in the particular respective imaging device technologies. A variety of distortion compensators can thereby at least partially rely on a variety of imaging modalities or imaging device(s), such as a variety of embodiments of the at least one distortion susceptible imaging device(s) 104 as described in this disclosure.

Certain embodiments of the distortion susceptible imaging device(s) 104 or imaging modalities can include, but are not limited to; magnetic resonance imaging (MRI), X-ray imaging (e.g., fluoroscopy), X-ray Computed Tomography (CT or CAT) scans, X-ray imaging, X-ray backscattering imaging, Photon Emission Tomography (PET) scans, Single Photon Emission Computed Tomography (SPECT) scans, as well as other non-optical electromagnetic imaging, nuclear resonance imaging, and/or other combinations, modifications, and/or developments of these imagers or imaging modalities. Each of these embodiments of the distortion susceptible imaging device(s) and their associated imaging modalities, as well as others, can suffer from various types and degrees of imaging distortion(s) at least partially resulting from imaging the at least one distorting feature(s) 102, as described in this disclosure. Within this disclosure, different embodiments of the distortion compensator 100 can limit or reduce the amount or effects of the imaging distortion considering, at least in part, on the particular techniques, peculiarities, and/or processes associated with each particular imaging modality. Certain embodiments of the distortion susceptible imaging device(s) 104 can also include other imaging mechanisms and/or techniques whose images are susceptible to distortion based at least in part on the distorting feature(s) 102.

Certain embodiments of the disclosure can include, but are not limited to, depending upon context, obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information.

Certain embodiments of the disclosure can include, but are not limited to, depending upon context, one or more instructions that when executed by one or more processors can cause one or more distortion compensator libraries associated with one or more imaging devices to store a distortion characterizing imaging information such as can be recalled. The one or more instructions can be characterized at least in part by an at least a portion of an at least one distorting feature based at least in part on an at least one relative orientation of the at least the portion of the at least one distorting feature that can be associated with an at least a portion of an individual. Certain embodiments of the distortion compensator libraries can store instructions or information relating to multiple distorting features that can be combined in a variety of compounded configurations (such as with a compounded implant assembly such as an artificial knee joint or relatively complex structure, or other compounded distorting feature).

While the instructions can be characterized according to the orientation of each of the at least one distorting feature(s) 104, when compounded or complex distorting feature(s) are provided such as can be stored in the one or more distortion compensator libraries, the distortion characterizing information from each of the component distorting feature(s) 104 has to be considered, as well as reduced by any overlap effect. For compounded or complex distorting feature(s), the distortion characterizing information can be determined computationally or empirically as desired, and maintained in certain embodiments of the one or more distortion compensator libraries as described in this disclosure.

The distortion characterizing information associated with each at least one distorting feature(s) 104 can vary, for example. In general though, certain embodiments of the distortion characterizing information are at least partially based on an orientation of the distorting feature(s). For example, certain embodiments of the at least one distorting feature(s) can interface differently with non-optical electromagnetic radiation (as could be characterized by the distortion characterizing information) in a manner that could vary based at least in part on the orientation of the distorting feature. Consider that certain distorting feature(s) may distort non-optical electromagnetic radiation differently depending on the angle, position, surface characteristics, material characteristics, etc. of the distorting feature(s).

Certain embodiments of this disclosure can relate to, but is not limited by, obtaining the at least some input compensating information that can be characterized, at least in part, by at least one relative orientation of at least a portion of an at least one distorting feature associated with an at least a portion of an individual. In addition, responsive to the at least some input compensating information, imaging a region internal to the individual in a manner to limit at least some distorting effects of the at least one distorting feature associated with the at least the portion of the individual at least partially by modifying a non-optical electromagnetic output from an imaging modality as applied to the at least the portion of the at least one distorting feature associated with the at least the portion of the individual.

Certain embodiments of the creating at least one conformal absence of a non-optical electromagnetic output (whose imaging modality may include, but is not limited to, MRI, X-ray, etc.) can limit distortion to an imaging of an at least a portion of an individual resulting at least partially from at least one distorting feature associated with the at least the portion of the individual. As such, the particular imaging modality can reduce the non-optical electromagnetic output that can be applied to the at least one distorting feature(s) 104.

Within this disclosure, the input compensating information (which can be applied to at least a portion of an individual associated with the at least one distorting feature during imaging) can include, but is not limited to, depending on context, one or more information, one or more signal, one or more field, or one or more other entity (or combination, modification, or alteration of) which can be applied to the individual as at least a portion of the imaging modality. As such, certain embodiments of the input compensating information can be considered to modify or otherwise alter the imaging modality input information, one or more imaging modality input signal, one or more imaging modality input field, or one or more other imaging modality input entity (or combination, modification, or alteration of such as may be used by the conventional imaging modality in the process of imaging), such as to compensate for the imaging distortions at least partially from the at least one distorting feature(s) 104 as described in this disclosure. Certain embodiments of the input compensating information may utilize non-optical electromagnetic, particle bombardment imaging techniques as described in this disclosure, or utilize other imaging modalities or combination thereof as described in this disclosure.

The distortions that are limited in the at least one image information at least partially by the obtaining at least some input compensating information can include, but are not limited to, distortions by the at least one distorting feature(s) 104 blocking the non-optical electromagnetic radiation of the image information during imaging. Such distortions can also include artifacts, such as may exist when the non-optical electromagnetic radiation is deflected or diverted around the at least one distorting feature(s). Such artifacts may effectively degrade, or at least greatly limit, imaging of not only the region of the at least one distorting feature(s) 104, but a considerable space about the at least one distorting feature(s) 104 itself. The particulars about the distortion that can result from particular distorting feature(s), as well as artifacts, may likely vary depending at least in part on the particular imaging modality as well as the particular distorting feature.

There is often considerable information which may be desired to be obtained from such regions around the at least one distorting feature(s) 104, as well as the region of the artifacts. For example, following insertion of certain distorting feature(s) such as an implant, or even a complex structure, within the individual, it would be desired to ensure that the at least one distorting feature(s) is configured or arranged as desired.

A variety of embodiments of the distortion susceptible imaging device(s) 104, as well as their at least partially utilized imaging modalities, are described in this disclosure. It is to be understood that certain ones of the embodiments of the distortion susceptible imaging device(s) 104 and/or the imaging modalities as described in this disclosure can be illustrative in nature but not limiting in scope, depending upon the particular context.

Certain embodiments of the distortion susceptible imaging device(s) 104 can include MRI as the imaging modality, whose operation involves an application of non-optical electromagnetic radiation (in particular a magnetic field) to an imaged region of the individual. Within this disclosure, depending on context, certain embodiments of the individual can include, but are not limited to, at least one person, animal, or organism that can be imaged. Certain embodiments of the organism that can be imaged may be situated in a host animal (e.g., human) in-vivo or otherwise, or alternately may be imaged by itself or in a group.

MRI is based on the principles of nuclear magnetic resonance (NMR), which in general can be considered as a spectroscopic technique such as can be utilized to obtain microscopic chemical and physical information about molecules. Certain MRI embodiments of the distortion susceptible imaging device(s) 104 can typically involve generation of images in the form of one or more (typically multiple successive) planar imaging slice(s). Certain commercially available MRI embodiments of the imagers can be relatively large, expensive, and are made commercially available from such companies as GE, Toshiba, or Siemens. MRI is recognized as being able to image optically opaque material such as soft tissue, such as muscle, fat, cells (biological, blood, as well as others), etc. as present in humans and animals (as well as to some degree certain harder materials). Smaller embodiments of the MRIs can be provided to scan smaller regions of the individual, or other object.

Certain embodiments of the MRI imagers can generally include a static field magnet and a set of gradient magnets (not shown, but generally understood by those skilled in the art). The static field magnet can generate a magnetic field that may be sufficient to precess spin in at least some of the atoms of the individual. The gradient magnets are each respectively arranged along at least one of the three orthogonal axes (not shown one for each axis), such as when combined being able to create a multi-dimensional controllable gradient within the MRI. Such multi-dimensional gradients can be varied and/or modified. In certain instances, such variation and/or modification of the multi-dimensional gradients can be utilized to effect the at least some input compensating information, as described in this disclosure.

In certain instances, the static field magnet can thereby be sufficient to precess spin vectors of certain atomic nuclei within the individual or other object, thereby causing the spin to precess relative to the static axis as provided by the static field magnet. The relaxation of the atoms (in the object undergoing MRI such as the individual) can be utilized by the MRI during imaging. The imaging can vary depending on the material being imaged as well as the imaging modality. Relaxation times of the atomic nuclei can be useful in determining signal strength from the MRI. Ferromagnetic materials, for instance, may cause a greater distortion under MRI than certain other materials, and as such certain materials and/or surface characteristics may be relevant in determining characteristics of the at least one distorting feature.

The gradient magnets can thereupon provide a gradient magnetic field, which is thereupon superimposed on the static magnetic field. Relatively small gradients in the magnetic field can be superimposed on the static magnetic field. Certain embodiments of the magnetic resonance signals can be superimposed from different portions of the individual, such that the magnetic resonance signals can vary in phase and/or frequency. Such aspect of the signals can be used by certain embodiments of the distortion susceptible imaging device(s) 104 to provide the imaging information.

Of the embodiments of the distortion susceptible imaging device(s) 104 and their associated imaging modalities, the MRI can involve applying a magnetic field to the individual using a first (powerful, typically superconductive) magnet 520, with the individual being scanned by an MRI scanner while in the field. As such, certain conventional MRI scanner (as generally understood in the medical imaging area and made commercially available) can thereby include the series of gradient magnets generating a variable non-optical electromagnetic field. For example, a superconducting magnet can generate a typically strong, static magnetic field through the imaged field of the individual, and the magnetic field generated by the superconducting magnet can be modified using the gradient magnets).

Such modification of the magnetic field as may be performed at least partially for the purpose of limiting distortion of the MRI imaging by the distortion susceptible imaging device(s), and may be considered as one embodiment of the providing, or obtaining, at least some input compensating information as described with respect to this disclosure. Larger embodiments of the MRI can be used to image a complete person or other individual (or at least a large portion thereof), while smaller embodiments of MRIs are commercially available which can be used to image a smaller portion of the individual person or animal, or also likely certain organisms or other animals. The smaller embodiments of the MRI typically have a smaller bore than the larger embodiments of the MRI, and thereby often allow for more precisely controllable imaging of the individual.

Figure 6:
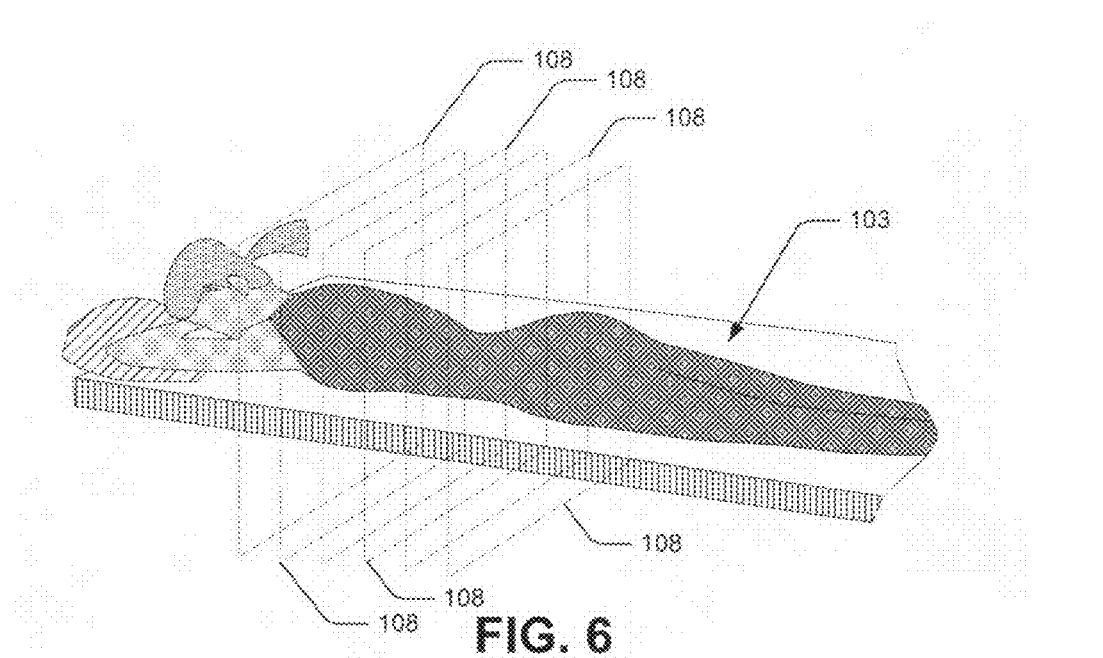
FIG. 6 is a diagram of the series of slices, or images, that can be captured through the individual using the at least one distortion susceptible imaging device(s) of FIG. 5.
Figure 8:
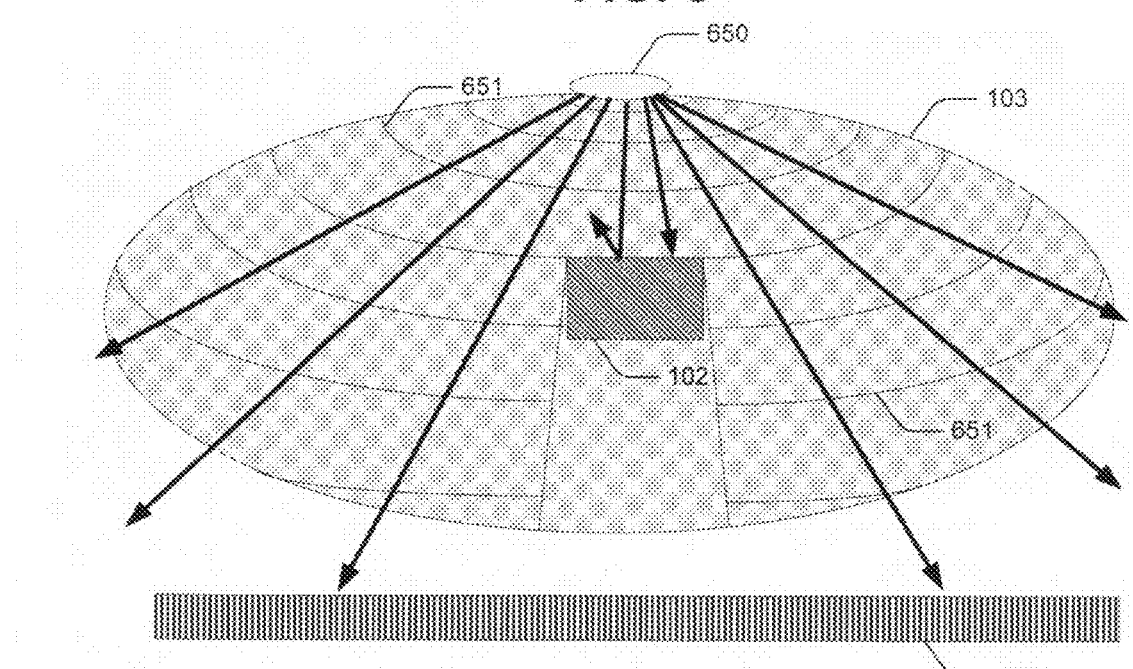
FIG. 8 is a diagram of another object such as an individual being imaged by another embodiment of the at least one distortion susceptible imaging device(s)

MRIs generally image along a series of substantially planar slices 108, as described in this disclosure with respect to FIG. 6. Each substantially planar slice is conventionally parallel to, but displaced from each adjacent substantially planar slice. Certain embodiments of the imaging as produced by the imaging device (e.g., the slices of MRI) may become distorted when a disruptive magnetic (or certain other non-optical electromagnetic) or X-ray field, current, voltage, etc. are applied or present in the vicinity of the imaging region. Certain embodiments of the disruptive non-optical electromagnetic field may be provided by certain embodiments of the at least one distorting feature 102. In certain instances, the substantially planar slices 108 of MRI upon becoming distorted can image along non-planar paths. If the images become distorted, the usefulness of the images, data, and/or other information obtained during the imaging such as MRI scanning can become less useful and/or reliable. By modifying the magnetic field in certain ways during imaging of the at least one distorting feature(s) 104 such as may provide the distortion, in certain instances the originally-planar, but perhaps distorted slices, as understood in MRI technology can be returned to a more planar configuration using certain embodiments of the distortion compensator, as described in this disclosure.

For example, if the original magnetic field gradient is distorted from B to B', then an additional, or complementary field whose geometry is B" can be applied through an array of adjustable magnetic coils. The complementary field B" complements the field B' to produce a composite field approximating the original field B. Note that B" may not exactly numerically equal B-B', since B" itself may be distorted by the distorting feature. The solver can take into account the effects of the distorting feature when calculating B".

Solving for the magnetic field to be generated by each coil can be done either empirically, by testing the device before it is implanted in the body, or by forward-modeling of the magnetic distortion due from information about the device from the distortion compensator library 776 that may be configured as the electronic library or database that can maintain information about that device. In cases where the field B" can not be perfectly constructed by adjusting independent control elements, the adjustable magnetic coils can produce the complementary fields to approximate the original field B, using error reduction techniques (such as minimizing the volume-integrated magnetic field energy of the error using least-squares methods). Such error reduction techniques are described in more detail in this disclosure.

While the embodiment of the MRI imaging as described with respect to FIG. 6 can be performed over a large portion of the body of certain individuals such as humans or relatively large animals, smaller imagers such as MRI can image smaller regions or portions of the body of larger animals or humans, or alternatively organisms, and typically might be smaller.

Certain embodiments of the MRI device can include a main field coil that generates a large homogeneous magnetic field $B_0$ directed along the principal axis of the device (denoted the z-axis). For imaging purposes, the device further comprises three gradient coils that generate magnetic fields having z-components $G_x x$, $G_y y$, and $G_z z$. In the vicinity of a distorting feature, the total magnetic field is $$B_z(x,y,z,t) = B_0 + G_x(t)x + G_y(t)y + G_z(t)z + B_1(x,y,z) \quad (1)$$

where $B_1$ is the magnetic field of the distorting feature. For a given distorting feature, the distorting field $B_1$ can be determined by solving the following Maxwell equations of magnetostatics:

$$\nabla \cdot B = 0, \quad \nabla \times H = 0 \quad (2)$$

Considering the boundary conditions that characterize the geometry and orientation of the distorting feature, as well as a constitutive relation B=F[H] that characterizes the material properties of the distorting feature. For example, a paramagnetic or diamagnetic material typically exhibits the constitutive relation B=μH, where μ is the magnetic permeability. Numerous methods of solving such magnetostatic boundary-value problems are known, such as described in J. D. Jackson, *Classical Electrodynamics, Third Edition*; these methods include the relaxation or finite difference method, series expansion in orthogonal functions, and finite element analysis (FEA).

Considering the process of imaging a region in the vicinity of the distorting feature. As an illustrative example, consider an illustrative 2D Fourier transform imaging process, wherein the z-gradient coil can be used for slice selection. In the absence of the distorting feature, a π/2 RF pulse with central angular frequency $\omega_1$ would excite the spins in a slice $z = z_1 \equiv (\omega_1 - \omega_0)/\gamma G_z$, where γ is the spin gyromagnetic ratio and $\omega_0 = \gamma B_0$ is the mains field Larmor frequency. In the presence of the distorting feature, however, the actual spins that are excited are those along the surface $\tilde{z} = z_1$, where $$\tilde{z}(x, y, z) = z + \frac{B_1(x, y, z)}{G_z} \quad (3)$$

is the distorted z coordinate in the presence of the distorting field $B_1$. In the illustrative example, after the slice selection, x- and y-gradient fields are applied to accomplish the 2D Fourier transform imaging of the selected slice. The signal received at the RF coil at time t is given by $$s(t) = \int dx\,dy\,dz\, \rho(x,y,z)\delta(\tilde{z}-z_1)\exp[i(k_x(t)x + k_y(t)y + \gamma B_1(x,y,z)t)] \quad (4)$$

In this equation, ρ(x, y, z) is the spin density function (which can depend on the local proton density, relaxation times T1 and T2, and RF coil sensitivity), $\delta(\tilde{z}-z_1)$ accounts for the slice selection, and the phase gradients can be:

$$k_x(t) = \int_{t_0}^{t} \gamma G_x(t')dt', \quad k_y(t) = \int_{t_0}^{t} \gamma G_y(t')dt'. \quad (5)$$

Further suppose, for the illustrative example, that the y-gradient field is applied for phase encoding prior to readout, and the x-gradient field is applied during readout. Then during readout, the phase gradients can be:

$$k_x(t) = \gamma G_x t, \quad k_y(t) = k_{y0}. \quad (6)$$

Introducing distorted x and y coordinates $$\tilde{x}(x, y, z) = x + \frac{B_1(x, y, z)}{G_x}, \quad \tilde{y} = y, \quad (7)$$

equation (4) then becomes $$s(t) = \int dx\,dy\,dz\, \rho(x, y, z)\delta(\tilde{z} - z_1)\exp[i(\gamma G_x t \tilde{x} + k_{y0}\tilde{y})]$$

$$= \int d\tilde{x}\,d\tilde{y}\,d\tilde{z}\, \rho[x(\tilde{x}, \tilde{y}, \tilde{z}), y(\tilde{x}, \tilde{y}, \tilde{z}), z(\tilde{x}, \tilde{y}, \tilde{z})] \times$$

$$[J(\tilde{x}, \tilde{y}, \tilde{z})]^{-1} \delta(\tilde{z} - z_1)\exp[i(\gamma G_x t \tilde{x} + k_{y0}\tilde{y})] \quad (8)$$

where J is the Jacobian of the coordinate transformation in the second integral, given by $$J(\tilde{x}, \tilde{y}, \tilde{z}) = 1 + \frac{1}{G_x}\frac{\partial B_1(x, y, z)}{\partial x} + \frac{1}{G_z}\frac{\partial B_1(x, y, z)}{\partial z} \quad (9)$$

The readout signal s(t) is therefore a 2D Fourier transform (with Fourier components $(k_x, k_y) = (\gamma G_x t, k_{y0})$) of the distorted image $$\tilde{\rho}(\tilde{x},\tilde{y},\tilde{z}) = \rho(x,y,z)/J(\tilde{x},\tilde{y},\tilde{z}). \quad (10)$$

It can be seen that there are two aspects to the distortion: the apparent position of an image voxel is shifted to distorted coordinates $(\tilde{x}, \tilde{y}, \tilde{z})$ according to equations (3) and (7), and the apparent intensity of the image voxel is modified according to equations (9) and (10). For a known distortion field:

$B_1(x, y, z)$, e.g. as computed by a finite element analysis, both the position and intensity can be compensated. In certain instances, such compensation can be nearly exact, but in other instances various metrics such as least squared metrics can be used to limit the remaining distortion after the compensation as much as practicable. Certain embodiments of the compensation can be performed at least partially by adjusting the current in various "shimming" magnetic circuit elements, in a similar manner is done to correct Nuclear Magnetic Resonsance (NMR) signals in non-imaging applications of NMR, to improve field homogeneity for a given poorly calibrated magnet.

MRI can also suffer from such distortions as when a number of magnetic fields or magnetic flux lines converge, and/or when they are forced to bend such as when they flow around such objects as a ferromagnetic implant. Such distortions can result at least partially based on material(s), surface feature and/or shape(s) of the at least one distorting feature 102. Certain embodiments of the distortion compensator 100, as described in this disclosure, can limit and/or reduce distortion of certain embodiments of the distortion susceptible imaging device(s) 104 such as MRI.

Other imaging modalities can be utilized as certain embodiments of the distortion susceptible imaging device(s) 104, as described in this disclosure. Certain embodiments of the distortion susceptible imaging device(s) 104 and their associated imaging modalities (such as CAT scan, X-ray imaging, X-ray backscattering imaging, PET scan, certain other tomographical imaging, certain other non-optical electromagnetic imaging modalities, and certain other imaging modalities) are further referenced and described in this disclosure as "particle bombardment imaging techniques". Conventional CAT scans may be used to supplement other x-rays imaging and medical ultrasound imaging for a variety of applications including, but not limited to: cranial imaging, chest imaging, cardiac imaging, imaging of the abdomen, etc.

Certain embodiments of the particle bombardment imaging technique can, depending on context, utilize particles that pass through at least an imaged portion (e.g., of the individual) to at least partially effect imaging. Such modification of the path of travel of the particles in such particle bombardment imaging techniques can represent one embodiment of modifying the at least some input compensating information, as described in this disclosure. Certain embodiments of such particle bombardment imaging techniques may therefore involve bombarding the imaged area with particles, such as X-rays, gamma rays, photons, etc. depending upon the particular imaging modality. Certain embodiments of the imaging particles utilized in certain embodiments of the particle bombardment imaging techniques may be at least partially generated from within the individual such as a person or animal, such as with the insertion of a catheter, scope, or other mechanism. Certain types of contrast agents can be applied to certain embodiments of the particle bombardment imaging to enhance the imaging. For example certain contrast agents can be injected into the individual patient and then the patient can be imaged illustrating intravenous regions, regions of blood in tissues, etc. Certain embodiments of the imaging particles can be utilized in certain embodiments of the particle bombardment imaging techniques may be at least partially applied from outside of the individual human, animal, or organism, such as by the application of x-rays or other particles through the individual patient.

Figure 7:
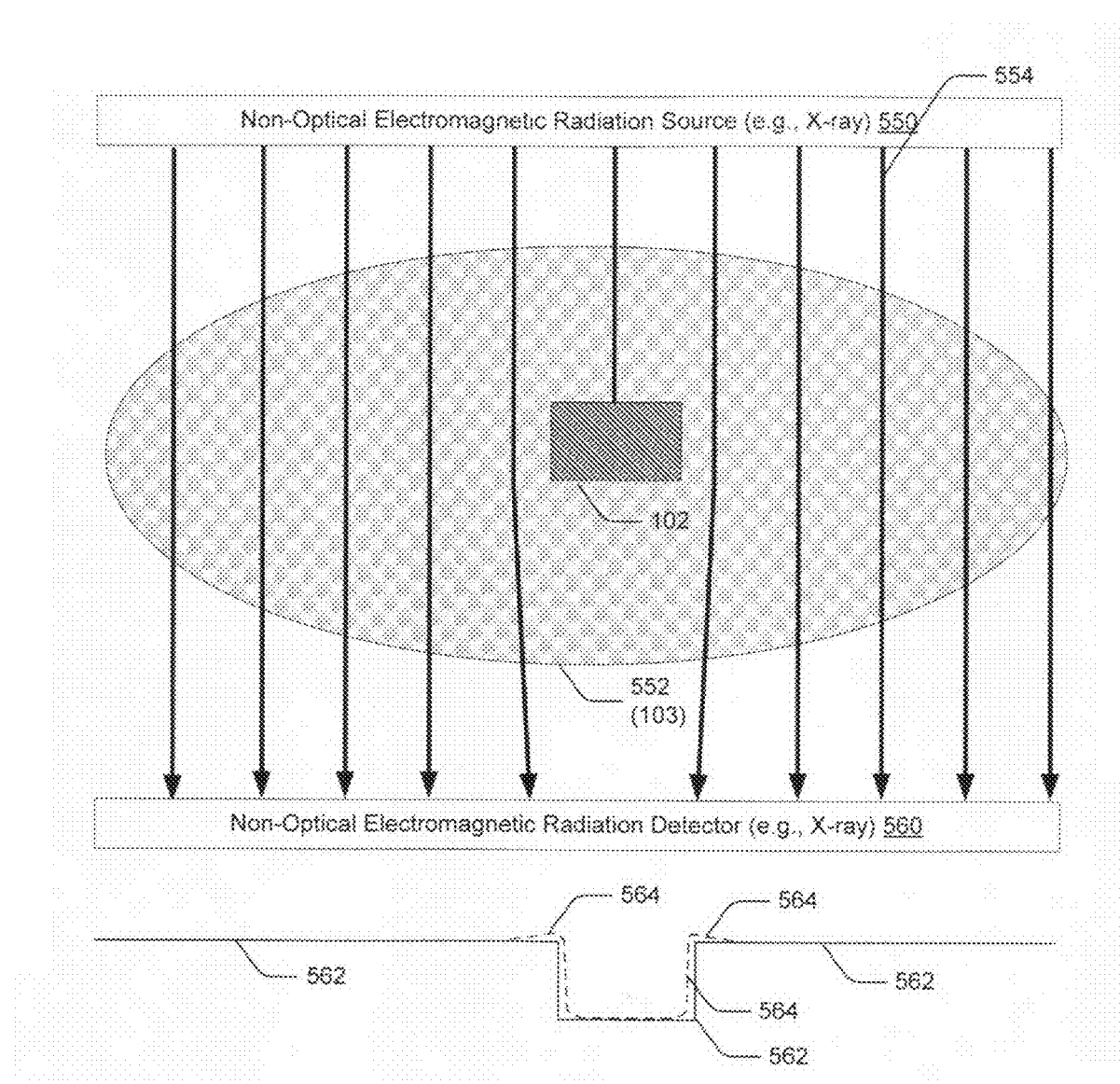
FIG. 7 is a diagram of an object such as an individual being imaged by another embodiment of the at least one distortion susceptible imaging device(s)

FIG. 7 shows one embodiment of the distortion susceptible imaging device(s) 104 utilizing one embodiment of an X-ray imaging device 550. Consider, for example, the X-ray imaging device 550 imparting non-optical electromagnetic radiation 554 to an object 552 such as the individual, including at least one embodiment of the at least one distorting feature(s) 102. As the non-optical electromagnetic radiation 554 passes the individual or object 552, some of the electromagnetic radiation will be deflected and/or distorted. Certain embodiments of the X-ray imaging device 550 as described with respect to FIG. 7 may be characterized as an embodiment of the particle bombardment imaging technique as described in this disclosure. Such distortion could be illustrated by representative amounts of non-optical electromagnetic radiation received on a detector 560 of the distortion susceptible imaging device(s) 104, illustrated as 562 as a solid line without the effects of distortion, and at 564 (in hidden lines), only showing those portions with the effects of the distortion. As a result of the distortion to the particle bombardment imaging techniques, the image may appear "fuzzy", or with relatively little contrast. The edges of the image will therefore lack sharpness. As such, certain embodiments of the distortion compensator is configured to limit such fuzziness or improve clarity of imaging in certain embodiments of the distortion susceptible imaging device(s) 104.

Such modification of the particle field as may be performed at least partially for the purpose of limiting distortion of the imaging using particle bombardment imaging techniques (e.g., X-ray or other imaging modalities) by the distortion susceptible imaging device(s), and may be considered as one embodiment of applying the at least some input compensating information to modify imaging as described with respect to this disclosure. By modifying the particle field in certain ways during imaging of the at least one distorting feature(s) 104 such as may provide the distortion, in certain instances the originally-sharp, but now distorted image such as may appear more fuzzy, as understood in particle bombardment imaging techniques (e.g., X-ray or other imaging modalities) can be returned to cause less deflection of the imaging particles (such as X-rays) configuration using certain embodiments of the distortion compensator, as described in this disclosure.

Distortions of certain embodiments of the particle bombardment imaging technique can involve the path of the particles being modified, altered, or distorted as they are applied to the at least one distorting feature(s) 104 within the individual (human, animal, or organism). In certain bombardment imaging techniques, such as X-ray, the distortion can result in the distorted image being made more fuzzy, blurry, or otherwise distorted in the region of the distortion. Such distortion can typically result from an obstruction, deflection, or other irregular transmission of the particle (e.g., photon) used by the imaging modality through certain material(s) of the at least one distorting feature(s) 102 being imaged. Certain embodiments of the distortion compensator, that can be configured to compensate for at least some of the distortions resulting at least in part from particle bombardment imaging techniques; can thereby be limiting distortion, also act to limit the fuzziness of the image, or inversely increase the sharpness of the imaging.

As such, the varied embodiments of the distortion susceptible imaging device(s) 104 (whether involving the particle bombardment imaging techniques or the MRI imaging techniques, or other modified, altered, combined, or developed imaging modalities) each can involve distortions to the particular imaging modalities resulting at least in part from the at least a portion of an at least one distorting feature 102. Certain embodiments of the distortion susceptible imaging device(s) 104 can thereby utilize certain embodiments of the distortion compensator 100 such as to limit distortion of the imaging based at least in part on the technology and/or techniques of the particular imaging modalities. The particular embodiments of the distortion susceptible imaging device(s) 104, the distortion compensator 100, and/or the imaging modalities, etc. as described in this disclosure are intended to be illustrative in nature but not limiting in scope.

A number of embodiments of the distortion susceptible imaging device(s) 104 are thereby described, and intended to be protected, as limited by the scope of at least one of the claims of this disclosure. FIG. 1, for example, illustrates certain embodiments of the at least a portion of an at least one distorting feature 102, that can be associated with an individual (e.g., human, animal, plant, or living or synthetic organism) as described with respect to this disclosure. Certain embodiments of the at least one distorting feature can include, but are not limited to: one or more implant(s), one or more bone(s), one or more bone fragment(s), one or more fluid(s) (e.g., blood), as well as other naturally-occurring and/or man-made objects, and/or a combination thereof. Within this disclosure, the applicable embodiments of the at least one distorting feature 102 is envisioned to be similarly broad to apply to virtually any imaging technique as applied to at least one distorting feature 102 in the individual (human, animal, or organism), unless otherwise limited either expressly in the text, or limited by some technical logical inconsistency for any particular technique or technology. At least certain portions of certain embodiments of the at least the portion of the at least one distorting feature 102 can be associated with at least a portion of the body of the individual (human, animal, or organism) 103, which can upon imaging at least portions of the individual, distort the images taken by the distortion susceptible imaging device(s) 104. Certain components of the imaging device(s) 104 is described with respect to FIG. 3.

This disclosure therefore provides a variety of embodiments of mechanisms which can determine, or "predict", a type of distortion that certain embodiments of the at least one distorting feature(s) 102 can produce. The distortion of certain embodiments of the at least one distorting feature(s) 102 can be characterized according to their orientation according to at least some distortion characterizing imaging information or the input compensating information, as described in this disclosure depending on context. Certain embodiments of the distortion characterizing imaging information or the input compensating information can include depending on context, but is not limited to, data, images, graphical information, textual information, or any other information that can characterize distortion produced by the at least one distorting feature(s) 102 based at least in part on the orientation of the distorting feature(s). While it may be convenient to maintain at least some of the distortion characterizing imaging information and/or the input compensating information in a database, or a distortion compensator library 776 that may be configured as an electronic library (which may take the form of a flash drive as well as other memory devices) in a form that may allow the distortion characterizing imaging information or the input compensating information to be recalled upon demand and/or utilized by a processor, computer, or controller (such as may be included in certain embodiments of the distortion compensating controller 97, as described with respect to FIG. 3 and elsewhere in this disclosure), other configurations and systems may be utilized to maintain or recall the distortion characterizing image information and/or the input compensating information. During imaging or other processing, certain embodiments and/or forms of the distortion characterizing imaging information and/or the input compensating information can have their distortion compensated using computational or other techniques as described in this disclosure.

Figure 9:
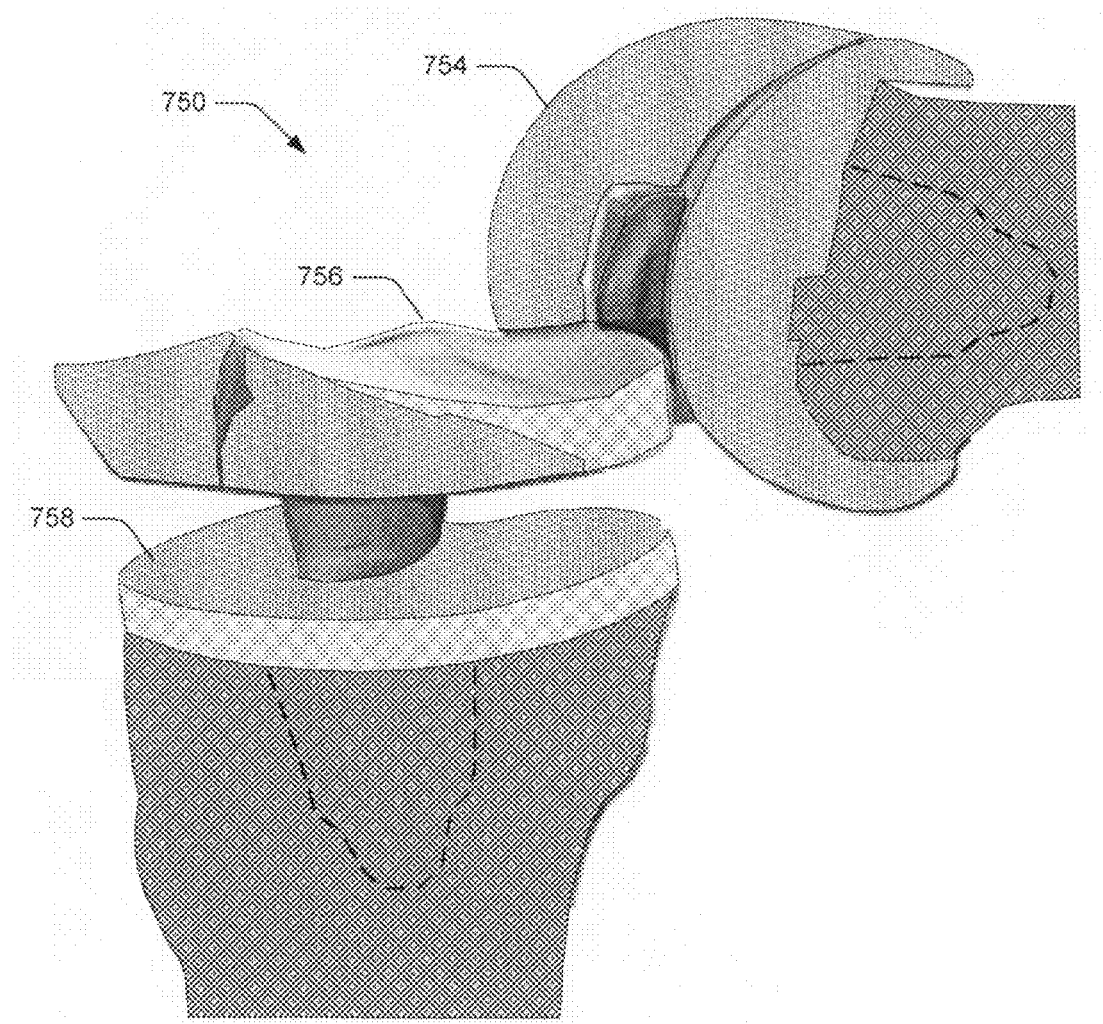
FIG. 9 is a diagram of an embodiment of at least one distorting feature(s) that can be imaged by the at least one distortion susceptible imaging device(s)

One illustrative but non-limiting example of an at least one distorting feature(s) that can be associated with, and characterized by, at least some distortion characterizing imaging information and/or the input compensating information can include, for example, a knee replacement 750. One embodiment of the knee replacement 750 is described with respect to FIG. 9, and can include but is not limited to a patellar component (not shown but associated with the remaining components in an understood manner by those skilled in the medical or surgical areas), a femoral component 754, a mobile bearing 756, and a tibial tray 758. Certain embodiments of the patellar component can be attached to a number of muscles, whose contraction by the person may act to straighten the knee. Certain embodiments of the femoral component 754 can be attached to the femur (with the portion shown in dotted lines), and can be displaced therewith. Certain embodiments of the tibial tray 758 can be attached to the tibia (with the portion shown in dotted lines), and can be displaced therewith. Certain embodiments of the mobile bearing 756 can allow for a "bearing" type motion between the femoral component 754 and the tibial tray 758. Certain embodiments of the mobile bearing 756 and the femoral component 754 can, together, provide a "floating" support for the patellar component. An assembled image of the knee replacement 750 is illustrated in FIG. 9.

The knee replacement 750 represents an example of an embodiment of the at least one distorting feature(s) 102 that can be characterized according to its orientation. Consider, for example, as the knee of the individual (human or animal) flexes or contracts, the relative position of at least certain of the components, 754, 756, and/or 758 will shift and relatively displace. Such shifting and displacement can vary the distortion characterizing imaging information as taken from various angles, particularly the side. Certain embodiments of the input compensating information can thereupon be utilized to derive or create a model of non-optical electromagnetic radiation, or other input signals, fields, etc. that could be applied by the distortion susceptible imaging device(s) such as to limit distortions of the imaging process. The knee replacement may be considered as an example of a relatively complex implant since it has a number of elements and a number of irregular shapes, curves, etc.

Additionally, such abnormally-shaped embodiments of the at least one distorting feature(s) 102 as the knee replacement, bones, etc. will change as when being imaged from different positions or angles, such as from the front or side. As such, certain embodiments of the distortion characterizing imaging information and/or the input compensating information can vary depending on the angle of the observer. Certain embodiments of the distortion characterizing imaging information and/or the input compensating information can thereby be stored in a tabular manner, such that the type of distortion can be characterized for a particular one of at least one distorting feature(s) 102 according to the relative location of each distorting feature, as well as the angle at which the at least one distorting feature(s) 102 such as the knee replacement can be observed.

As such, the at least some input compensating information in a particular manner depending upon the particular imaging modality may be used to modify the imaging (such as may be based on obtaining the at least one image information), such as to limit the amount of distortions as a result of imaging the individual associated with the at least one distorting feature(s). Such modification of the imaging modality as can at least be partially caused as a result of the input compensating information may be based, at least in part, on an operation of the certain embodiments of the distortion compensator controller 97 as described with respect to FIGS. 3, 12, and/or 13 as described in this disclosure, and also by certain ones of the flow charts as included in this disclosure.

In certain instances where a human or animal patient is being imaged by certain embodiments of the distortion susceptible imaging device(s) 104, the at least one distorting feature(s) can be "positioned" or "orientated" such as by positioning the body part or at least one distorting feature(s) 102 at a known angle (e.g., by bending the illustrative knee at a prescribed or measurable angle). The resulting orientation of the distorting feature(s) 102 can thereupon be input into the distortion compensator 100 (such as the distortion compensator library 776 that may be configured as the electronic library, or database), and the corresponding distorting characterizing imaging information and/or input compensating information can be returned, therefore allowing for modification to the imaging modality, such as may be utilized to limit distortion by the particular imaging modality. As such, such distortions can be subtracted, filtered, or filtered out when generating the at least some input compensating information as described in this disclosure using certain embodiments of time domain/frequency domain transforms such as Fourier Tranforms, Fast Fourier Transforms, etc. Such filtering, filtering out, or computationally modified using certain embodiments of the at least some input compensating information; or at least partially limit such distortions as can be characterized as certain embodiments of distortion compensation, input field modifying, or computationally limiting the distortions at least partially as a result of the input compensating information.

Certain embodiments of the distortion compensator 100 can thereby be associated with certain embodiments of the distortion susceptible imaging device(s) 104. Certain embodiments of the distortion compensator library 776 that may be configured as the electronic library or the database can be used to generate a variety of the input compensating information, as described in this disclosure, which can limit distortion by modifying input being applied to the individual at least partially by the imaging modality. Certain embodiments of the distortion compensator can thereby be configured to provide feedback using the input compensating information, such as to vary non-optical electromagnetic radiation such as MRI or X-ray, etc. that can be applied during imaging of the at least one distorting feature(s). For example, the embodiments of the non-optical electromagnetic radiation such as MRI fields or X-ray particles as described in this disclosure can be reshaped, modified, shielded, redirected, steered, and/or otherwise changed to reduce distortions to images of the individual (human, animal, or organism) associated with the distorting feature(s), which are being imaged at least partially by the distortion susceptible imaging device(s) 104.

Consider that in a number of instances, such distorting features as implants, spinal fusions, etc. may represent certain areas that are particularly desirable and important to image, and yet these areas that may be largely distorted during imaging by certain embodiments of the distortion susceptible imaging device(s) 104.

Figure 2:
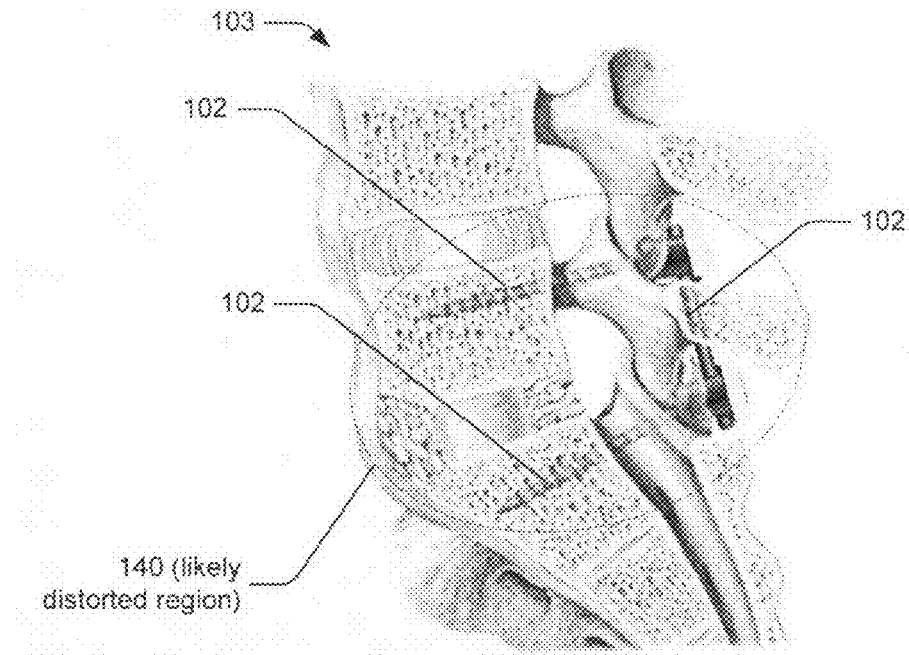
FIG. 2 is an expanded view of the diagram of FIG. 1 as taken through the individual.

Certain embodiments of the at least the portion of the at least one distorting feature, shown with respect to FIG. 1 and also shown in expanded view in FIG. 2, can at least partially provide a variety of imaging distortions of imaging by certain embodiments of the distortion susceptible imaging device(s) 104 within and/or associated with the potentially distorted region 140. Such distortion of the imaging within the potentially distorted region 140 of the individual (human, animal, or organism) can be moderate or severe, such as to limit what a physician or trained person can detect as to the state or condition of the individual utilizing certain embodiments of the distortion susceptible imaging device(s) 104.

Certain embodiments of the distortion susceptible imaging device(s) 104 can utilize a variety of imaging and/or signal processing technology that can include, but is not limited to, computer-based, electronic, automated and/or quasi-automatically recognize the state or condition of the individual (human, animal, or organism). Such distortions can limit such recognition of the state or condition of the individual using conventional imaging techniques, and can limit the usefulness of imaging technology considerably. For example, it might be very useful to image or consider a variety of implants in their position as applied or inserted following an operation or procedure on the individual (human, animal, or organism). After an implant such as a spinal plate or pin, knee joint, bone pin, etc. has been installed in a patient (human or animal), it would therefore be useful to determine positions of certain portions of the implant or other body portion, consider interfaces between the implant and the individual (human or animal), etc. In addition, after the implant has been inserted, and perhaps after certain interval(s), it might be desirable to consider the position, wear, or other condition of the implant. Unfortunately, such information as could be obtained from the images and/or other image information as the condition or position of the implant, wear of the implant, interfaces between the implant, bones, tissue, etc. (as well as similar information relating to other embodiments of the at least one imaging feature(s)) can often be degraded, distorted, or made less revealing as a result of the imaging distortions of the at least one distorting feature(s) by the distortion susceptible imaging device(s) 104. Certain embodiments of the distortion susceptible imaging device(s) 104 can limit such distortion, and thereby improve the effectiveness and utility of certain computer-based, electronic, automated and/or quasi-automatic recognition embodiments of the imaging.

Certain distortion resulting from certain distorting feature(s) can be sufficient, under certain circumstances without compensation, as to occlude or hide certain portions of the individual 103 (human, animal, or organism) that is being imaged by the distortion susceptible imaging device(s) 104. Considering the operational expenses associated with certain embodiments of the distortion susceptible imaging device(s) 104, any increase in utility resulting at least partially from a decrease in distortion of the imaging may be highly desirable.

Certain embodiments of the at least the portion of the at least one distorting feature 102 such as can provide can thereby be situated within and/or associated with a region of, or associated with, the individual (human, animal, or organism) being imaged. In certain instances, the at least the portion of the at least one distorting feature 102 can be considered at least a portion of an area being imaged. For instance, after the at least the portion of the at least one distorting feature 102 is at least partially positioned relative to the individual (human, animal, or organism), it may be desired to image the individual including the at least the portion of the at least one distorting feature 102 to determine how well it may be secured or positioned relative to the individual. It may be desirable to view the at least the portion of the at least one distorting feature 102, such as at least one insert, at least one bone, at least one screw, at least one fastener, at least one connector, at least one pin, at least one fastener, at least one brace, at least one plate, and/or at least one other man-made or naturally occurring object) within and/or associated with the individual (human, animal, or organism). As described in this disclosure, certain embodiments of the distorting feature(s)

may tend to distort imaging of the nearby region such as to limit such imaging capabilities by the distortion susceptible imaging device(s) 104.

In addition, it may also be desirable to limit imaging of a part or segment of the at least the portion of the at least one distorting feature 102 during an imaging procedure, and to image or visualize another part of the distorting feature 102. For example, consider a screw installed in a portion of the individual (human or animal), such as a patient's spine. With certain imaging techniques using certain embodiments of the distortion susceptible imaging device(s) 104, such as but not limited to: MRI, CT, SPECT, PET, X-ray, etc., those portions of the distorting feature 102 that within or adjacent to the bone may not image as well as those portions that are outside of the bone. In certain instances, a clinicians or operator of certain embodiments of the distortion susceptible imaging device(s) may specify those portions of the at least the portion of the at least one distorting feature 102 (as well as its orientation, position, etc.) that is associated with a bone, an insert, or other distorting feature 102. By specifying which of the at least the portion of the at least one distorting feature 102 that can be computationally ignored or limited since they are hidden, and will therefore not cause as much of a distortion; it can thereby be determined which parts of the at least the portion of the at least one distorting feature 102 can be left substantially the same as imaged, as compared to which can be enhanced. Certain embodiments of the compensation method described in this patent can actively emphasize the information of greatest interest to the observer without having to worry about distorting resulting from certain distorting feature(s).

There can thereby be a variety of embodiments of the at least the portion of the at least one distorting feature 102 that can be imaged by the distortion susceptible imaging device(s) 104. A list of certain ones of the at least the portion of the at least one distorting feature 102 that can cause distortions to imaging itself and/or other associated material can include, but is not limited to, at least one electronic implant or device, at least one magnetically-actuated implant or device, at least one cardiac pacemaker, at least one implanted cardioverter defibrillator (ICD), at least one aneurysm clip, at least one neurostimulation system, at least one spinal cord stimulator, at least one internal electrode, device, and/or wire(s), at least one bone growth or bone fusion stimulator, at least one cochlear, otologic, or other ear implant, at least some insulin or an infusion pump, at least one implanted drug infusion device, any type of prosthesis (e.g., eye, penile, etc.), at least one heart valve prosthesis, at least one eyelid spring or wire, at least one artificial or prosthetic limb, at least one metallic stent, filter, or coil, at least one shunt (spinal or intraventricular), at least one vascular access port and/or catheter, at least one radiation seeds or implants, at least one Swan-Ganz or triple lumen catheter, at least one medication patch (nicotine, nitroglycerin), any metallic fragment or foreign body, at least one wire mesh implant, at least one tissue expander (e.g., breast), at least one surgical staple, clips, or metallic sutures, at least one joint replacement (hip, knee, etc.), at least one bone-joint, screw, nail, wire, plate, etc., at least one IUD or diaphragm, at least one dental or partial plates, at least one tattoo or permanent makeup, at least one body piercing jewelry, at least one hearing aid, at least one pair of eyeglasses, watches, etc., as well as naturally-occurring distorting feature 102 such as bones, bone fragments, blood (e.g., particularly the hemoglobin can result in some imaging distortion), liquids, etc. Other similar items could represent certain embodiments of the distorting feature(s). In general, to consider the distorting effects of certain embodiments of the distorting feature(s), the particular imaging modality is to be considered.

Virtually any item that may be inserted at least partially within, and/or otherwise associated with, an item which may be applied at least partially to, any item which may be positioned at least partially proximate to, or an item (e.g., naturally occurring or man-made) which may be otherwise at least partially associated with the individual 103 such as to create a distortion may be considered an embodiment of the at least the portion of the at least one distorting feature 102.

There can be a series or combination of techniques associated with the distortion compensator 100 that can involve limited distortion to imaging provided by at least one distorting feature 102. Such series or combination of processes as can be performed by the distortion compensator 100 can be conducted in series, in combination, in alternative, etc. For example, certain embodiments of the distortion compensator 100 can alter the operation of the imaging modality as applied to the at least one distorting feature 102, such as to limit distortion to the imaging. Certain embodiments of the distortion compensator 100 can compensate for distortions of the imaging provided by the imaging modality following the imaging based, at least in part, on the at least one distorting feature 102 using signal processing, computer, controller, and/or other techniques. These two, and other, embodiments of the distortion compensator 100 can be performed in combination, in the alternative, in series, etc. For example, the imaging modality can be altered such as to reshape a magnetic field to limit distortions provided upon contact with the at least one distorting feature such as to perhaps limit relatively larger scale distortions. With such larger scale distortions removed, certain computer processing techniques can be applied to further reduce the effects of the distortions to the imaging resulting at least in part from the at least one distorting feature 102.

Certain embodiments of the distortion compensator can thereby limit the effect of distortion to the imaging process following the imaging process. By comparison, certain embodiments of the distortion compensator can alter input compensating information, which may include but is not limited to the input field, signal, gradient, shielding, forming, etc. or other characteristics that can be used by the imaging modality during imaging, such as to produce a more suitable input field, signal, gradient, shielding, forming, etc; and to thereby in effect reduce the distortion of the at least one distorting feature. As such, certain embodiments of the distortion compensator can utilize feedback or other mechanisms, such as to provide altered compensating information, and such as to decrease the distortion to the imaging resulting at least partially from the at least one distorting feature(s). As such, certain embodiments of the distortion compensation can thereby also be used to determine the input compensating information such as fields, gradients, etc. that can be utilized by the particular imaging modality, which can thereby be provided to at least partially limit image effects of distortion. The particular type of input compensating information can be selected based at least in part on the type of imaging device(s) or the imaging modality, as described in this disclosure. These two embodiments of the distortion compensator are described in this disclosure at several locations in the alternative, and are intended to be illustrative in nature, and not limiting in scope.

There are a number of computer-processing techniques that can be used in certain embodiments of the distortion compensator 100 to model the distortions caused by the distorting feature(s) 104, as well as how certain input compensating information may affect such distortions. Certain embodiments of the Maxwell solvers can utilize finite element analysis, and may represent one suitable modeling technique that may be applied to certain distortion susceptible imaging device(s), as MRI. It is to be understood that other modeling techniques such as are known by those skilled in the modeling arts could also be utilized. Certain embodiments of Maxwell solvers can be utilized to determine what effect the at least one distorting feature should have on distorting the imaging. This computed value of the at least some input compensating information which can thereupon be computationally removed from the actual imaged region to indicate what the imaged region should appear like without imaging, and thereby can be computationally subtracted out to limit the effect of distortions for such imaging modalities as MRI. As such, certain embodiments of the distortion compensator can derive MRI-based input compensating information (based at least in part on Maxwell solvers, finite element analysis, or other such techniques) can be used to derive what the input magnetic fields should appear like to limit effects of the distortion.

Figure 3:
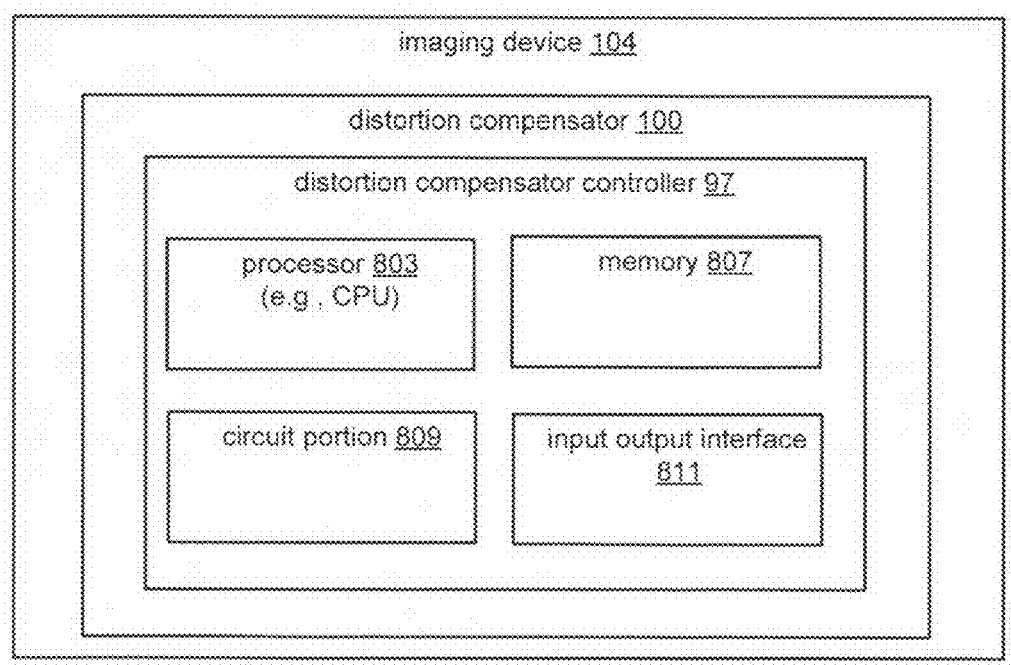
FIG. 3 is a block diagram of an embodiment of a distortion compensator as at least partially associated with the distortion susceptible imaging device(s)

Certain embodiments of computers, controllers, processors, etc. as can in included in certain embodiments of the distortion compensation controller 97, as described in this disclosure with respect to FIG. 3 and at other locations, can be used to derive Maxwell solvers perform the Monte-Carlo analysis, perform finite element analysis, and/or perform other suitable madeling algorithms. The use of Maxwell solvers, Monte Carlo analysis, and/or finite element analysis, as applied to MRI, is intended to be illustrative in nature but not limiting in scope since other field estimation programs could be utilized in combination with MRI, or such alternative field estimation programs could be applied to a variety of imaging modalities.

Certain embodiments of adaptive filtering, as well as other filtering techniques, can be used to computationally limit certain effects of distortion artifacts on the imaging process. Certain embodiments of filtering out distortion can include, but is not limited to, decreasing the effects of amplitude of, or other similar considerations of distortion such as by deriving suitable input compensating information. Certain embodiments of filtering distortion, by comparison, is intended to include, but not limited to, decreasing relative strength of other signals, information, data, etc. of non-distorting aspects. Both filtering and/or filtering out can be utilized in certain embodiments of imaging and/or signal processing techniques.

Adaptive filtering can be used to limit certain effects of distortion during imaging such as by recursively filtering distortions such as by deriving suitable input compensating information. Certain embodiments of such adaptive imaging techniques could be applied in association with the imaging to derive suitable input compensating information, as to limit the distortion, or alternatively as a feedback mechanism. For example, if an input non-optical electromagnetic (e.g., input magnetic field and/or Eddy current for MRI, or photon particles for X-ray), or other input information, can be filtered, shaped, contoured, shielded, curved, etc.; then the distortion effects in those areas of greater distortion can be limited. In certain instances, such altering, shielding, limiting, etc. the input information can be performed in the alternative to, or in combination with, the computationally compensating for the distortions as described in this disclosure. Certain embodiments of computers, controllers, processors, etc. as can in included in certain embodiments of the distortion compensation controller 97, as described in this disclosure with respect to FIG. 3 and at other locations, can be used to perform such signal processing as filtering, input information or field modification, computational compensation, etc.

Certain types of distortion (particularly particle bombardment type) can be at least partially limited due, at least in part, to particle tracking techniques, either deterministic ones of stochastic techniques, certain illustrative embodiments as generally known as the Monte-Carlo technique. The Monte-Carlo technique represents a relatively accurate method of calculating radiation levels arising from nuclear sources, for example. Monte Carlo methods make extensive use of random numbers to control the decision making when a physical event has a number of possible results. When given a comprehensive set of nuclear data and infinite computer resources the method can reproduce, in a computer model, a simulation of that problem. Monte Carlo analysis can represent a largely stochastic modeling of distortions that can be produced by certain embodiments of the distorting feature 102 without a more complex mathematical analysis. Certain embodiments of the Monte Carlo analysis could be applied following the imaging to compensate for the distortion, or alternatively to derive the input compensating information as a feedback mechanism. Certain embodiments of the deriving the input compensating information could also be automated, as to allow the distortion compensation controller to be controlled based at least in part on feedback, automated based at least in part on feedback, and/or robotically performed at least partially based on feedback. Certain embodiments of computers, controllers, processors, etc. as can in included in certain embodiments of the distortion compensation controller 97, as described in this disclosure with respect to FIG. 3 and at other locations, therefore can be used to perform the Monte-Carlo technique, and/or other similar computer modeling techniques.

These computational embodiments of the distortion compensators are intended to be limiting in scope, and are not intended to be limiting in scope. In general, such computational embodiments of the distortion compensators can be utilized to limit distortion to the images resulting at least in part from the distorting feature, but typically cannot remove the effects in their entirety. It might be useful to utilize certain embodiments of combinations of the distortion compensator, which can thereby be used to effectively remove more of the effects of the distortion than single distortion compensators. Certain embodiments of these distortion compensating techniques can thereby be utilized in combination, in series, and/or in alternative for certain types of imaging such as to limit imaged effects of distortion.

Figure 4:
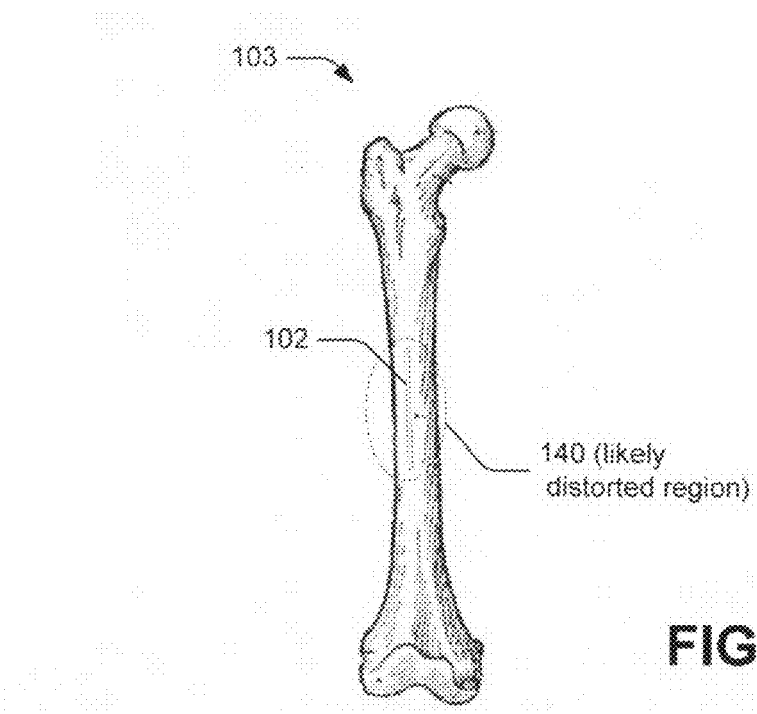
FIG. 4 is a diagram of another embodiment of the distorting feature.

FIG. 4 shows another embodiment of the at least the portion of the at least one distorting feature 102 that is illustrated as being configured, for example, as an insert, pin, screw, bone, or other man-made or naturally occurring item, etc. that can be embedded, or otherwise associated with a region to be imaged, such as a bone in the individual (human or animal). Certain embodiments of the at least the portion of the at least one distorting feature 102 may be positioned relative to a bone(s), bone end(s), bone fragment(s), etc. such as to secure the portion(s) of the bone(s). Certain embodiments of the at least the portion of the at least one distorting feature 102 can be used to maintain broken or fractured bone(s), etc. in a suitable position as to enhance or promote healing of the bones. Particularly with large bones, the dimensions of the associated healing embodiments of the at least the portion of the at least one distorting feature 102 may be considerable. Other configurations of the at least the portion of the at least one distorting feature 102 such as pins, screws, rods, plates, bolts, joints, and other devices as described in this disclosure whose use may result in at least some distortion of the imaging.

Certain orthopedic, dental, and other embodiments of the at least the portion of the at least one distorting feature 102 can result in certain distortion as a result of considerable non-optical electromagnetic field or signal (e.g., MRI or X-ray) modification such as may be used during imaging by a variety of embodiments of the distortion susceptible imaging device(s) 104 (as described with respect to FIG. 3), such as may be limited using certain embodiments of the distortion compensator. For example, certain distortion effects of implants such as fillings can also be removed from individuals (such as humans or animals).

To improve imaging functionality, it may thereby be desirable to limit the distortion effects on imaging. One source of distortions of certain embodiments of the distortion susceptible imaging device(s) 104 can include integrating or inserting the at least the portion of the at least one distorting feature 102 at least partially into the individual 103 (human, animal, or organism). Certain embodiments of the at least the portion of the at least one distorting feature 102 can thereby distort at least a portion of the image (situated at least partially proximate to the imaging feature) being imaged by the distortion susceptible imaging device(s) 104. Certain embodiments of the individual 103 can be, for example, a person, an animal, an organism, etc., or another type of living being in which certain ones of the at least the portion of the at least one distorting feature 102, such as inserts, can be provided. The application of certain embodiments of the at least the portion of the at least one distorting feature 102, when at least partially associated with the individual 103 (human, animal, or organism), can be at least partially implanted into the individual, at least partially positioned proximate to the individual, etc., and can thereupon result in imaging distortions to the individual (typically in areas proximate to a junction of the individual and the at least the portion of the at least the portion of the at least one distorting feature 102).

Certain embodiments of the distortions to the imaging as caused at least partially as a result of the at least the portion of the at least one distorting feature 102 can thereby considerably reduce the quality of the imaging in that region and/or useful information, images, or analysis that may be obtained from the imaging. Certain embodiments of the distortion resulting from the at least the portion of the at least one distorting feature 102 can vary for such parameters that can include, but are not limited to, dimension(s) and/or shape(s) of the distorting feature, material(s) of the at least the portion of the at least one distorting feature 102 (e.g., whether at least some portion(s) of the at least one distorting feature(s) is metallic, ferromagnetic, diamagnetic, paramagnetic, etc.), relative position between the at least the portion of the at least one distorting feature 102 and the distortion compensator 100 (as described with respect to FIG. 3), etc.

Certain positional and/or orientation information about the at least the portion of the at least one distorting feature 102 may be characterized as distortion characterizing imaging information, as described in this disclosure. Certain embodiments of the distortion characterizing imaging information can thereupon be used to generate or derive the input compensating information. Within this disclosure, depending on context, the distortion characterizing imaging information can include, but is not limited to, at least some characterizing information that can describe at least one non-optical electromagnetic characteristic (e.g., MRI or X-ray) which may be alterable based at least in part on an orientation (e.g., angular about one, two, or three axes) and/or at least one position of the at least the portion of at least one distorting feature 102 with respect to the distortion susceptible imaging device(s) 104 and/or the individual 103.

Within this disclosure, "electromagnetic" such as with non-optical electromagnetic can include but is not limited to, (depending on context), electromagnetic, electronic, electric, magnetic, and/or other permutations of combinations of electric, electronic, and/or magnetic signals, waves, fields, transmission media, etc. Even broader terminology, as generally understood by those skilled in the electrical engineering area, are also intended to be applicable inclusively. Certain embodiments of the distortion characterizing imaging information and/or the input compensating information can be determined, for example, with respect to the individual (human, animal, or organism) and/or the at least one distortion susceptible imaging device(s) 104. The distortion characterizing imaging information and/or the corresponding input compensating information can thereby vary depending on its position and/or orientation with respect to the individual and/or the at least one distortion susceptible imaging device(s) 104.

Certain individuals 103 (such as persons, animals, or organisms) can have such embodiments of the at least the portion of the at least one distorting feature 102 as implants either at least partially inserted in them, at least partially positioned proximate to them, and/or at least otherwise partially associated with them. While this disclosure describes a variety of embodiments of the at least the portion of the at least one distorting feature 102 as being compensated for primarily in human individuals being imaged at least partially by the distortion susceptible imaging device(s) 104; similar techniques can be utilized to overcome distortions to other animal or organism imaging, while remaining within the scope of the present disclosure. Certain embodiments of such embodiments of the distorting feature(s) as implants can adversely affect imaging of the individual 103 (human or animals). Certain embodiments of the distortion susceptible imaging device 104, as described in this disclosure, can thereby include at least one distortion compensator 100 which can thereby be configured to remove distortions such as image artifacts that may result from, or be associated with, a variety of the at least the portion of the at least one distorting feature 102 such as surgical implants or alternately naturally-occurring matter, fluids, cells, etc.

The shape and material properties of the at least the portion of at least one distorting feature 102 can be used to determine the non-optical electromagnetic field, signal, or characteristic (such as an induced magnetic field in the instance of magnetic resonance imaging (MRI)) in the vicinity of the implant, and thereby calculate, determine, or consider how to compensate for the distortion of the non-optical electromagnetic field resulting from the at least the portion of at least one distorting feature 102.

Certain embodiments of the imaging techniques can thereby rely on such algorithms as Maxwell solvers, Monte-Carlo techniques, finite element analysis, as well as other computational techniques to determine which an effect which the at least one distorting feature is likely to have on the particular imaging. Thereupon, certain embodiments of the input compensating information, as well as certain embodiments of the distortion compensator, can be derived aush as by computationally subtracting, filtering, or otherwise reducing the effects of the distortion on imaging using such frequency domain/time domain transforms as the Fourier Transform (and inverse), the Fast Fourier Transform (and inverse), etc. In certain instances, the signal, image, data, information can be transformed into the frequency domain to perform the desired signal processing such as filtering, etc. Upon return to the time domain, certain filtered effects, distortions, artifacts, etc. can be removed or limited.

Certain imaging distortions can result at least partially from images being captured using a variety of the distortion susceptible imaging device(s) 104 depending largely upon the type of imaging technology associated with the distortion susceptible imaging device(s). A variety of image information, data, images, etc. such as can be provided using the distortion susceptible imaging device(s) can be contained in, stored in, accessed from, captured from, etc. a variety of sources including but not limited to: obtaining from the distortion compensator library 776 that may be configured as the electronic library or database, capturing from an imager or other imaging device, recalling from memory storage device such as main memory or a flash memory device, etc.

Some description as to how distortions are introduced into distortion susceptible imaging device(s) 104 is described in this disclosure with respect to magnetic resonant imagers (MRI), even though it is to be understood that similar concepts can be applied to a variety of distortion susceptible imaging device(s) 104 and/or associated imaging technology. MRI imaging, for example, may utilize an application of a number of magnetic fields as being applied to the individual 103 (human, animal, or organism).

Certain distortion characterizing imaging information can be associated with the position, characteristics, structure, or other aspects of the at least the portion of the at least one distorting feature 102, whether man-made or naturally occurring. Within this disclosure, input compensating information and/or electromagnetic imaging characterizing information can, depending on context, relate to the distorting effect of an implant on an image of the individual 103 (human, animal, or organism) associated with the implant. As such, the distorting effect of the input compensating information, as associated with the at least the portion of the at least one distorting feature 102, can vary depending upon the feature's configuration. For example, certain embodiments of the distortion characterizing imaging information may be expected to exhibit modified distortion effects as a result of material, changes, surface finishes, angle to the distortion susceptible imaging device(s), inclination to the distortion susceptible imaging device(s), contours, bends, edges, obscuring surface areas, necking-down portions, etc.

A considerable variety of distortions such as artifacts, etc. can be provided by imaging a variety of the at least the portion of the at least one distorting feature 102, whether man-made or naturally occurring, etc. using the at least one distortion susceptible imaging device(s). Certain embodiments of the distortions, artifacts, etc. can vary as a function of the inclination of the implants relative to the distortion susceptible imaging device(s) 104. Such distortion characterizing imaging information and/or the input compensating information of each of the at least the portion of the at least one distorting feature 102 may thereby be quantified, and can be stored, maintained, recalled, etc. from the distortion compensator library 776 that may be configured as the electronic library or database describing the input compensating information and/or the distortion characterizing imaging information based at least on a relative positioning (including orientation) of the at least the portion of the at least one distorting feature 102 relative to the distortion susceptible imaging device(s) 104.

Within this disclosure, a variety of input compensating information and/or the distortion characterizing imaging information can be stored in and/or obtained from certain embodiments of the distortion compensator library 776 that may be configured as the electronic library or database, as described in this disclosure. For example, the distortion compensator library 776 that may be configured as the electronic library or database can include data, information, images, etc., such as relating to the input compensating information, likely in a tabular or database form. Certain embodiments of the distortion compensator library 776 that may be configured as the electronic library or database can contain distortion characterizing image information and/or the input compensating information whose characterizing can vary at least in part based on an orientation of the at least one distorting feature. Certain embodiments of the orientation of the at least one distorting feature can vary based at least in part on dimension(s) of the distorting feature(s), material of the distorting feature, etc. Certain embodiments, of the distortion characterizing image information and/or the input compensating information can be used to computationally limit the distortion.

Certain embodiments of the distortion characterizing imaging information and/or the input compensating information can thereby contain information about the non-optical electromagnetic radiation, field(s), signals, etc. that can be produced, obstructed, absorbed, harmonically generated, reflected, refracted, or otherwise affected based at least in part on the position of the at least the portion of the at least one distorting feature 102, which can vary depending on an orientation, position, angle, or other such aspect of the at least one distorting feature(s) 102. Once the position and/or orientation of the at least the portion of the at least one distorting feature 102 can be determined (such as may be stored in the distortion compensator library 776 that may be configured as the electronic library or database), the expected distortion characterizing imaging information and/or the input compensating information for that relative position and orientation of the at least the portion of the at least one distorting feature 102 relative to the distortion susceptible imaging device(s) 104 can be derived. Using at least certain embodiments or combinations of the time domain/frequency domain transform (as well as the inverse time domain/frequency domain transform) as described in this disclosure, the effect of the distortion characterizing imaging information and/or the input compensating information can be computationally reduced, limited, or removed; thereupon at least partially compensating for distortion from the at least one distorting feature which may be man-made or naturally occurring.

Figure 5:
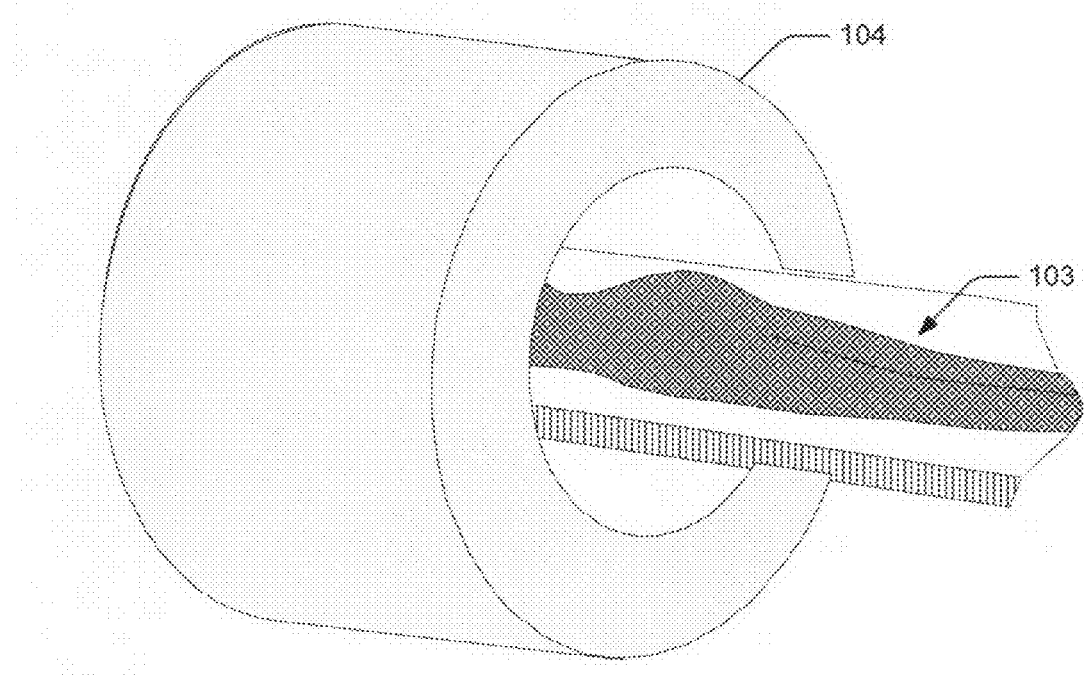
FIG. 5 is a diagram of an embodiment of the individual being imaged using at least one distortion susceptible imaging device(s)

Within this disclosure, depending on context, certain embodiments of the distortion susceptible imaging device(s) 104 can be considered as those devices that can be used to at least partially image the individual (human, animal, or organism), such as may thereupon be used to derive images, image information, etc. FIG. 5, for example, shows certain embodiments of the distortion susceptible imaging device(s) 104 (e.g., configured as an MRI), which can capture an image of the individual 103. FIG. 6 shows the individual 103 (human, animal, or organism) of FIG. 5 in which a number of slices 108 are illustrated as extending through the individual. Certain embodiments of the slices 108 represent one example of an illustrative series of images (e.g., substantially planar) that may be captured by the MRI. While the embodiments of the distortion susceptible imaging device(s) of FIG. 6 illustrates the slices 108 as being spaced at a particular distance, the spacing or distance between at least certain one(s) of successive slice(s) can be increased, decreased, rotated, angled, resized, filtered, or otherwise modified or selected as desired and/or appropriate based at least in part on the desired imaging process.

Certain embodiments of the distortion compensator may also allow prediction as to when certain slices could be repeatedly corrected, filtered, and/or averaged, such as may be used to improve the signal-to-noise ratio, or when multiple images collected at different angles, distances, etc., and at least certain portions of the distinct images could be Kalman filtered, adaptive filtered, or otherwise filtered or combined in a linear or nonlinear fashion to produce a more accurate image. As such, a variety of filtering techniques can be utilized to filter the effect of distortions and/or filter out the effect of the undesired imaging area(s) nearby distortions. Using certain embodiments of the distortion susceptible imaging device(s) 104, as may be used by, a physician, a technician, or another operator of the distortion susceptible imaging device(s) 104 (MRI), can scan through the multiple slices 108 as desired to view the individual (human, animal, or organism) at the desired region and/or depth.

Certain embodiments of the distortion compensator can utilize the distortion characterizing imaging information and/or the input compensating information derived at least in part based on the instrinic properties of the at least the portion of the at least one distorting feature 102, as well as the position, characteristic, and/or orientation of the at least the portion of the at least one distorting feature 102 at least partially in, on, or near the body (as described with respect to FIGS. 1, 2, and/or 4) relative to the distortion susceptible imaging device(s). Certain embodiments of the distortion compensator can thereby act to subtract/filter out the distortion effects of the at least the portion of the at least one distorting feature 102 from the image.

In addition, certain embodiments of the distortion compensator can predict a configuration or shape of the at least the portion of the at least the portion of the at least one distorting feature 102 (or an item it interfaces with) after some duration. For instance, after certain degradable parts are inserted into the body, portions could be expected to physically, chemically, biologically, or otherwise degrade following a particular duration as a result of wear, material degradation, plastic deformation, impact, etc. As another example, if a screw, pin, or fastener in inserted into a bone, it might be expected under certain instances that the bone and/or the screw, pin, or fastener (and/or a connection there between) could degrade at a particular rate.

The intrinsic properties of changes to the distorting feature may also be reflected and/or predicted utilizing distortion characterizing imaging information such as may predict changes to the shape, configuration, orientation, or position of the at least the portion of the at least one distorting feature 102. In certain instances, such prediction may be based, for example from design blueprints or physical finite-element modeling based on typical degradation rates. In other embodiments, such predictions may be measured, for example in a dummy body or material meant to simulate the distortion-susceptible item. The intrinsic properties of an object may therefore be expected to vary over time, as absorbable components degrade.

In addition, certain movable parts, such as artificial knee joints, spinal constructs, etc. may be expected to deform, rotate, or otherwise alter orientation over time. For example, as the knee of the individual (e.g., human or animal) flexes, the artificial knee-joint (or other embodiments of the distorting feature) will similarly deform or change to mirror the motion. As such, certain embodiments of the distortion characterizing imaging information and/or the input compensating information may include information as to relative angles or positions of relatively-displaceable portions of the at least the portion of the at least one distorting feature 102. These changes in certain properties can be forecasted from a model of the initial configuration of the object, and a computational model of how the temporal evolution of the object alters the effects beyond that predicted or measured based on the initial configuration. Such factors as the relative angle of different portions of the distorting feature may be used to predict an overall distortion of the total distorting feature.

Certain embodiments of the distortion compensator can thereby utilize the distortion characterizing imaging information and/or the input compensating information can be derived at least in part based on the position and/or orientation of the at least the portion of the at least one distorting feature 102 relative to the distortion susceptible imaging device(s) such as to subtract/filter out the effects of distortion and/or other items (such as skin, tissue, bone, etc. of the individual 103) from the image, and thereby provide a distortion-reduced image of the at least the portion of the at least one distorting feature 102, such as can be used to determine the position and/or orientation of the at least the portion of the at least one distorting feature 102. For instance, such images could be used to determine whether an implant is properly positioned, installed, inserted into, and/or otherwise associated with the individual 103. For example, it might be useful to determine whether such embodiments of the at least the portion of the at least one distorting feature 102 as bolts, pins, screws, etc. are properly seated or positioned as desired into an assembly, relative to the bone(s), with respect to other tissue or material, etc. Certain embodiments of the distortion compensator can also be alter the input signals, field, etc. as utilized by the imaging device(s) to limit distortive imaging effects provided by the imaging feature. To limit the distorting effects of the at least the portion of the at least one distorting feature 102 such as by filtering and/or other techniques as described in this disclosure, it would be useful to have an accurate model of the configuration of the at least the portion of the at least one distorting feature 102, including an interface with bones, other distorting feature, etc. Certain embodiments of the input compensating information can be derived at least partially based upon such a model.

There can be various embodiments of limiting distortion as a result of at least a portion of the distorting feature 102. With certain embodiments of distortion susceptible imaging device(s) 104, it may be desired to image (and/or predict an amount or configuration of) a material or an area around or nearby at least a portion of the distorting feature 102 while limiting the distortion effects of the at least the portion of the at least one distorting feature. In other embodiments of the distortion susceptible imaging device(s) 104, it may be desired to image (and/or predict an amount or configuration of) an area of the at least the portion of the distorting feature 102 while limiting its distortion effects. In yet other embodiments of the at least the portion of the at least one distorting feature 102, it may be desired to image (and/or predict an amount or configuration of) a junction material or junction area between at least a portion of the distorting feature and other material while limiting the distortion effects of the at least the portion of the at least one distorting feature.

Measurement of compensation parameters on a device equipped with the hardware and software to perform the compensation, can then be associated with the patient, and the resulting compensation can thereby provide a more compact image while reducing distortion of imaging.

Certain embodiments of distortions, such as artifacts, which can thereby be caused by the at least the portion of the at least one distorting feature 102 such as implants may be in, or operationally proximate to, the imaging field of view. An example of two considerably different embodiments of the at least the portion of the at least one distorting feature 102 that may be similar distortion effects on an image by the distortion susceptible imaging device(s) 104 can include, but are not limited to, implants as compared with surface electrodes. Certain materials of the at least the portion of the at least one distorting feature 102 can produce their own characteristic static magnetic field that can perturb the relationship between position and frequency essential to accurate image reconstruction.

Certain ones of the at least the portion of the at least one distorting feature 102 may have a magnetic susceptibility, other non-optical electromagnetic susceptibility such as may significantly differ from that of tissue, and thereby distortion may result. Certain embodiments of the at least the portion of the at least one distorting feature 102, such as may be imaged using the distortion susceptible imaging device(s) that may operate at least partially using such an imaging process as MRI, may induce an eddy current which may be at least partially generated as a result of the incident RF magnetic field.

Certain embodiments of the distortion susceptible imaging device(s) 104 may thereupon affect non-optical electromagnetic radiation (such as the RF field for MRI, or fields that could distort the particles for X-ray) near the implant, which may thereby result in the distortion. The particular type of non-optical electromagnetic distortion(s), resulting from particular implants on particular imaging processes, may vary depending on various factors such as material of the particular distorting feature(s) as implants and imaging technology. As such, the particular distortion(s), the particular distorting feature(s) as implant(s) and their shapes and material, and the various imaging techniques and/or technologies as described in this disclosure are intended to be illustrative in nature but not limiting in scope.

While actual distortions of the individual (human, animal, or organism) may not be shown in the figures, their effects are generally understood. There may be a variety of imaging distortions that can result from imaging (by the distortion susceptible imaging device(s) 104) a variety of the at least the portion of the at least one distorting feature 102. Examples of such distortions, for example, are displayed at various locations across the Internet. Such distortions to the images provided by the different embodiments of the distortion susceptible imaging device(s) would generally be understood by those skilled in the medical imaging technologies, as well as physicians, etc. who have to obtain useful information and/or provide a prognosis or analysis as a result of such distorted images.

There may be a variety of techniques and/or mechanisms, for each imaging technology, by which the distortion compensator 100 can limit distortion effects from certain ones of the at least the portion of the at least one distorting feature 102 by the distortion susceptible imaging device(s) 104. Certain embodiments of such ones of the at least the portion of the at least one distorting feature 102 may be associated with the individual (human, animal, or organism) in different ways, and thereby may also be removed, limited, or subtracted in different ways. Such image processing techniques as subtractive processing and/or filter processing may be utilized, for example, to subtract and/or filter out the distortion effects either at least partially, or perhaps almost entirely in certain applications or embodiments. In certain instances, a series or combination of the distortion compensators 100 can be operated sequentially or in combination, such as to further reduce the effects of distortion.

Methods that nonlinearly optimize a given metric for performance of the compensator can also optimize the image automatically or quasi-automatically, or optimize images dynamically in response to user feedback. As such, with certain embodiments of the distortion compensator, the distortion effects can be only partially removed, which in others they can be largely and/or almost entirely removed. Upon determination of the optimal parameters for compensation for a given imaging session, these parameters can be saved and utilized at a later date as initial conditions, such as could be used to speed up the optimization of computation on images or other information such as the input compensating information having at least some effects of the at least one distorting feature partially removed.

Certain embodiments of the distortion susceptible imaging device(s) 104 can, for example, obtain at least one distortion characterizing imaging information and/or the input compensating information that can be associated with the at least the portion of the at least one distorting feature 102 of the individual 103 (human, animal, or organism). Certain embodiments of the at least the portion of the at least one distorting feature 102 can be situated at least partially internally to the individual 103, at least partially external to the individual, and/or otherwise proximate the individual 103. Certain embodiments of the imaging (such as can be performed at least partially using the distortion susceptible imaging device(s) 104) can relate to imaging at least a portion of the individual 103 (human, animal, or organism) integrating the at least the portion of the at least one distorting feature 102 at a relative imaging position.

While the above embodiments of the at least one distorting feature(s) 104 as artificial joints, implants, bone portions or segments, etc. has utilized certain embodiments of the distorting compensator 100; it is to be understood that certain embodiments of the at least one distorting feature(s) can also be applied to such microscopic items as cells, blood cells, stem cells, magnetic beads, etc., or to sets of such cells, which appear as a continuous mass, either solid or fluid. Certain embodiments of the at least one distorting feature(s) 104 that are included as blood cells (which often include hemoglobin) can be distorted when imaged as a result of the hemoglobin (a ferromagnetic component) which can result in distortions to various types of imaging (e.g., MRI) of blood. Certain types of blood cells can be characterized according to their general dimension(s), orientation profile (e.g., aspect ration, such as a length divided by a width), components thereof such as could be determined by spectrometers, etc. In addition, ferromagnetic bead labeled cells could also be characterized according to the concentration of beads contained in the cells.

Figure 13:
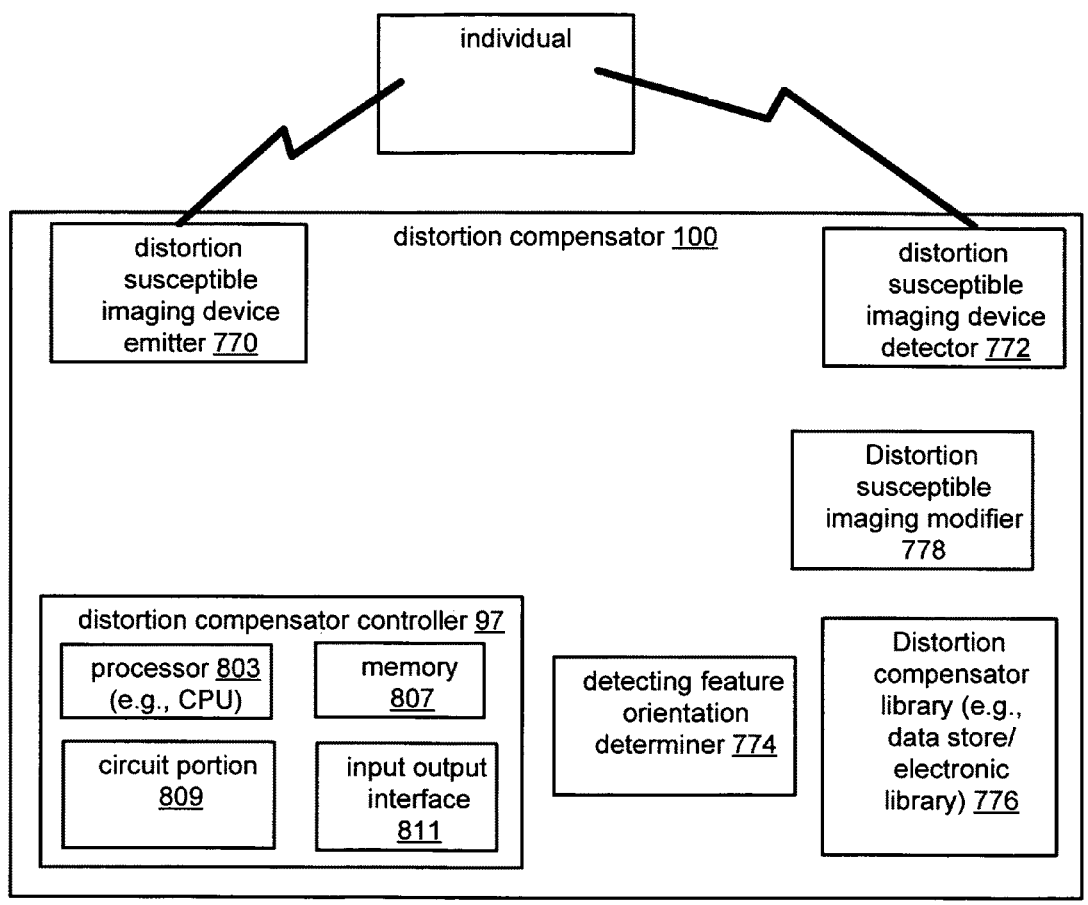
FIG. 13 is a diagram of another embodiment of the distorting compensator.
Figure 14:
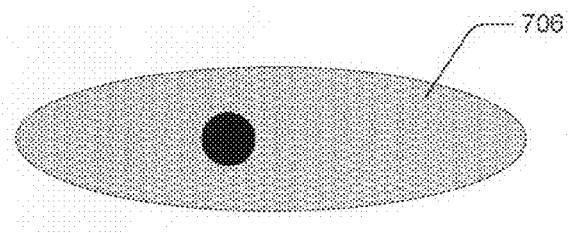
FIG. 14 is a diagram of one embodiment of an at least one opaque matter which may be configured as a microscopic cell, tissue, fluid, particle, bead, etc. that, by itself, can be imaged using at least one imaging modality.

FIG. 14, for example, illustrates one embodiment of an at least one opaque matter 706 such as a microscopic cell, fluid such as blood, tissue, cancer, or stem cell (which will appear stylized in this application for purpose of illustration), bone fragment, fluid, etc. which may be imaged by itself Certain embodiments of the at least the at least one distorting feature(s) may well be smaller than typical implants, bones, or other matter as described above. When the microscopic embodiments of the at least one distorting feature(s) can be imaged such as by using magnification techniques, it can cause distortion off the image. Regularly-appearing embodiments of the distorting figure of FIG. 14, such as cells, etc. may be characterized by their shape (general length, width, angular position, imaging characteristic(s), etc. Such imaging characteristics can also vary depending upon their orientation (similar to an implant). As such, certain characteristic features for imaging can be stored in the distortion compensator library 776 that may be configured as the electronic library or database, similar to as referenced as 776 and described with respect to FIGS. 12 and 13.

Figure 15:
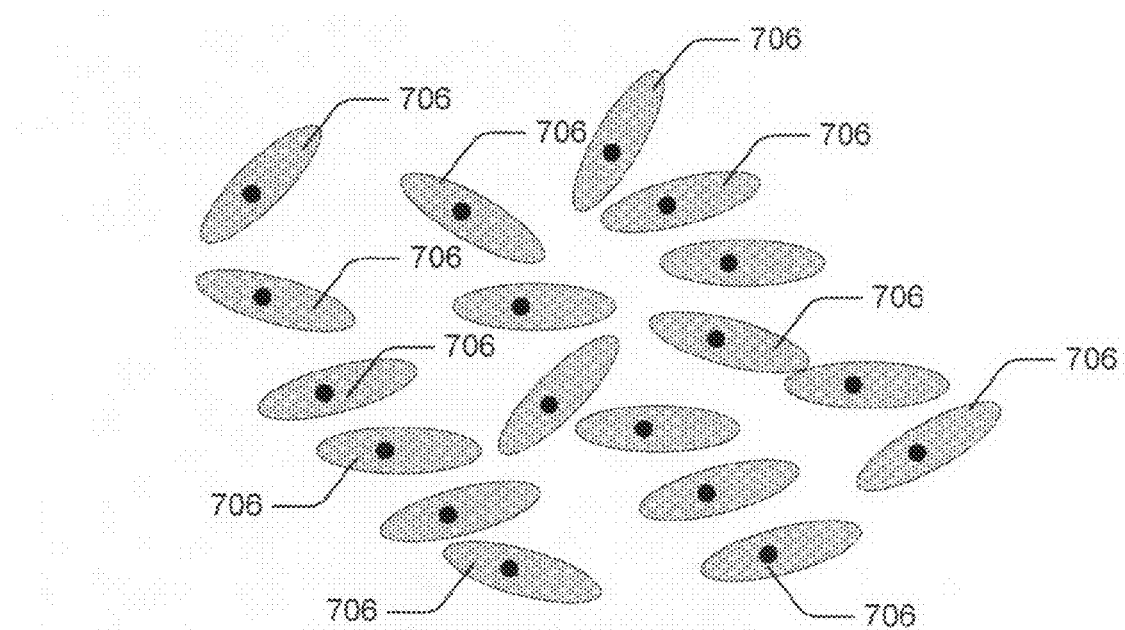
FIG. 15 is a diagram of a field including a number of the at least one opaque matter, as described with respect to FIG. 14.

FIG. 15 is a diagram of one embodiment of imaging-opaque matter 706, such as microscopic cells, fatty material, pieces of bone, liquid, fluid, etc. which do not cause particular distortions during the imaging process for the imaging modality. The imaging-opaque material may have relatively good contrast during imaging, and may, for example, provide a variety of useful imaging information. Certain embodiments of the imaging-opaque matter. As such, a particular cell or other matter may be classified as an at least one distorting feature(s) one imaging modality such as MRI, while it may be classified as an embodiment of the imaging-opaque matter 706 for another imaging modality such as CT scan.

Figure 16:
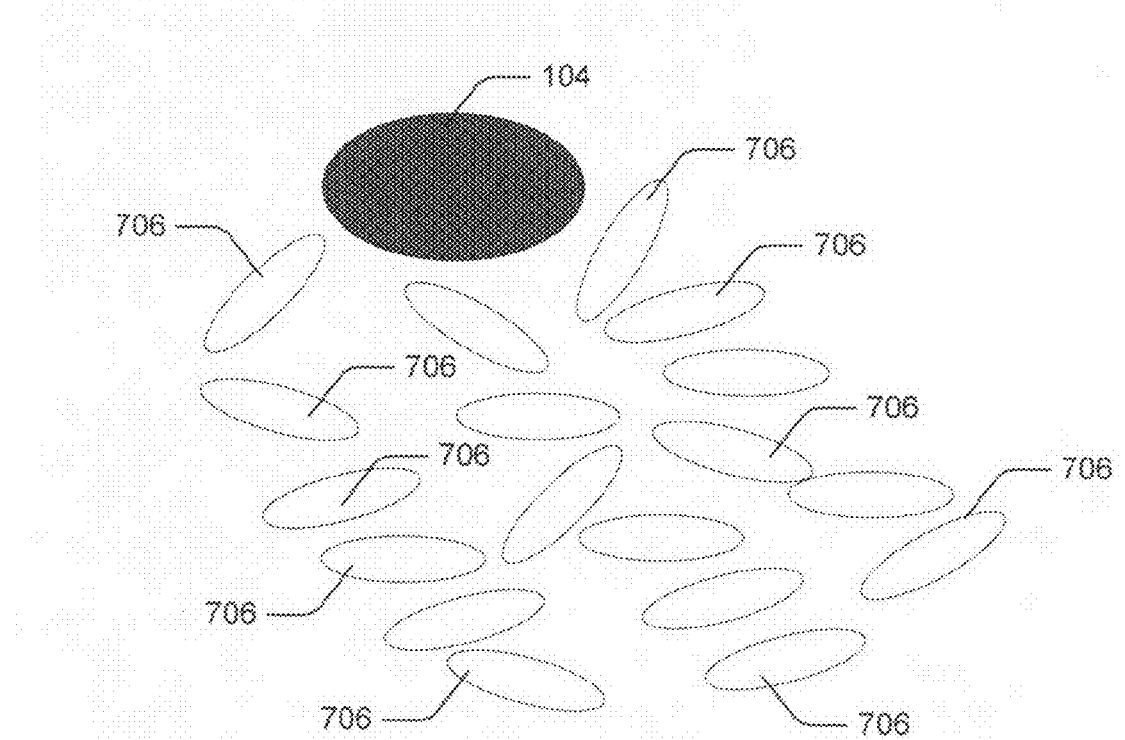
FIG. 16 is a diagram of the embodiment of opaque matter of FIG. 15 with a number of as the at least one distorting feature(s) interspersed within the image such as to cause a distortion of the imaging of the opaque matter.

FIG. 16 is a diagram of the embodiment of imaging-opaque material 706 of FIG. 15 with at least one distorting features(s) interspersed therewithin the image. As such, in certain instances, the imaging quality of the imaging-opaque material can be considerably reduced, such as to result in a distortion of an image of the imaging-opaque material. One example of such a microscopic version of the at least one distorting features(s) could include blood cells that are ferromagnetic since they include hemoglobin. When such blood cells are imaged using MRI, they can considerably distort the background of the image. Other types of matter such as, cells, matter, fluid, liquid, etc can act as distorting features for other imaging modalities, such as would be understood by those skilled in the imaging and/or medical arts.

Certain embodiments of imaging-opaque matter 706 with a variety of potential interspersed at least one distorting feature(s) 104 may be applied to medical, clinical, or other imaging areas.

Furthermore, intravenously introduced iron oxide particles are commonly used as a contrast agent to enhance the visibility of blood itself, sometimes at the expense of distorting the appearance of tissue adjacent to elaborate vascular beds, due to the large local permeability. Such characterizing information could be included in the distortion compensator library 776 that may be configured as the electronic library or database, such as may utilize certain embodiments of the distortion compensator controller 97 which may utilize databases, etc. as described in this disclosure. Other memory devices may be utilized as certain embodiments of the distortion compensator 100 to thereby limit distortion to imaging such as may be caused by a variety of the distortion compensator. With certain embodiments of the distortion compensator 100, the state or health of surrounding tissues, cells, matter, etc. that are in promimity to the at least one distorting feature(s) 104 could be considered by perhaps limiting the amount of distortion provided by certain embodiments of the at least one distorting feature(s).

Certain embodiments of the at least one distorting feature(s) 104 such as certain cells (e.g., blood cells, etc.) can appear transparent due to distortion resulting from excessive distortion-causing agents situated therein. For example, excessive hemoglobin can be included in certain blood cells. When such blood cells are situated in close proximity to certain other cells (e.g., stem cells), such other cells appear translucent, similar to as if they were dead (some times even if they are still living). The deliberate labeling of exogenous cells before they are transplanted into the body, with MRI-detectable compounds such as iron oxide particles, can enable the cells (either visualized individually, or in clusters, or dispersed in a fluid such as blood or cerebrospinal fluid) to be visualized, at the expense of visualizing neighboring regions of interest. As such, certain embodiments of the distortion compensator 100 can be configured to limit distortions to imaging of minute organisms, or small portions of other individuals, by certain embodiments of the distortion susceptible imaging device(s) 104.

A variety of embodiments of the distortion compensator controller 97, as described with respect to FIG. 3, can be configured to include the distortion compensator library 776 that may be configured as the electronic library or database, etc. such as to contain information which can model distortions based at least in part on the at least one distorting feature, as well as its orientation, position, etc. Certain embodiments of the distortion compensator controller 97 can thereby allow for updating of electronic libraries and models, as well as optimization of the electronic libraries and models through the accumulation of population data on the at least one distorting feature(s) such as implants, bones, blood cells, cells, etc. Certain embodiments of the distortion compensator controller 97 can allow updating of data over time due to patient change, finer discrimination of distorting features to allow parts to be emphasized/de-emphasized dynamically.

Certain embodiments of the at least one distorting feature, such as blood cells, other cells, etc., can be configured to utilize one or more contrast agents or dyes, such as may be applied to specific areas so cells, tissue, organs, blood vessels, etc. can be made more visible. Certain embodiments of contrast agents can include a ferromagnetic component such as hemoglobin, and as such can make the at least one distorting feature more likely to distort such distortion susceptible imaging device(s) 104 as MRIs. The cell can thereupon degrade certain types of contrast agents and/or the material contained therein such that the level of the distortion being provided by the distorting feature will likely reduce as the individual, such as a cell, digests or breaks down the contrast agent. As another example, iron oxide nanoparticles are often infused into the bloodstream to enable the cardiovascular system to be visualized in sharper relief via MRI, e.g., for seeing highly-vascularized tumors; after a period of hours to days, the particles are taken up by the spleen or liver, and subsequently degraded. The distorting effect of blood would decrease over time, whereas the distorting effect of spleen or liver iron oxide may actually briefly increase, before ultimately also decreasing. As such, after several days, the amount of distortion that certain embodiments of individuals being exposed to certain distortion-producing contrast agents may decrease.

Certain embodiments of the "microscopic" features may distort on a cell-by-cell basis, as described within this disclosure. Additionally, certain microscopic features may also distort as ensembles. For example, an ensemble or a clump of iron oxide-labeled cells could distort the apperance of a whole volume of brain tissue nearby. Alternately, a blood vessel that contains high levels of iron oxide contrast agent (such as which may be added to enhance the imaging of blood vessels), could distort the appearance of a tumor, other tissue, other cells, or other matter particularly which may be highly vascularized. Such ensemble distortions may considerably reduce the relevant short-term case than the effects of single cells in isolation, the case where the distorting feature is an ensemble of cells or particles dispersed throughout a material, a group of cells, some fatty material, solid or fluid, or a conglomeration or combination of the above that may distorts the appearance of an ensemble of cells or solids or fluids nearby, that do not contain the same level of the particle as the part containing the particles.

As such, certain uses of the term "organism" in this disclosure can, depending on context, be used as including some cells, tissue, opaque material, fatty material, etc. may cause distortion to images when the organism is being imaged by the distortion susceptible imaging device(s) 104 alone or with a few cells. Such imaging of a relatively few number of cells may be the case in clinical cellular research, etc. Alternately certain uses of the term "organism", as described in this disclosure, may be applied to the situation when the organism is being imaged with an aggregation or ensemble of other cells, tissue, material, fatty material, etc. Such may be the case when the organism, or alternately the human or animal including the animal is being imaged in vivo, etc., or even as a portion of an aggregate material outside of the person or animal is being imaged. Certain embodiments of the at least one distortion susceptible imaging device(s) 104, such as certain MRIs, are capable of imaging enlargement or microscopy such as in certain instances to allow imaging down to a number of the cellular or microscopic levels.

Certain embodiments of the imaging, such as can be performed by the distortion susceptible imaging device(s) 104, can computationally compensate for at least some of the distortion effects of the at least the portion of the at least one distorting feature 102. Such compensation is based, at least partially, upon considering the distortion characterizing imaging information and/or the input compensating information considering, at least in part; on the relative imaging position of the at least the portion of the at least one distorting feature 102 relative to the distortion susceptible imaging device(s) 104.

Certain embodiments of the distortion susceptible imaging device(s) 104 can image the entire individual 103 (human, animal, or organism), a large portion of the individual, or only a small segment of the individual based, at least partially, of the dimension, field of view, and/or configuration of the distortion susceptible imaging device(s). A variety of embodiments of the distortion susceptible imaging device(s) 104 and/or their respective imaging technologies may have the distorting effects as provided by the at least the portion of the at least one distorting feature 102 reduced or otherwise diminished, such as may include, but are not limited to: MRI, CAT scans, PET scans, other non-optical electromagnetic imaging techniques, or X-ray imaging techniques, etc. Within this disclosure, a number of distortion susceptible imaging device(s) 104 are described as having the distorting effects of the at least the portion of the at least one distorting feature 102 reduced or limited. It is to be understood that other embodiments of the distortion susceptible imaging device(s) 104, as only limited by the claimed scope of the present disclosure, are intended to be protected as having the distorting effects of the at least the portion of the at least one distorting feature 102 reduced or limited.

Certain embodiments of distortion susceptible imaging device(s) 104, such as MRI scanners, may be configured as full-body scanners (or at least be able to image a considerable portion of the body), while others can be applied to only a portion of the individual 103 such as the head, a hand, a surface of the individual, blood flow, etc. Certain embodiments of the distortion susceptible imaging device(s) 104 can image blood flows or pools, for example, since blood contains hemoglobin, and therefore iron which is a ferromagnetic material, blood flow and pools can be imaged using MRI, and its derivatives. The selection of the embodiment of distortion susceptible imaging device(s) to use can include such factors as imaging quality, location of injury or illness, region to be detected, purpose of imaging, expense of imaging, potential danger of damage to the individual being imaged, etc.

With certain embodiments of the distortion susceptible imaging device(s) 104 (e.g., MRI-based), the distortion susceptible imaging device(s) can image a number of slices through the individual 103 (human, animal, or organism), each slice 108 desirably imaging, capturing, and/or obtaining an imaged plane such as may extend through the individual. For example, certain MRI-based embodiments of the distortion susceptible imaging device(s) 104 can be configured to image, capture, or obtain a series of slices 108 through the individual 103 (human, animal, or organism) as described with respect to FIG. 6. Such captured, imaged, or stored data relating to such image information as taken through the slices can thereupon be analyzed, processed, and/or displayed by a number of embodiments of the distortion susceptible imaging device(s) 104 with the effects of the distortions limited or largely removed.

To provide quality or useful results, each image slice 108, as produced by the MRI embodiment of the distortion susceptible imaging device(s) 104, should be very nearly planar. As such, each slice may be considered as a substantially planar view as taken through the individual 103 as illustrated with respect to FIG. 6. Often, successive and other slices 108 as imaged by MRI-based embodiments of the distortion susceptible imaging device(s) 104 may each be substantially parallel to each other, and may therefore provide useful imaging information by noting differences from one slice to another slice. Certain embodiments of the at least the portion of the at least one distorting feature 102 can have the effect of distorting at least one applied non-optical electromagnetic radiation (e.g., the applied magnetic-field for MRI) as utilized by the distortion susceptible imaging device(s) 104 from its desired substantially planar state into an altered (e.g., non-planar) configuration. Certain embodiments of the distortion compensator can thereby limit the distortive effects from the non-planar slices. This can result in the mapping of MRI information from multiple points in space, onto the same point, or onto points that are not in the same plane, but nevertheless in a predictable geometry.

Certain results of such distortions of the images (i.e., the likely distorted region 140) as imaged by the distortion susceptible imaging device(s) 104 may occlude the region of the individual 103 (human, animal, or organism) adjacent to the at least the portion of the at least one distorting feature 102, as described with respect to FIGS. 1, 2, 4, 7, 8, and 9, as well as other places through the disclosure. For example, for an MRI of an individual having an implant such as a respective spinal fusion of FIGS. 1 and 2, a knee replacement of FIG. 8, etc., the MRI images captured at relatively remote locations from the respective spinal region or knee may be useful, but the images at the respective imaged spinal region or knee may be occluded by distortions, artifacts, etc. Certain embodiment's of the distortion susceptible imaging device(s) 104 such as MRIs may be generally understood to be particularly suited to detect soft tissue, such as skin, the brain, organs, blood, etc.

Consider that, for example, when imaging the individual 103 (human, animal, or organism) in a region adjacent an implant such as a bone replacement using certain conventional imaging techniques, the images and/or other information derived there from which may be adjacent the bone replacement may likely form the likely distorted region 140. The distorted region 140 may, for example, exhibit poor (e.g., distorted) image quality as a result of the active non-optical electromagnetic radiation (e.g., MRI radiation or X-ray radiation) as provided by the imaging technology. In certain instances, for example, the at least the portion of the at least one distorting feature 102 may distort the non-optical electromagnetic radiation associated with the MRI imaging (e.g., resulting in changes in at least one spin(s) of the atoms, changes in the path of the eddy currents, etc.) or X-ray as a result of the imaging.

There may be a variety of techniques and/or devices by which certain distortion susceptible imaging device(s) 104 can limit the effect of the distortion. Such distortion may result, e.g., from deflection and/or distortion of such non-optical electromagnetic radiation as magnetic fields, eddy currents, etc., in the instance of MRI during the imaging, as described in this disclosure. Certain embodiments of the distortion susceptible imaging device(s) 104 can thereby computationally (or mathematically) "subtract out" or otherwise limit the effect of the distortion either following the imaging. Certain embodiments of the distortion susceptible imaging device(s) 104 can modify the flow, direction, etc. of the applied non-optical electromagnetic radiation.

There may thereby be a variety of non-optical electromagnetic technologies associated with the distortion susceptible imaging device(s) 104 that can provide the image(s), which can include, but are not limited to, MRI, CAT scan, PEC scan, other non-optical electromagnetic radiation imaging technique, other particle bombardment imaging technique, and/or an X-ray imaging technique, etc. Certain embodiments of the distortion compensator 100 can be associated with other distortion susceptible imaging device(s) 104, such as the Positron Emission Tomography (PET) scan. Certain embodiments of the PET scans are commercially available, and generally understood by those skilled in the art, such as described in The Biomedical Engineering Handbook, Second Edition, Volume 1, 2000, CRC Press/IEEE Press, pp. 67-1 to 67-17 (incorporated herein by reference). Imaging using the PET scan, for example, can begin with an injection of a metabolically active tracer into the individual (human, animal, or organism). The tracer includes a biologically active molecule that carries with it a positron-emitting isotope (e.g., $^{11}$C, $^{14}$N, $^{15}$O, and/or $^{18}$F). The tracer, after being absorbed into portions of the body for which the biologically molecule may have an affinity for particular cells (such as certain cancer cells, for example). The cells can thereupon decay radioactively.

Certain embodiments of the distortion characterizing imaging information, as could be obtained by the distortion compensator 100, could thereby provide some indication of the at least the portion of the at least one distorting feature 102 that can act to distort the image captured of the region. Certain embodiments of the distortion compensator 100 can be configured to obtain the distortion characterizing imaging information pertaining to the at least the portion of the at least one distorting feature 102 which may be obtained from a variety of sources as described in this disclosure. Certain embodiments of the distortion characterizing imaging information and/or input compensating information can be obtained, for example, in the form of images or data relating to images that can be obtained, such as being recorded, retrieved, captured, and/or otherwise obtained.

Within this disclosure, the application of the distortion compensator to various embodiments of imagers is described. Certain embodiments of the source(s) of the image(s) may be obtained from one or more of the distortion compensator library 776 that may be configured as the electronic library or database, containing pre-determined distortion characterizing image information relating to the at least the portion of the at least one distorting feature 102, in vivo, prior to inserting the implant in the body, etc. Certain embodiments of the distortion characterizing imaging information and/or the input compensating information can pertain to, but may not be limited to, MRI, imaged, X-ray, or other information relating at least in part to non-optical electromagnetic radiation that can be absorbed, reflected, refracted, transmitted, deflected, or otherwise affected by certain embodiments of the at least the portion of the at least one distorting feature 102. Certain embodiments of the distortion characterizing imaging information and/or the input compensating information can pertain to an interaction between the individual 103 (human, animal, or organism) and the at least the portion of the at least one distorting feature 102, which can be at least partially integrated into and/or associated with (relative to/into) the individual.

Certain embodiments of the at least the portion of the at least one distorting feature 102, particularly those whose distortion susceptibilities can include a ferromagnetic or, to a lesser degree, a paramagnetic material, or may otherwise image distortion susceptible material, may distort the image(s) to a degree, such as to make the region of slices 108 corresponding to the image distorted from the desired substantially planar configuration. The dimension, configuration mixture of materials, and/or other such factors of the at least the portion of the at least one distorting feature 102 can also have effect(s) on the distortion at least partially on the distortion susceptible imaging device(s) 104. Certain embodiments of the at least partially man-made or naturally-occurring embodiments of the at least the portion of the at least one distorting feature 102 can be either customized or non-customized prior to insertion or installation relative to the individual (human, animal, or organism).

Certain embodiments of the at least the portion of the at least one distorting feature 102 can thereby be naturally occurring. For example, bones, etc. can act as the at least the portion of the at least one distorting feature 102 since they may have a distorting affect such as to degrade image quality immediately adjacent the at least the portion of the at least one distorting feature 102 considering the particular imaging modality being used. For example, if MRI is being utilized as the imaging modality, then undesired distortion of the magnetic field can result in an undesired distortion. By comparison, if X-ray-based imaging is the particular imaging modality being utilized, then undesired distortion of the X-ray particles might result in an undesired distortion. For other imaging modalities, the distortion of the respective non-optical electromagnetic or X-ray energy, waves, field, signal, etc. can provide the undesired distortion. The distorting effect of certain embodiments of the at least the portion of the at least one distorting feature 102 may be at least partially man-made, while in other embodiments it may be at least partially naturally-occurring. Both naturally occurring and man-made embodiments of the at least the portion of the at least one distorting feature 102 can be compensated for once the distortion is characterized using techniques as described in this disclosure.

Certain embodiments of the man-made distorting feature such as an implant can, for example, be configured to be suited for use by one or more individuals 103 such as persons or animals, and can have at least one similar configuration(s), dimension(s), material(s), and/or electromagnetic characteristics. Certain embodiments of the at least one distorting feature 102 such as may be hinged, rotatable, deformable, or otherwise relatively displaceable can alter their characteristics when the relative position of the different portions are deflected or otherwise altered. Such movable or distortable embodiments of the at least one distorting feature 102 should be considered based on their particular instantaneous condition, state, relative position, etc. Certain embodiments of the at least the portion of the at least one distorting feature 102 can, for example, be formed at least partially from a ferromagnetic material, a paramagnetic material, or another material which may have an influence on the distortion. Customized examples of the at least the portion of the at least one distorting feature 102 may be an implant for a knee or bone replacement, or a screw, pin, and/or plate that can be surgically, scopically (e.g., with an endoscope, tracheal-scope, or other suitable scope, etc.), or otherwise inserted and/or applied to the individual 103. Certain embodiments of the at least the portion of the at least one distorting feature 102 that are customized may have their electromagnetic distorting characteristics and/or features that can be digitally maintained and/or accessed from the distortion compensator library 776 that may be configured as the electronic library or database, or other memory, data, and/or image storage, generation, or retrieval mechanism, for example.

Non-customized embodiments of the at least the portion of the at least one distorting feature 102 may include, but are not limited to, those features that may be added to or altered within the individual 103 (human, animal, or organism) such as during a surgery, scopic, research, and/or other treatment. The non-optical electromagnetic feature of certain non-customized embodiments of the at least the portion of the at least one distorting feature 102 can be analyzed prior to, during, or after insertion into the individual 103, and as such information can be obtained after the distorting feature has been inserted into the individual (e.g., inter-vivos). Such data, acquired from multiple individuals (human, animal, or organism), can be used to iteratively alter the model of the at least the portion of the at least one distorting feature 102 and improve the prediction of and compensation for the effects of the at least the portion of the at least one distorting feature 102 on the individuals.

Certain embodiments of the distortion compensator 100 can include a preliminary scanning of the at least the portion of the at least one distorting feature 102, such as to detect a linear and/or a regularly repeating aspect of a portion of the individual (human, animal, or organism), in an effort to determine where certain man-made or naturally occurring embodiments of the at least the portion of the at least one distorting feature 102 are positioned. With certain embodiments of the distortion susceptible imaging device(s) 104, the scanning can be performed with modalities different from the one being used to image the patient. As an example if one is getting an MRI, the patient can have a suplemental X-ray to determine the general position and orientation of the implant. One could thus combine modalities one for anatomic information the other for implant position. It is unlikely that naturally-occurring embodiments of the at least the portion of the at least one distorting feature 102 would provide the same linearity as linear man-made features. Consider that linear characteristics are relatively uncommon in nature (e.g., most naturally-occurring features such as organs, bone segments, etc. typically have some curvature, and are not precisely repeatable). Similarly, it is unlikely that naturally occurring embodiments of the at least the portion of the at least one distorting feature could provide the same regular-repeatability as man-made embodiments of the distorting feature. As such, linearity and/or degree of repeatability may be used to identify or determine position, angle, shape, size and/or other characteristics of ones of the at least the portion of the at least one distorting feature 102 as pin(s), screw(s), implant(s), pacemaker(s), and/or other such man-made or naturally-occurring feature may be positioned or situated. Certain types of detectors should be used for such location of linearity and/or repeatability that can detect such man-made embodiments of the at least the portion of the at least one distorting feature 102, regardless of the material (e.g., whether ferromagnetic, paramagnetic, etc.). As such, certain embodiments of the distortion compensator 100 can, utilizing a variety of the techniques as described in this disclosure, compensate for such "interfering" non-optical electromagnetic radiation that can be reflected, projected, transmitted, and/or otherwise provided by the at least the portion of the at least one distorting feature 102 (which may be regularly repeating or linear).

Certain embodiments of the distortion compensator 100 can utilize such frequency domain/time domain transform algorithms and/or inverse transform algorithms as fast Fourier transform (FFT)/Inverse FFT, Fourier Transform/Inverse Fourier Transform, etc. The application and usage of frequency domain/time domain transform algorithms and/or inverse transform algorithms are generally understood, and will not be further described in this disclosure.

There may be a variety of techniques that may be utilized by one or more of the embodiments of the distortion compensator 100 to computationally compensate at least some distortion effects of the at least the portion of the at least one distorting feature 102. Certain embodiments of the distortion compensator 100 can be configured to computationally compensate by filtering, signal masking, signal processing, signal regeneration, and/or otherwise removal or limiting of at least some distortion effects (considering the particular imaging modeling) which may be provided by the at least the portion of the at least one distorting feature 102 at least partially by computationally compensating for the received distortion effects of the distorting feature. By comparison, certain embodiments of the distortion compensator 100 can be configured to computationally compensate at least some distortion effects of the at least the portion of the at least one distorting feature 102 by determining a correction non-optical electromagnetic input correlating to the at least the portion of the at least one distorting feature 102. A variety of the embodiments of the distortion compensator 100 are described in this disclosure with respect to how they compensate for distortions as can be provided by the at least the portion of the at least one distorting feature 102.

Figure 10:
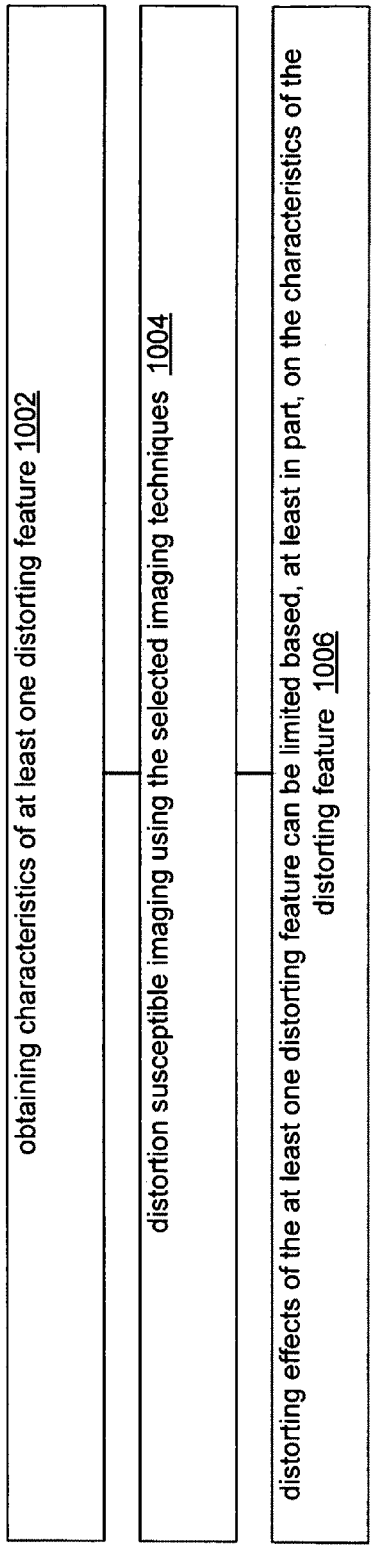
FIG. 10 is a flow chart of one embodiment of a distortion compensation technique.

Consider certain embodiments of the distortion compensator 100 can be configured to computationally compensate for at least some distortion effects of the at least the portion of the at least one distorting feature 102 at least partially by computationally compensating (redress/address, such as to subtract out) for the received distortion effects of the at least the portion of the at least one distorting feature 102. As such, FIG. 10 shows a flow chart of certain embodiments of distortion compensation as can be performed by a variety of embodiments of the distortion compensator to compensate for a variety of distortions by subsequently computationally subtracting out the effects of the distortion. Certain embodiments of the FIG. 10 flow chart can include, but are not limited to, one or more of operations 1002, 1006, and/or 1008. Certain embodiments of the flow chart compensation includes certain embodiments of operation 1002, in which the characteristics of the distorting feature may be determined either prior to, during, or following associating the at least the portion of the at least one distorting feature 102 with the individual (human, animal, or organism). Such preliminary imaging, perhaps even by the another imaging modality, may be performed, for example, to ensure the at least the portion of the at least one distorting feature 102 is installed or positioned at a desired location, as intended. Certain embodiments of the characteristics as set forth in operation 1002 can include, but are not limited to, obtaining characteristics of at least one distorting feature, in which the characteristics could include but are not lot limited to, orientation-dependent non-optical electromagnetic imaging characteristic information as described in this disclosure. Certain embodiments of the associating the distorting feature with the individual may occur, for example, by surgically applying the implant into the individual 103. Thereupon, in certain embodiments of operation 1004, can include, but are not limited to, distortion susceptible imaging at least partially using the selected imaging techniques (e.g., MRI, CAT scan, PET scan, etc.). In 1006, the distorting effects of the at least one distorting feature can be limited based, at least in part, on the characteristics of the distorting feature.

Certain embodiments of the distortion compensator 100, in operation 1008, can compensate for the distortion resulting from the distorting feature. Certain embodiments of the compensation may be computationally performed, for example, by utilizing the frequency domain/time domain transform (e.g., Fourier transform, FFT, etc.). The particular order of the operations as described with respect to flow charts in this application may not, depending on context, be limiting but instead may be illustrative in nature. As such, following the computationally compensating, either the one or more distorting feature, the one or more portion(s) of the individual (human, animal, or organism) outside of the distorting feature, or at least one junction between distorting feature and a portion of the individual (human, animal, or organism) should appear clearer such as to be less distorted. Certain embodiments of such compensation by certain embodiments of the distortion compensator 100 may occur, for example, by subtracting out (while in the frequency domain) the effects of the distorting feature.

Certain embodiments of the subtracting out or limiting the effects of the distortion can thereby include, but is not limited to, computationally computing, or otherwise processing, filtering, or performing some analog or digital operation to limit the distortion at least partially after the image has been imaged. Other embodiments of the subtracting out can include, but is not limited to, deriving, obtaining, or modeling at least some input image information such as a field or signal that may be used in imaging, that when combined with the non-optical electromagnetic radiation, MRI, X-ray, etc. as associated with the imaging modality (typically prior to or during imaging), can limit the effect of the distortion by the distorting feature during the imaging. By determining how to subtract out the effects of the distortion, the relative imaging position of the distorting feature with respect to the distortion susceptible imaging device(s) 104 is to be considered. The transformed image, with the distortion provided by the distorting feature computationally compensated for such as with the distortion subtracted out or otherwise computationally compensated for, can thereupon be returned to the time domain using the inverse frequency domain/time domain transform (e.g., inverse Fourier transform, inverse FFT, etc.), to provide images, data, etc. that no longer include the affects of the distorting feature. Certain embodiments of the distortion compensating of at least some of the distortion of the at least the portion of the at least one distorting feature can utilize a plurality of distortion compensating techniques run sequentially, in combination, in series, etc.

Certain embodiments of the distortion susceptible imaging device(s) 104 can thereby be configured to nullify the effects of the distortions at least partially as a result of removing the distortion from the images at least partially using the derived distortion characterizing imaging information and/or the input compensating information, such as may be able to be performed computationally as described in portions of this disclosure. Transforms, and inverse transforms, have been utilized for such algorithmic subtractive operations as signal separation or subtraction, noise cancellation, etc. As such, as described in this disclosure, the distortion compensator controller 97 can utilize at least a portion of a variety of hardware, software, or firmware techniques and mechanisms, as described in this disclosure, to perform the transform operations.

Figure 12:
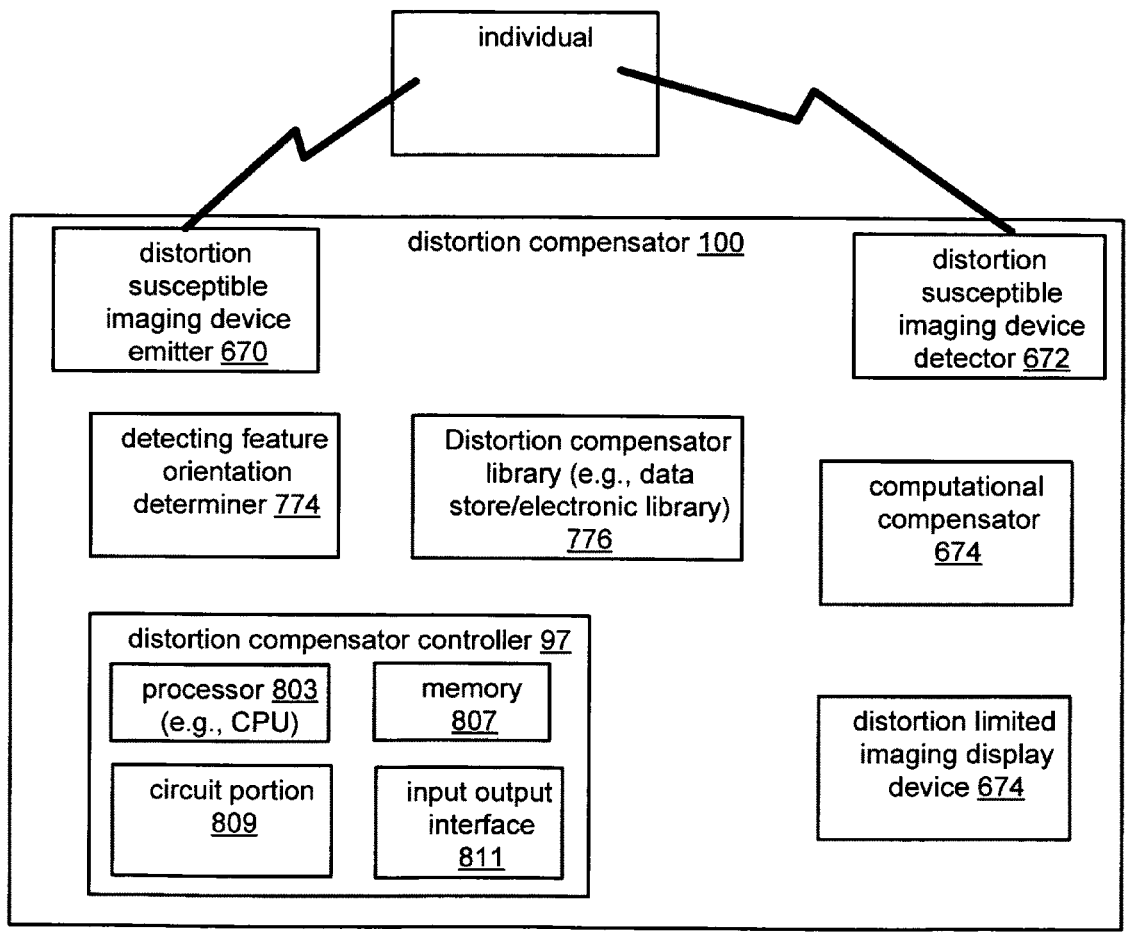
FIG. 12 is a diagram of another embodiment of the distorting compensator.

FIG. 12 shows one embodiment of the distortion susceptible imaging device(s) 104 which can limit distortion caused by certain embodiments of the at least one distorting feature(s) 100, as described in this disclosure. The distortion susceptible imaging device(s) 104 can include, but is not limited to, at least one distortion susceptible imaging device emitter 670, distortion susceptible imaging device detector 672, at least one computational compensator 674, and at least one distortion limited imaging display device 676.

Certain embodiments of the at least one distortion susceptible imaging device emitter 670 and the at least one distortion susceptible imaging device detector 672 can be configured to operate similar to or as such embodiments of the distortion susceptible imaging device(s) 104, such as MRI, CT, X-ray device, etc., as described in this disclosure.

Certain embodiments of the computational compensator 674 can be configured to limit distortion in images imaged by the distortion susceptible imaging device(s) 104, resulting at least partially from altering the input compensating information as can effect an operation of the distortion susceptible imaging device(s) 104 during imaging the at least one distorting feature(s) as described in this disclosure, depending on context. As such, certain embodiments of the computational compensator can be configured, depending on context, to computationally compensate at least some of the distortion of the at least the portion of the at least one distorting feature from the at last one image information based at least in part on the distortion characterizing image information or input compensating information, as described in this disclosure.

At least some of the output image information from the computational compensator 674 can be displayed, projected, printed, disclosed, scanned, transmitted, or otherwise output to the distortion limited imaging display device 676. There can be a considerable variety of embodiments of the distortion limited imager that can include, but is not limited to, displays, projectors, computers, controllers, graphics, printers, scanners, etc., and is intended to utilize any output device that could be utilized by a doctor, medical assistant, or other user of the distortion susceptible imaging device(s) 104 (or a derivative therefrom) in analyzing a condition of the individual.

Certain embodiments of the distortion limited imaging display device 676, the computational compensator 674, the distortion susceptible imaging device(s) emitter 670, and/or the distortion susceptible imaging device(s) detector 672 can be integrated in the distortion compensator controller 97, as described with respect to FIG. 3. Additionally, certain embodiments of the elements 670, 672, 674, and/or 676 can be automated, controlled, filtered, utilize feedback, or processed in a variety of manners as generally understood by those skilled in signal processing, as well as computer or controller operations.

Certain embodiments of the distortion susceptible imaging device(s) 104, as described with respect to FIG. 12, can utilize feedback, automation, robotics, control, and/or other mechanisms such that the input compensating information can be modified at least partially based on sensed, derived, or indicated distortion as included in images (or information). As such, by modifying the input compensating information being applied by the distortion susceptible imaging emitter 670, the distortion to the non-optical electromagnetic radiation, MRI, X-ray, or other input compensating information can be limited. As such, the information received by the distortion susceptible imaging detector 672 will likely contain less effects of distortion than, if the input compensating information has not been at least partially removed.

Certain embodiments of the at least one detecting feature orientation determiner 774 can be configured, as described in this disclosure, to determine an orientation of the at least one distorting feature(s) 100. A variety of techniques can be used to determine the orientation of the at least one distorting feature(s) 100. For instance, the person inserting or examining the at least one distorting feature(s) 100 can determine its orientation visually. Certain imaging devices (which may or may not be included in the distortion susceptible imaging device(s) 104) can be used to determine the orientation of the at least one distorting feature(s) 100 such as by determining how the general shape of the at least one distorting feature(s) corresponds to its known shape such as may be included in the at least one the distortion compensator library 776 that may be configured as the electronic library or database, or generally known by the treating person. Any mechanism or technique that can be used to provide information about an orientation, position, shape, wear, or other aspect of the at least one distorting feature(s) may therefore be used as certain embodiments of the at least one detecting feature orientation determiner 774.

In certain instances where the at least one distorting feature(s) 100 can include a displaceable feature such as a cell, stem cell, target cell, blood cell, etc.; certain embodiments of the at least one detecting feature orientation determiner 774 can be configured, as described in this disclosure, to determine the location of the at least one distorting feature as well as its orientation. In certain instances, MRI, for example, has been shown to be able to image down to the level of single cells. Other types of imaging technologies may be effective at imaging at smaller scales, particularly when used in combination with microscopic imaging devices or other microscopic devices. Certain embodiments of the single cells should have general configurations (e.g., long and narrow or a different shape with a nucleus and cytoplasm, and the length or width dimensions should be within prescribed dimensional ranges). Such general cell configurations, shapes, dimensional ranges of certain embodiments of the distorting feature(s) that are cells, blood cells, etc., can be included in the at least one the distortion compensator library 776 that may be configured as the electronic library or database, as described in this disclosure.

Certain embodiments of the distortion compensator library 776 that may be configured as the electronic library or database can be configured to model the distortion of the input compensating information that may result at least partially from the distorting feature(s) based on the orientation of the at least one distorting feature(s). Certain embodiments of the distortion compensator library 776 that may be configured as the electronic library or database can include, but is not limited to, images, image information, data or information derived from images or photographs, photographs, or other shape that can be used to indicate distortion(s) that may result at least partially from the at least one distorting feature(s) based at least in part on orientation, position, shape, wear, or other aspect of the at least one distorting feature(s) 100. Certain embodiments of the distortion compensator library 776 that may be configured as the electronic library or database can be at least partially included in one or more components of the distortion compensator controller 97 as described with respect to FIG. 3 (e.g., likely the memory 807 and/or the processor 803), depending on context.

By computationally compensating for, such as by subtracting, the effects of the distortion of the distorting feature out using the frequency domain/time domain transform as described with respect to FIG. 10, and other locations through this disclosure, such imaging techniques as MRI, PET scans, CAT scans, x-ray, etc. can be applied near to the at least the portion of the at least one distorting feature 102, while obtaining a reliable image of the area adjacent the distorting feature without the distortion. Such imaging proximate the distorting feature may be useful in deriving accurate images of soft tissue, bones, blood flow, junctions between multiple implants and/or at least one implant and at least one tissue portion, soft tissue, bones, blood flow, etc.

Certain embodiments of the distortion compensator, as described with respect to FIG. 10, can be configured to re-process at least some raw data that can be obtained by such non-optical electromagnetic sensors or resonance detectors (e.g., as the MRI scan or X-ray). Certain embodiments of the resonance detector can thereupon be re-processed to computationally remove the distortion created by the induced magnetic field of the distortion susceptible imaging device(s) 104 utilized by certain embodiments of the distortion compensator 100.

Certain embodiments of the distortion compensator 100 can also be configured to computationally correct distortion at least partially resulting from modifying input compensating information being applied to the individual (human, animal, or organism). Such embodiments of the distortion compensator can utilize certain embodiments of feedback to reduce the effects of distortion such as by recursively filtering out undesired component(s) of the input compensating information. Certain embodiments of such compensation by the distortion compensator 100 can involve changing applied non-optical electromagnetic radiation or X-ray energy (e.g., magnetic (B) field and/or the associated eddy currents for MRI, or the particles (photons) with X-ray) such as to limit such distortions. For instance, with MRI imaging, these magnetic fields directed at least partially at distorted regions can be at least partially shielded and/or redirected. The applied electromagnetic radiation (such as magnetic fields for MRI) can be shielded and/or redirected, such as to be applied to certain embodiments of the medical imaging such as MRI.

FIG. 13, for example, illustrates an embodiment of the distortion susceptible imaging device(s) 104 that can be configured to computationally correct distortion at least partially resulting from modifying the input compensating information being applied to the individual. As such, certain embodiments of the distortion susceptible imaging device(s) 104 as described in this disclosure can include, but is not limited to, at least one distortion susceptible imaging emitter 770, at least one distortion susceptible imaging detector 772, at least one detecting feature orientation determiner 774, the distortion compensator library 776 that may be configured as the electronic library or database, and at least one distortion susceptible imaging operation modifier 778.

Certain embodiments of the distortion susceptible imaging device(s) 104, as described with respect to FIG. 13, can utilize feedback, automation, robotics, control, and/or other mechanisms such that the input compensating information can be modified at least partially based on sensed, derived, or indicated distortion as included in images (or information). As such, by modifying the input compensating information being applied by the distortion susceptible imaging emitter 772, the distortion to the non-optical electromagnetic radiation, X-ray, MRI, or other input compensating information can be limited. As such, the information received by the distortion susceptible imaging detector 772 will likely contain less effects of distortion than if the input compensating information has not been at least partially removed.

Certain embodiments of the at least one detecting feature orientation determiner 774 can be configured, as described in this disclosure, to determine an orientation of the at least one distorting feature(s) 100. A variety of techniques can be used to determine the orientation of the at least one distorting feature(s) 100. For instance, the person inserting or examining the at least one distorting feature(s) 100 can determine its orientation visually. Certain imaging devices (which may or may not be included in the distortion susceptible imaging device(s) 104) can be used to determine the orientation of the at least one distorting feature(s) 100 such as by determining how the general shape of the at least one distorting feature(s) corresponds to its known shape such as may be included in the distortion compensator library 776 that may be configured as the electronic library or database, or generally known by the treating person. Any mechanism or technique that can be used to provide information about an orientation, position, shape, wear, or other aspect of the at least one distorting feature(s) may therefore be used as certain embodiments of the at least one detecting feature orientation determiner 774.

In certain instances where the at least one distorting feature(s) 100 can include a displaceable feature such as a cell, stem cell, target cell, blood cell, etc.; certain embodiments of the at least one detecting feature orientation determiner 774 can be configured, as described in this disclosure, to determine the location of the at least one distorting feature as well as its orientation. In certain instances, MRI, for example, has been shown to be able to image down to the level of single cells. Other types of imaging technologies may be effective at imaging at smaller scales, particularly when used in combination with microscopic imaging devices or other microscopic devices. Certain embodiments of the single cells should have general configurations (e.g., long and narrow or a different shape with a nucleus and cytoplasm, and the length or width dimensions should be within prescribed dimensional ranges). Such general cell configurations, shapes, dimensional ranges of certain embodiments of the distorting feature(s) that are cells, blood cells, etc., can be included in the distortion compensator library 776 that may be configured as the electronic library or database, as described in this disclosure.

Certain embodiments of the distortion compensator library 776 that may be configured as the electronic library or database can be configured to model the distortion of the input compensating information that may result at least partially from the distorting feature(s) based on the orientation of the at least one distorting feature(s). Certain embodiments of the distortion compensator library 776 that may be configured as the electronic library or database can include, but is not limited to, images, image information, data or information derived from images or photographs, photographs, or other shape that can be used to indicate distortion(s) that may result at least partially from the at least one distorting feature(s) based at least in part on orientation, position, shape, wear, or other aspect of the at least one distorting feature(s) 100. Certain embodiments of the distortion compensator library 776 that may be configured as the electronic library or database can be at least partially included in one or more components of the distortion compensator controller 97 as described with respect to FIG. 3 (e.g., likely the memory 807 and/or the processor 803), depending on context.

Figure 11:
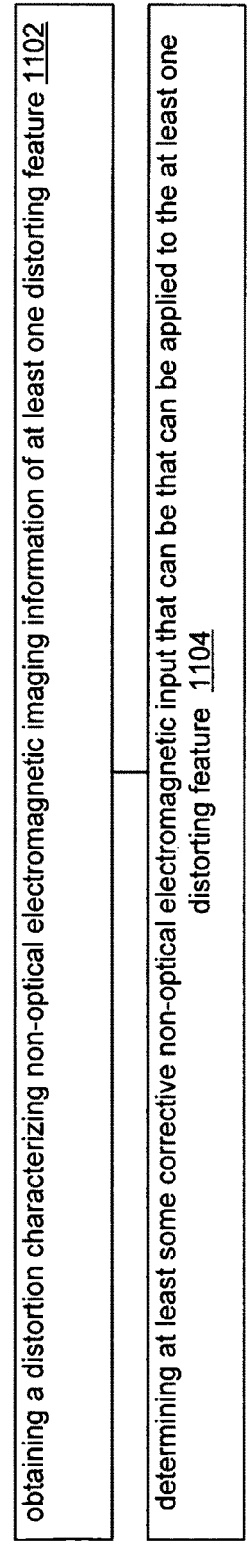
FIG. 11 is a flow chart of another embodiment of the distortion compensation technique.

Similarly, with certain X-ray-based embodiments of the distortion compensator 100, the applied input X-ray fields, signals, etc. can be modified to limit imaging distortion resulting at least partially from the at least one distorting feature 102. As such, FIG. 11 shows a flow chart of certain embodiments of distortion compensation as can be performed by a variety of embodiments of the distortion compensator to modify applied non-optical electromagnetic fields (e.g., MRI or electromagnetic) such as to limit for a variety of distortions resulting from distorting feature. Certain embodiments of the distortion compensation technique as described with respect to FIG. 11 can include, but is not limited to, operations 1102 and 1104. Operation 1102 could include, but is not limited to, obtaining a distortion characterizing non-optical electromagnetic imaging information of at least one distorting feature. For example, the at least the portion of the at least one distorting feature 102 such as an implant, bone, or other item that can be positioned or is situated relative to the individual such as a person, animal, or organism can be obtained. Operation 1104 could include, but is not limited to, determining at least some corrective non-optical electromagnetic input that can be that can be applied to the at least one distorting feature. For example, some non-optical electromagnetic (e.g., MRI or X-ray) signal, fields, currents, information, etc. can be applied to the individual that can at least partially correct the distortion.

Certain characteristics of the non-optical electromagnetic waves, currents, flows, fields, etc., as well as electromagnetic waves, currents, flows, fields, etc., may be utilized by certain embodiments of the distortion susceptible imaging device(s) 104 may be described in *The Electrical Engineering Handbook, Second Edition*, Richard C. Dorf, CRC Press/IEEE Press, pp. 887-914 (1997) (incorporated herein by reference in its entirety). Certain types of the non-optical electromagnetic waves, fields, currents, etc. can be varied, weakened, intensified, directed, etc. utilizing certain shielding, shaping, and/or controller techniques; such as are generally understood by those skilled in electrical engineering and/or electromagnetics.

Certain embodiments of the compensation flow chart that can be utilized by certain embodiments of the distortion compensator 100 can thereby include certain embodiments of operation(s) 1102, 1104, and/or 1106. In certain embodiments of the operation 1102, the characteristics of the distorting feature may be determined. Such determination of the characteristics can be performed prior to application (e.g., insertion) of the distorting feature relative to the individual 103, or alternately the determination can be made following the insertion (i.e., inter-vivos). In certain embodiments of operation 1104, the compensation may thereby involve modifying the applied non-optical electromagnetic radiation (e.g., MRI or X-ray) applied to the individual 103 at least partially to reduce the distortion. In certain embodiments of operation 1106, which is optional, the imaging effects of the distortion compensation may be monitored and/or reviewed to determine the effectiveness of the compensation. Certain embodiments of the operation(s) 1102, 1104, and/or 1106 can thereby be at least partially configured to provide a feedback mechanism, as is known to one skilled in the art in control circuitry.

Certain embodiments of the monitoring the distortion compensating may be performed using certain embodiments of the frequency domain/time domain transform as well as the inverse frequency domain/time domain transform, as described with respect to FIGS. 10 and/or 11. FIG. 11 thereby shows a flow chart of certain embodiments of distortion compensation as can be performed by a variety of embodiments of the distortion compensator to compensate for a variety of distortions as provided by the non-optical electromagnetic radiation. For instance, after the distortion characterizing imaging information that characterizes the distortion of the distortion susceptible imaging device(s) 104 (such as may be determined by the distortion compensator) can be determined. The distortion effects as characterized by the distortion characterizing imaging information can be used to derive the input compensating information, which can in turn thereupon be used to nullify the distortion by modifying the non-optical electromagnetic radiation (e.g., magnetic field in the case of MRI, or X-ray) being applied to the distortion susceptible imaging device(s) 104 as described in portions of this disclosure. Other embodiments of distortion susceptible imaging device(s) can thereby utilize certain types of distortion compensation.

There can be a variety of mechanisms to modify non-optical electromagnetic radiation, such as may be applied to the individual. In the case of X-rays and associated particle bombardment imaging modalities, the X-rays could have their collumnation changed, the X-ray beams or projected particles could be focused, steered, occluded, at least partially blocked, shifted, or otherwise modified in a manner as known to those skilled in the art. In general, certain embodiments of the distortion compensator can modify the X-ray embodiments of the distortion susceptible imaging device(s) 104 by changing the directionality and/or energy of the X-ray based electromagnetic radiation as described in this disclosure, and generally understood in the X-ray transmission technologies. Certain embodiments of the distortion compensator 100 can thereby be configured to modify the X-ray-based non-optical electromagnetic radiation by limiting or controlling that radiation applied to the at least one distorting feature(s)

In the case of MRI and associated non-optical electromagnetic radiation, the electromagnetic field (particularly the magnetic field) could be modified by either generating a new electromagnetic field, or steering an old electromagnetic field. Certain embodiments of the distortion compensator 100 can thereby be configured to modify the MRI-based non-optical electromagnetic radiation by limiting or controlling that radiation applied to the at least one distorting feature(s). In general, certain embodiments of the distortion compensator can modify the MRI embodiments of the distortion susceptible imaging device(s) 104 by changing the directionality and/or energy of the MRI based electromagnetic radiation as described in this disclosure, and generally understood in the MRI transmission technologies.

Certain embodiments of the distortion compensator 100 can thereby be configured to reduce, control, and/or limit such electromagnetic buildup as magnetization of certain embodiments of the distorting feature as a result of stress or flexion. The magnetic effects can thereupon be removed by a de-magnetization process preceding the MRI scan using certain embodiments of the distortion compensator 100.

Certain embodiments of such embodiments of the at least the portion of the at least one distorting feature 102, such as an implant or bone, can be designed with smoothed edges or other shape characteristics to facilitate or improve the performance of the re-processing algorithm. Such contouring or configuration of certain embodiments of the distorting feature 102 may rely on similar materials, coatings, shapes, contours, absorbance, and/or surface features of the at least the portion of the at least one distorting feature 102 as generally developed for and understood in stealth design for aircraft and other vehicles, which can deflect incident non-optical electromagnetic radiation in a variety of directions, and/or absorb certain incident non-optical electromagnetic radiation.

Certain embodiments of the distortion compensator 100 can actually be configured to increase distortion applied by certain distorting feature(s), while limiting distortion resulting from other distorting feature(s). For example, it may be intended to limit distortion as caused by certain implants or other distorting feature(s) as described in this disclosure. By comparison, certain other distorting feature(s) may, depending upon the particular imaging modality, rely at least partially on emphasizing the location of the distorting feature by allowing or enhancing the distortion. For example, certain physicians, technicians, researchers, etc. who are searching for certain types of cancer cells, stem cells, or blood cells, etc. may wish to emphasize their location by allowing or enhancing their distortions such that they can be located or treated, at the same time they may wish to limit distortions of other distorting features that may otherwise cause distortions around the region. Therefore, certain embodiments of the at least one distorting feature(s) may be targeted for different types of imaging depending on their type, size, location, orientation, as well as other similar factors.

As such, certain embodiments of the distortion susceptible imaging device(s) 104 assocaited with certain embodiments of the distortion compensator 100 should be configured as to control how much compensation or emphasis to apply to types of distorting feature(s), classes of distorting feature(s), as well as individual distorting feature(s).

Certain embodiments of the distortion compensator 100 can thereby be configured to obtain the signal from the distortion susceptible imaging device(s) 104 (e.g., MRI), which can thereupon be convolved with known property of the at least the portion of the at least one distorting feature 102, based at least in part on the position and/or orientation of the distorting feature and the resultant characteristic non-optical electromagnetic radiation at the location of the distortion susceptible imaging device(s), as to remove the effects of the at least the portion of the at least one distorting feature 102 on the imaging.

2. Certain Embodiments Of The Distortion Compensator Controller

This disclosure describes a number of embodiments of the distortion compensator controller 97 as described with respect to FIG. 3, which is intended to control operations of the distortion compensator 100 to at least partially compensate for, or limit, distortions to imaging resulting from the at least the portion of the at least one distorting feature 102 as applied to individuals. As such, certain embodiments of the distortion compensator 100 can operate without, and/or with little interaction from, the distortion compensator controller 97. By comparison, certain embodiments of the distortion compensator 100 can operate with considerable input from, and/or entirely utilizing input from, the distortion compensator controller 97.

Certain embodiments of the distortion compensator 100 can include the distortion compensator controller 97; while other embodiments of the distortion compensator may not include utilizing certain embodiments of the distortion compensator controller. Alternatively, certain embodiments of the distortion compensator 100 may be at least partially digitally based, while other embodiments may be at least partially analog based. For instance, certain embodiments of the distortion compensator 100 including the distortion compensator controller 97, which are largely digital and/or microprocessor-based, can provide for largely automated actuation of signals of the distortion compensator 100 and/or the distortion susceptible imaging device(s) 104 (such as the MRI, CAT scan, PET scan, etc. as described in this disclosure). A number of the components of the distortion susceptible imaging device(s) 104 (such as the superconductive magnets for MRI, for example) may rely on analog controllers and/or computers which may be capable of generating signals of considerable strength, such as in the Tesla range. Other lower-powered signals from the distortion susceptible imaging device(s) 104 may be either analog and/or digitally controlled. Control circuitry that are configured to turn particular circuits on or off, for example, may be quite efficient and/or effective if digital based. Certain embodiments of the distortion compensator controller 97 can be configured to, upon a normal operation, compensate for at least some distortion as can be provided by the at least the portion of the at least one distorting feature 102. FIG. 3 can represent a block diagram of certain respective embodiments of the distortion compensator 100 that can include the distortion compensator controller 97 to either control the securing of the elements within the distortion compensator, or some other related operations.

Certain embodiments of the distortion compensator, as controlled by the distortion compensator controller, can be configured to computationally compensate at least some of the distortion of the at least the portion of the at least one distorting feature from the at least one image information based at least in part on the distortion characterizing imaging information and/or the input compensating information as based on the at least one relative orientation of the at least one distorting feature relative to the at least one image information. Certain embodiments of the distortion compensator, as controlled by the distortion compensator controller, can be configured to obtain the at least some input compensating information that when combined with the at least one image information can limit distortions to imaging resulting from the at least one distorting feature, wherein the distortion compensator is configured based at least in part on the at least one relative orientation of the at least one distorting feature relative to the at least one image information. These two embodiments of the distortion compensator can also operate in combination, to further limit the imaging distortion.

Certain embodiments of the distortion compensator 100 can thereby include, but are not limited to, a variety of configurations of the distortion compensator controller 97. Certain embodiments of the distortion compensator controller 97 can also be at least partially computer based, controller based, mote based, cellular telephone-based, non-optical electromagnetic based, electronic based, electromechanical based, and/or electronics based. Certain embodiments of the distortion compensator controller can be segmented into modules, and can utilize a variety of wireless communications and/or networking technologies to allow information, data, etc. to be transferred to the various distinct portions or embodiments of the distortion compensator 100. Certain embodiments of the distortion compensator controller 97 can be configured as a unitary device or a stand alone device. Certain embodiments of the distortion compensator controller 97 include an interface to allow interaction between the compensator and the end-user, who can adjust parameters based on visual observation or other expert skills, to emphasize or de-emphasize different parts of the at least the portion of the at least one distorting feature 102 to be either enhanced or ignored, or to alter the strategy being taken to perform the compensation, or to contribute to the optimization of compensation parameters.

Certain embodiments of the distortion compensator controller 97 can vary as to their automation, complexity, and/or sophistication; and can be utilized to control, setup, establish, and/or maintain communications between a number of communicating devices. As described within this disclosure, multiple ones of the different embodiments of the distortion compensator 100 can transfer information or data relating to the communication link to or from a remote location and/or some intermediate device as might be associated with communication, monitoring and/or other activities.

Certain embodiments of the distortion compensator controller 97, as well as certain embodiments of the distortion compensator 100 (in general), can utilize distinct firmware, hardware, and/or software technology. For example, mote-based technology, microprocessor-based technology, microcomputer-based technology, general-purpose computer technology, specific-purpose computer technology, Application-Specific Integrated Circuits (ASIC), and/or a variety of other computer technologies can be utilized for certain embodiments of the distortion compensator controller 97, as well as certain embodiments of the distortion compensator 100.

Certain embodiments of the distortion compensator controller 97 can as described with respect to FIG. 3 can include depending on context a processor 803 such as a central processing unit (CPU), a memory 807, a circuit or circuit portion 809, and an input output interface (I/O) 811 that may include a bus (not shown). Certain embodiments of the distortion compensator controller 97 of the distortion compensator 100 can include and/or be a portion of a general-purpose computer, a specific-purpose computer, a microprocessor, a microcontroller, a personal display assistant (PDA), a cellular phone, a wireless communicating device, a hard-wired phone, and/or any other known suitable type of communications device, computer, and/or controller that can be implemented in hardware, software, electromechanical devices, and/or firmware. Certain embodiments of the processor 803, as described with respect to FIG. 3, can perform the processing and arithmetic operations for certain embodiments of the distortion compensator controller 97 of the distortion compensator 100. Certain embodiments of the distortion compensator controller 97 of the distortion compensator 100 can control the signal processing, database querying and response, computational, timing, data transfer, and other processes associated with certain embodiments of the distortion compensator controller 97 of the distortion compensator 100.

Certain embodiments of the memory 807 of the distortion compensator controller 97 can include a random access memory (RAM) and/or read only memory (ROM) that together can store the computer programs, operands, and other parameters that control the operation of certain embodiments of the distortion compensator controller 97 of the distortion compensator 100. The memory 807 can be configurable to contain information obtained, retained, or captured by that particular distortion compensator controller 97 of the distortion compensator 100.

Certain embodiments of the bus can be configurable to provide for digital information transmissions between the processor 803, circuits 809, memory 807, I/O 811, the image memory or storage device (which may be integrated or removable), other portions within the distortion susceptible imaging device(s) 104, and/or other portions outside of the distortion susceptible imaging device(s) 104. In this disclosure, the memory 807 can be configurable as RAM, flash memory, semiconductor-based memory, of any other type of memory that can be configurable to store data pertaining to images. Certain embodiments of the bus can also connects I/O 811 to the portions of certain embodiments of the distortion compensator controller 97 of either the distortion compensator 100 that can either receive digital information from, or transmit digital information to other portions of the distortion compensator 100, or other systems and/or networking components associated with.

Certain embodiments of the distortion compensator controller 97 of the distortion compensator 100, as described with respect to FIG. 3, can include a transmitter portion (not shown) that can be either included as a portion of certain embodiments of the distortion compensator controller 97 of the distortion compensator 100. Certain embodiments of the distortion compensator controller 97 can alternately be provided as a separate unit (e.g., microprocessor-based). In certain embodiments, the transmitter portion can transmit image information between certain embodiments of the distortion compensator controller 97 of the distortion compensator 100.

Certain embodiments of the distortion compensator controller 97 of the distortion compensator 100 as described with respect to FIG. 3 can include an operation altering portion (not shown) that can be either included as a portion of certain embodiments of the distortion compensator controller 97 of the distortion compensator 100, or alternately can be provided as a separate unit (e.g., microprocessor-based).

Certain embodiments of the memory 807 can provide an example of a memory storage portion. In certain embodiments, the monitored value includes but is not limited to: a percentage of the memory 807, an indication of data that is or can be stored in the memory 807, or for data storage or recording interval. To provide for overflow ability for the memory 807 of certain embodiments of the distortion compensator controller 97 of the distortion compensator 100, a secondary storage device can be operably coupled to the memory 807 to allow a controllable transmitting of memory data from certain embodiments of the distortion compensator controller 97 of the distortion compensator 100 when the monitored value of data or other information within the memory 807 exceeds a prescribed value. The prescribed value can include, e.g., some percentage amount or some actual amount of the value.

In certain embodiments, a secondary communication link can be established between the certain embodiments of the distortion compensator controller 97 of the distortion compensator 100. The secondary communication link can be structured similar to as a communication link, or alternatively can utilize network-based computer connections, Internet connections, etc. to provide information and/or data transfer between certain embodiments of the distortion compensator controller 97 of the distortion compensator 100.

In certain embodiments of the distortion compensator controller 97 of the distortion compensator 100, the particular elements of certain embodiments of the distortion compensator controller 97 of the distortion compensator 100 (e.g., the processor 803, the memory 807, the circuits 809, and/or the I/O 811) can provide a monitoring function to convert raw data as displayed by an indicator. A monitoring function as provided by certain embodiments of the distortion compensator controller 97 of the distortion compensator 100 can be compared to a prescribed limit, such as whether the number of images contained in the memory 807, the amount of data contained within the memory 807, or some other measure relating to the memory is approaching some value. The limits to the value can, in different embodiments, be controlled by the user or the manufacturer of certain embodiments of the distortion compensator controller 97 of the distortion compensator 100. In certain embodiments, the memory 807 can store such information as data, information, displayable information, readable text, motion images, video images, and/or audio images, etc.

In certain embodiments, the I/O 811 provides an interface to control the transmissions of digital information between each of the components in certain embodiments of the distortion compensator controller 97 of the distortion compensator 100. The I/O 811 also provides an interface between the components of certain embodiments of the distortion compensator controller 97 of the distortion compensator 100. The circuits 809 can include such other user interface devices as a display and/or a keyboard. In other embodiments, the distortion compensator controller 97 of the distortion compensator 100 can be constructed as a specific-purpose computer such as an application-specific integrated circuit (ASIC), a microprocessor, a microcomputer, or other similar devices.

3. Certain Embodiments Of The Distortion Compensator With Relevant Flowcharts

Within the disclosure, flow charts of the type described in this disclosure apply to method steps as performed by a computer or controller as could be contained within certain embodiments of the distortion compensator 100, as described in this disclosure. Additionally, the flow charts as described in this disclosure apply operations or procedures that can be performed entirely and/or largely utilizing mechanical devices, electromechanical devices, or the like, such as certain embodiments of the distortion compensator 100 as described in this disclosure. The flow charts can also apply to apparatus devices, such as an antenna or a node associated therewith that can include, e.g., a general-purpose computer or specialized-purpose computer whose structure along with the software, firmware, electro-mechanical devices, and/or hardware, can perform the process or technique described in the flow chart.

Figure 17:
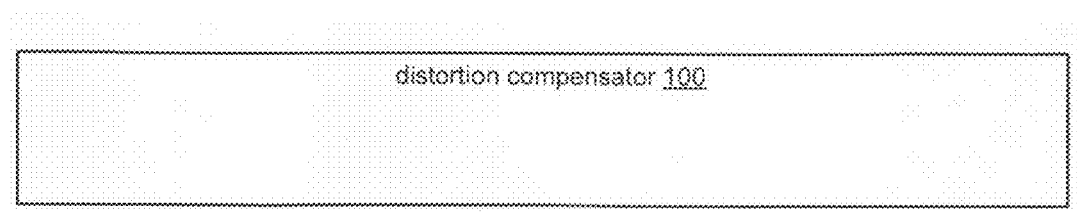
FIG. 17 is a diagram of another embodiment of the distortion compensator.

FIG. 17 shows certain embodiments of the distortion compensator 100 that can act to compensate for a distortion by the imaging device as described with respect to FIG. 3, and elsewhere in this disclosure. There can be a variety of embodiments of the distortion compensator 100 that can be configured to compensate for such inserts or implants as, but is not limited to, the surgical rod(s) or plate(s), bone replacements, etc. as described in this disclosure. Certain of the implants can be applied to or treat, for example, bony elements that can include, but are not limited to, bones, bone fragments, vertebrae, spines, etc. There can be variety of embodiments of the distortion compensator 100.

Figure 18C:
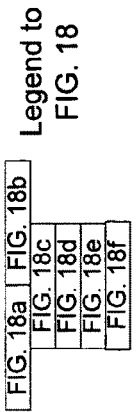
FIG. 18 (including FIGS. 18*a*, 18*b*, 18*c*, 18*d*, and/or 18*e*) is a flow chart of another embodiment of a distortion reduction technique as can be performed by the distortion compensator of FIG. 17.

FIG. 18 (including FIGS. 18a, 18b, 18c, 18d, and/or 18e) shows certain embodiments of a distortion reduction technique 2100 as performed by the distortion compensator 100 such as described with respect to, but not limited to, FIGS. 1 to 10, and elsewhere in this disclosure. Certain embodiments of a high-level flowchart of the distortion reduction technique 2100 is described with respect to FIG. 18 (including FIGS. 18a, 18b, 18c, 18d, and/or 18e) and can include, but is not limited to, operations 2102, 2104, and 2106, and/or optional operations 2160, 2162, 2164, 2166, 2168, 2170, 2172, 2174, 2175, 2176, 2178, 2180, 2182, 2184, 2186, 2188, 2190, 2192 2194, and/or 2195. Certain embodiments of operation 2102 can include, but is not limited to, 2120, 2121, 2122, 2124, 2126, 2128, 2130, and/or 2132. Certain embodiments of operation 2104 can include, but is not limited to, operations 2140, 2142, 2144, and/or 2145. Certain embodiments of operation 2106 can include, but is not limited to, operations 2150 2152, and/or 2153. The high-level flowchart of the distortion reduction technique 2100 of FIG. 18 (including FIGS. 18a, 18b, 18c, 18d, and/or 18e) should be considered in combination with the embodiments of the distortion compensator 100, as described with respect to FIG. 17, and elsewhere in this disclosure. The order of the operations, methods, mechanisms, etc. as described with respect to the distortion reduction technique 2100 of FIG. 18 (including FIGS. 18a, 18b, 18c, 18d, and/or 18e) should be considered to be illustrative in nature, and not limited in scope.

Certain embodiments of operation 2102 can include, but is not limited to: obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information. For example, certain image information can be obtained such as by capturing, photographing, imaging, retrieving from a memory of data storage device, receiving from a remote device, etc. Certain embodiments of characterizing of the distortion characterizing imaging information can characterize the at least one distorting feature based, at least in part, on a position or angle of the at least one distorting feature, relative angles of multiple ones of the at least one distorting feature, relative surface contours of the at least one distorting feature, relative shape of the at least one distorting feature, material(s) of the at least one distorting feature, etc. Certain embodiments of the image information can be obtained utilizing a variety of imaging technologies that can include, but are not limited to, magnetic resonance imaging (MRI), X-ray Computed Tomography (CT or CAT), X-ray imaging (fluoroscopy), Photon Emission Tomography (PET) scans, Single Photon Emission Computed Tomography (SPECT) scans, as well as other non-optical electromagnetic imaging, etc.

Certain embodiments of operation 2104 can include, but is not limited to: determining the at least one relative orientation of the at least the portion of the at least one distorting feature relative to an area to be imaged. For example, For example, certain embodiments of the distortion compensator can determine a relative position of the at least one distorting feature by visually viewing the at least one distorting feature (which may be at least partially internal or at least partially external to the individual), retrieving data from the distortion compensator library 776 that may be configured as the electronic library or database or detected from same or different imaging device(s) that is used to image or capture the distorted feature. For example, if MRI is used to image the individual associated with the distorted feature, then another imaging modality such as x-ray may be used to image the individual.

Certain embodiments of operation 2106 can include, but is not limited to: obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information. For example, certain embodiments of the at least some input compensating information can be obtained such as by imaging, signal processing, filtering, receiving from at least one remote device, etc. Certain embodiments of the input compensating information can be input as feedback to the image, such as a model of the distortion as caused by the at least one distorting feature. Certain embodiments of the relative orientation of the at least one distorting feature can include, but is not limited to, the angle of the at least one distorting feature, the position of the at least one distorting feature, relative angles between connected ones of the at least one distorting feature, surface contour or features of the at least one distorting feature, relative shape of the at least one distorting feature, material(s) of the at least one distorting feature, etc.

Certain embodiments of the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information of operation 2102 can include operation 2120, that can include, but is not limited to: imaging the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information. For example, the obtaining the at least one image information can include, but is not limited to, imaging the at least one image information. Certain embodiments of the operation 2102 can include operation 2121, that can include, but is not limited to: retrieving from a memory storage device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information. For example, the obtaining the at least one image information can include, but is not limited to, retrieving from memory (such as the distortion compensator library 776 that may be configured as the electronic library or database, etc.) the at least one image information. Certain embodiments of the operation 2102 can include operation 2122, that can include, but is not limited to: receiving from another device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information. For example, the obtaining the at least one image information can include, but is not limited to, receiving from another device the at least one image information. Certain embodiments of the operation 2102 can include operation 2124, that can include, but is not limited to: obtaining at least one non-optical electromagnetic image information that can be distorted at least partially resulting from the at least the portion of the at least one distorting feature, wherein the at least the portion of the at least one distorting feature can be characterized based at least in part on a non-optical electromagnetic distortion characterizing imaging information whose characterizing can vary, at least in part, based on the at least one relative orientation of the at least the portion of the at least one distorting feature relative to the at least one non-optical electromagnetic image information. For example, the obtained image information can include, but is not limited to, non-optical electromagnetic image information which in turn can include, but is not limited to, magnetic resonance imaging (MRI), X-ray imaging, X-ray Computed Tomography (CT or CAT), X-ray imaging, Photon Emission Tomography (PET) scans, Single Photon Emission Computed Tomography (SPECT) scans, the particle bombardment imaging techniques as described in this disclosure, as well as other electromagnetic imaging and/or nuclear resonance imaging, etc. Certain embodiments of the operation 2102 can include operation 2126, that can include, but is not limited to: obtaining at least one X-ray based image information that can be distorted at least partially resulting from the at least the portion of the at least one distorting feature, wherein the at least the portion of the at least one distorting feature can be characterized based at least in part on an X-ray distortion characterizing imaging information whose characterizing can vary, at least in part, based on the at least one relative orientation of the at least the portion of the at least one distorting feature relative to the at least one X-ray image information. For example, certain embodiments of the image information can include, but is not limited to, X-ray image information such as resulting from fluoroscopy, X-ray imaging, CAT scans, etc. Certain embodiments of the operation 2102 can include operation 2128, that can include, but is not limited to: obtaining at least one magnetic-resonance based image information that can be distorted at least partially resulting from the at least the portion of the at least one distorting feature, wherein the at least the portion of the at least one distorting feature can be characterized based at least in part on a magnetic-resonance based distortion characterizing imaging information whose characterizing can vary, at least in part, based on the at least one relative orientation of the at least the portion of the at least one distorting feature relative to the at least one magnetic-resonance based image information. For example, certain embodiments of the obtained image information can include, but is not limited to; magnetic-resonance imager (MRI) based image information. Certain embodiments of the operation 2102 can include operation 2130, that can include, but is not limited to: obtaining at least one nuclear resonant image information that can be distorted at least partially resulting from the at least the portion of the at least one distorting feature, wherein the at least the portion of the at least one distorting feature can be characterized based at least in part on a nuclear resonant distortion characterizing imaging information whose characterizing can vary, at least in part, based on the at least one relative orientation of the at least the portion of the at least one distorting feature relative to the at least one nuclear resonant image information. For example, certain embodiments of the obtained image information can include, but is not limited to, nuclear resonant based image information. Certain embodiments of the operation 2102 can include operation 2132, that can include, but is not limited to: obtaining at least one tomography-based image information that can be distorted at least partially resulting from the at least the portion of the at least one distorting feature, wherein the at least the portion of the at least one distorting feature can be characterized based at least in part on a tomography-based distortion characterizing imaging information whose characterizing can vary, at least in part, based on the at least one relative orientation of the at least the portion of the at least one distorting feature relative to the at least one tomography-based image information. For example, certain embodiments of the obtained image information can include, but is not limited to, tomography based image information.

Certain embodiments of the determining the at least one relative orientation of the at least the portion of the at least one distorting feature relative to an area to be imaged of operation 2104 can include operation 2140, that can include, but is not limited to: determining an at least one relative position of the at least the portion of the at least one distorting feature relative to the area to be imaged. For example, certain embodiments of the at least one relative orientation of the at least the portion of the at least one distorting feature can include, but is not limited to, the at least one relative position of the at least the portion of the at least one distorting feature. In certain instances, for example, relative positions of connected portions of the at least one distorting feature can be considered. Certain embodiments of the determining the at least one relative orientation of the at least the portion of the at least one distorting feature relative to an area to be imaged of operation 2104 can include operation 2142, that can include, but is not limited to: determining an at least one relative angle of the at least the portion of the at least one distorting feature relative to the area to be imaged. For example, in certain instances, relative angles of the at least one portion of the at least one distorting feature may be considered relative to the individual. Certain embodiments of the determining the at least one relative orientation of the at least the portion of the at least one distorting feature relative to an area to be imaged of operation 2104 can include operation 2144, that can include, but is not limited to: determining an at least one surface characteristic or material characteristic of the at least the portion of the at least one distorting feature relative to the area to be imaged. For example, certain embodiments of the at least one relative orientation of the at least the portion of the at least one distorting feature can include, but is not limited to, the at least one surface characteristic of the at least the portion of the at least one distorting feature. In certain instances, the at least one surface characteristic of the at least the portion of the at least one distorting feature can include, but is not limited to, at least one material (both surface and internal) of the at least one distorting feature. Certain embodiments of the determining the at least one relative orientation of the at least the portion of the at least one distorting feature relative to an area to be imaged of operation 2104 can include operation 2144, that can include, but is not limited to: determining the at least one relative orientation of the at least the portion of the at least one distorting feature relative to the area to be imaged, the at least one relative orientation as provided by another device. For example, the at least one relative orientation of the at least one distorting feature can be determined in operation 2104 by a different device than that which performs at least one of operation 2102 and/or 2106. By comparison, the at least one relative orientation of the at least one distorting feature can be determined in operation 2104 by the same device than that which performs at least one of operation 2102 and/or 2106.

Certain embodiments of the obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information of operation 2106 can include operation 2150, that can include, but is not limited to: obtaining at least some input time domain/frequency domain transform compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input time domain/frequency domain transform compensating information is based at least in part on the at least one relative orientation of the at least the portion of the at least one distorting feature relative to the at least one image information. For example, at least some of the input compensating information that has been obtained can include, but is not limited to, input time domain/frequency domain transform compensating information (such as Fourier Transform compensating information, Fast Fourier Transform compensating information, etc.), which can be obtained using certain embodiments of the time domain/frequency domain transforms. Certain embodiments of the obtaining at least some input compensating information at least partially based on the distortion characterizing imaging information that when applied to an imaging modality used to obtain the at least one image information can limit distortions to the at least the portion of the at least one distorting feature, wherein the obtaining the at least some input compensating information is based at least in part on the at least one relative orientation of the at least the portion of the at least one distorting feature relative to the at least one image information of operation 2106 can include operation 2152, that can include, but is not limited to: obtaining at least some input Maxwell solver compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input Maxwell solver compensating information is based at least in part on the at least one relative orientation of the at least the portion of the at least one distorting feature relative to the at least one image information. For example, at least some of the input compensating information that has been obtained can include, but is not limited to, Maxwell solvers. Certain embodiments of the obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information of operation 2106 can include operation 2153, that can include, but is not limited to: obtaining at least some input particle tracker compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input particle tracker compensating information is based at least in part on the at least one relative orientation of the at least the portion of the at least one distorting feature relative to the at least one image information. For example, at least some of the input compensating information that has been obtained can include, but is not limited to, input particle tracker information.

Certain embodiments of operation 2160 can include, but is not limited to: predicting the at least some input compensating information based at least in part on an orientation of the at least the portion of the at least one distorting feature. For example, utilizing the orientation of the at least the portion of the at least one distorting feature to predict the at least some input compensating information. Certain embodiments of such prediction the distortion characterizing information can be used in association with the distortion characterizing imaging information utilizing, for example, Maxwell solvers, Monte-Carlo techniques, particle beam analysis techniques, modeling techniques, analysis techniques, filtering techniques, stochastic techniques, etc. Certain embodiments of such predicting the at least some input compensating information can be used to computationally compensate for the distortion, as well as to model to obtain at least some input compensating information as described in this disclosure.

Certain embodiments of operation 2162 can include, but is not limited to: predicting the at least some input compensating information based at least in part on a position of the at least the portion of the at least one distorting feature. For example, predicting the at least some input compensating information based at least in part on the position of the at least one distorting feature which may be viewed, imaged (using the same or other imaging modality), obtained from a scope or scanner, or otherwise determined. Certain embodiments of operation 2164 can include, but is not limited to: predicting the at least some input compensating information based at least in part on an angle of the at least the portion of the at least one distorting feature. For example, predicting the at least some input compensating information based at least in part on an angle of the at least the portion of the at least one distorting feature. The angle of the at least the portion of the at least one distorting feature can include a relative angle of multiple (e.g., connected) ones of the at least one distorting feature. Certain embodiments of such predicting the distortion characterizing information can be used in association with the at least some input compensating information utilizing, for example, Maxwell solvers, Monte-Carlo techniques, particle beam analysis techniques, modeling techniques, analysis techniques, filtering techniques, stochastic techniques, etc. Certain embodiments of such predicting the at least some input compensating information can be used to computationally compensate for the distortion, as well as to model to obtain at least some input compensating information as described in this disclosure. Certain embodiments of operation 2166 can include, but is not limited to: predicting the at least some input compensating information based at least in part on a surface or material characteristic of the at least the portion of the at least one distorting feature. For example, predicting the at least some input compensating information based at least in part on such surface characteristic of the at least one distorting feature as surface finishes, materials, configurations, etc. Certain embodiments of operation 2168 can include, but is not limited to: predicting the at least some input compensating information based at least in part on a degrading environment which the at least the portion of the at least one distorting feature has been exposed. For example, certain embodiments of the at least one distorting feature can be degraded, wear, have it's shape modified or changed, etc. at least in part by the environment which it is exposed to. In certain instances, such degradation, wear, etc. can result in the distorting feature resulting in the shape of the input signal being used for the imaging modality having its shape being modified or changed, etc. and such input imaging shapes can be predicted and/or modeled in a somewhat reliable manner. In certain instances, such degradation, wear, have it's shape modified or changed, etc. can be stored electronically and/or retrieved from the distortion compensator library 776 that may be configured as the electronic library or database, etc. Certain portions of the at least one distorting feature may have wear parts, for example, which may wear at faster or greater rates than other parts, for example. Certain embodiments of operation 2170 can include, but is not limited to: predicting the at least some input compensating information based at least in part on a duration which the at least the portion of the at least one distorting feature has been exposed to a degrading environment. For example, certain embodiments of the at least one distorting feature can be degraded, wear, have it's shape modified or changed, etc. at least in part by the environment which it is exposed to. In certain instances, such degradation, wear, etc. can result in the distorting feature resulting in the shape of the input signal being used for the imaging modality having its shape being modified or changed, etc. and such input imaging shapes can be predicted and/or modeled in a somewhat reliable manner. In certain instances, such degradation, wear, have it's shape modified or changed, etc. can be stored electronically and/or retrieved from the distortion compensator library 776 that may be configured as the electronic library or database, etc. Certain portions of the at least one distorting feature may have wear parts, for example, which may wear at faster or greater rates than other parts, for example. Certain embodiments of operation 2172 can include, but is not limited to: predicting the at least some input compensating information based at least in part on at least one other element which the at least the portion of the at least one distorting feature at least partially contacts. For example, certain embodiments of the at least one distorting feature can have a modified distortion based at least in part on one or more other elements with which the at least one distorting feature comes in contact. Certain embodiments of operation 2174 can include, but is not limited to: establishing a library of the distortion characterizing imaging information associated with at least some of the at least the portion of the at least one distorting feature. For example, certain embodiments of the at least some input compensating information can be stored in the distortion compensator library 776 that may be configured as the electronic library or database, such as a data storage which can store, retrieve, allow accessing of, and/or allow other signal processing techniques to be performed on the at least some input compensating information. Certain embodiments of operation 2175 can include, but is not limited to: establishing the distortion compensator library 776 that may be configured as the electronic library or database of the distortion characterizing imaging information associated with at least some of the at least the portion of the at least one distorting feature. For example, certain embodiments of the at least some input compensating information can be stored in the distortion compensator library 776 that may be configured as the electronic library or database which can store, retrieve, allow accessing of, and/or allow other signal processing techniques to be performed on the at least some input compensating information. Certain embodiments of operation 2176 can include, but is not limited to: modifying the at least some input compensating information associated with at least some of the at least the portion of the at least one distorting feature. For example, certain embodiments of the at least some input compensating information can be modified, such as by filtering, processing, modulating, etc. Certain embodiments of operation 2178 can include, but is not limited to: associating the at least some input compensating information with the at least one image information. For example, certain embodiments of the at least one distorting feature having the at least some input compensating information can be compared with the at least the portion of the at least one distorting feature in such a manner as to computationally compensate for the at least some input compensating information. Certain embodiments of operation 2180 can include, but is not limited to: modifying a non-optical electromagnetic field at least partially generated utilizing the at least some input compensating information in a dynamic fashion. For example, the non-optical electromagnetic field associated with the at least one distorting feature can be shifted dynamically based at least in part on the at least some input compensating information. Such shifting of the non-optical electromagnetic field may be useful in modeling distortion resulting from the at least one distorting feature, as well as modeling at least a portion of an object (such as the individual) without the distortion. Certain embodiments of operation 2182 can include, but is not limited to: filtering the distortion at least partially resulting from the at least the portion of the at least one distorting feature at least partially based upon the at least some input compensating information. For example, a variety of filtering techniques as generally understood by those skilled in electrical engineering, signal processing, etc. (e.g., adaptive filter, Kalman filter, time domain/frequency domain filtering, etc.) can be applied to determine or model the distortion that can be provided by the at least one distorting feature, such as may be used to at least partially filter information other than that provided by the at least one distorting feature. Certain embodiments of operation 2184 can include, but is not limited to: filtering out the distortion at least partially resulting from the at least the portion of the at least one distorting feature at least partially based upon the at least some input compensating information. For example, a variety of filtering techniques as generally understood by those skilled in electrical engineering, signal processing, etc. (e.g., adaptive, Kalman, time domain/frequency domain, etc.) can be applied to filter out the distortion at least partially resulting from the at least the portion of the at least one distorting feature from the at least one image. Such filtering out could be used to reduce the level of distortions during the imaging of an object such as the individual. Certain embodiments of operation 2186 can include, but is not limited to: filtering out the distortion at least partially resulting from the at least the portion of the at least one distorting feature at least partially based upon the at least some input compensating information to limit effects of distortion on imaging of the at least the portion of the at least one distorting feature. For example, a variety of filtering techniques as generally understood by those skilled in electrical engineering, signal processing, etc. (e.g., adaptive, Kalman, time domain/frequency domain, etc.) can be applied to filter out the distortion at least partially resulting from the at least the portion of the at least one distorting feature from the at least one image. Such filtering, and the resultant decrease of distortions, can be used to improve the display of the at least the portion of the distorting feature. Certain embodiments of operation 2188 can include, but is not limited to: filtering out the distortion at least partially resulting from the at least the portion of the at least one distorting feature at least partially based upon the at least some input compensating information to limit at least some effects of the distortion on imaging of an at least a portion of an individual. For example, a variety of filtering techniques as generally understood by those skilled in electrical engineering, signal processing, etc. (e.g., adaptive, Kalman, time domain/frequency domain, etc.) can be applied to filter out the distortion at least partially resulting from the at least the portion of the at least one distorting feature from the at least one image. Such filtering, and the resultant decrease of distortions, can be used to improve the display of the at least a portion of the individual without the distorting effects of the distorting feature. Certain embodiments of operation 2190 can include, but is not limited to: observing an interface between one or more surfaces of the at least the portion of the at least one distorting feature and at least a portion of an individual. For example, certain embodiments of the limiting distortion can improve observing interfaces (such as but not limited to junctions, overlaps, occlusions, etc.) between the one or more surfaces of the at least the portion of the at least one distorting feature and the at least a portion of the individual. Certain embodiments of operation 2192 can include, but is not limited to: observing an interface between two or more surfaces of at least one of the at least the portion of the at least one distorting feature. For example, certain embodiments of the limiting distortion can improve observing interfaces (such as but not limited to junctions, overlaps, occlusions, etc.) between the two or more surfaces of the at least one of the at least the portion of the at least one distorting feature. Certain embodiments of operation 2194 can include, but is not limited to: altering a non-optical electromagnetic, magnetic, or X-ray effect as applied in proximity to the at least the portion of the at least one distorting feature at least partially in response to the at least the portion of the at least one image information. For example, the non-optical electromagnetic or X-ray effect as applied in proximity to the at least the portion of the at least one distorting feature can be altered to provide one or more of the modeling, filtering, displaying, distortion limiting, or other operations as described within this disclosure. Certain embodiments of operation 2195 can include, but is not limited to: wherein obtaining at least one image information can be at least partially obtained by imaging an individual. For example, the image information is obtained by imaging a person, animal, organism, synthetic organism, plant, etc. The order of the operations, methods, mechanisms, etc. as described with respect to FIG. 18 (including FIGS. 18*a*, 18*b*, 18*c*, 18*d*, and 18*e*) can relate to filtering out the distortion at least partially resulting from the at least the portion of the at least one distorting feature from the at least one image information to improve a display of the at least the portion of the least one distorting is intended to be illustrative in nature, and not limited in scope.

FIG. 17 shows certain embodiments of the distortion compensator 100 that can act to compensate for a distortion by the imaging device as described with respect to FIG. 3, and elsewhere in this disclosure. There can be a variety of embodiments of the distortion compensator 100 that can be configured to compensate for such inserts or implants as, but is not limited to, the surgical rod(s) or plate(s), bone replacements, etc. or other naturally occurring or man-made distorting feature(s) as described in this disclosure. Certain of the implants can be applied to or treat, for example, bony elements that can include, but are not limited to, bones, bone fragments, vertebrae, spines, etc. There can be variety of embodiments of the distortion compensator 100.

The exemplary system, apparatus, and computer program product embodiments disclosed herein including FIG. 17 along with other components, devices, know-how, skill and techniques that are known in the art have the capability of implementing and practicing the methods and processes shown in FIG. 18. However it is to be further understood by those skilled in the art that other systems, apparatus and technology may be used to implement and practice such methods and processes. Those skilled in the art will also recognize that the various aspects of the embodiments for methods, processes, products, and systems as described herein can be implemented individually and/or collectively by a wide range of hardware, software, firmware, or any combination thereof.

In one or more various aspects, related systems include but are not limited to circuitry and/or programming for effecting the herein-referenced method aspects; the circuitry and/or programming can be virtually any combination of hardware, software, electro-mechanical system, and/or firmware configurable to effect the herein-referenced method aspects depending upon the design choices of the system designer.

4. Conclusion

This disclosure provides a number of embodiments of the distortion compensator. The embodiments of the distortion compensator as described with respect to this disclosure are intended to be illustrative in nature, and are not limiting its scope.

Those having skill in the art will recognize that the state of the art in computer, controller, communications, networking, and other similar technologies has progressed to the point where there is little distinction left between hardware, firmware, and/or software implementations of aspects of systems, such as may be utilized in the distortion compensator. The use of hardware, firmware, and/or software can therefore generally represent (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle can vary with the context in which the processes and/or systems and/or other technologies are deployed. For example, if an implementer determines that speed and accuracy are paramount, the implementer and/or designer of the distortion compensator may opt for mainly a hardware and/or firmware vehicle. In alternate embodiments, if flexibility is paramount, the implementer and/or designer may opt for mainly a software implementation. In yet other embodiments, the implementer and/or designer may opt for some combination of hardware, software, and/or firmware. Hence, there are several possible techniques by which the processes and/or devices and/or other technologies described herein may be effected, none of which is inherently superior to the other in that any vehicle to be utilized is a choice dependent upon the context in which the vehicle can be deployed and the specific concerns (e.g., speed, flexibility, or predictability) of the implementer, any of which may vary.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In Certain embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

All of the above U.S. patents, U.S. patent application publications, U.S. patent applications, foreign patents, foreign patent applications and non-patent publications referred to in this specification and/or listed in any Application Data Sheet, are incorporated herein by reference, in their entireties.

It is to be understood by those skilled in the art that, in general, the terms used in the disclosure, including the drawings and the appended claims (and especially as used in the bodies of the appended claims), are generally intended as "open" terms. For example, the term "including" should be interpreted as "including but not limited to"; the term "having" should be interpreted as "having at least"; and the term "includes" should be interpreted as "includes, but is not limited to"; etc. In this disclosure and the appended claims, the terms "a", "the", and "at least one" positioned prior to one or more goods, items, and/or services are intended to apply inclusively to either one or a plurality of those goods, items, and/or services.

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that could have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that could have A alone, B alone, C alone, A and B together, A and C together, B and C together, and/or A, B, and C together, etc.).

Those skilled in the art will appreciate that the herein-described specific exemplary processes and/or devices and/or technologies are representative of more general processes and/or devices and/or technologies taught elsewhere herein, such as in the claims filed herewith and/or elsewhere in the present application.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method, comprising:
using a distortion compensator to perform the steps of:
obtaining at least one image information that can be distorted at least partially resulting from an at least a portion of at least one distorting feature, wherein the at least the portion of the at least one distorting feature can be characterized based at least in part on a distortion characterizing imaging information whose characterizing can vary, at least in part, based on an at least one relative orientation of the at least the portion of the at least one distorting feature relative to the at least one image information;
determining the at least one relative orientation of the at least the portion of the at least one distorting feature relative to an area to be imaged; and
obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information.

2. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:
imaging the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information.

3. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:
retrieving from a memory storage device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information.

4. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:
receiving from another device the at least one image information that can be distorted at least partially resulting from the at least the portion of the at least one distorting feature, wherein the at least the portion of the at least one distorting feature can be characterized based at least in part on the distortion characterizing imaging information whose characterizing can vary, at least in part, based on the at least one relative orientation of the at least the portion of the at least one distorting feature relative to the at least one image information.

5. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:

obtaining at least one non-optical electromagnetic image information that can be distorted at least partially resulting from the at least the portion of the at least one distorting feature, wherein the at least the portion of the at least one distorting feature can be characterized based at least in part on a non-optical electromagnetic distortion characterizing imaging information whose characterizing can vary, at least in part, based on the at least one relative orientation of the at least the portion of the at least one distorting feature relative to the at least one non-optical electromagnetic image information.

6. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:

obtaining at least one X-ray based image information that can be distorted at least partially resulting from the at least the portion of the at least one distorting feature, wherein the at least the portion of the at least one distorting feature can be characterized based at least in part on an X-ray distortion characterizing imaging information whose characterizing can vary, at least in part, based on the at least one relative orientation of the at least the portion of the at least one distorting feature relative to the at least one X-ray image information.

7. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:

obtaining at least one magnetic-resonance based image information that can be distorted at least partially resulting from the at least the portion of the at least one distorting feature, wherein the at least the portion of the at least one distorting feature can be characterized based at least in part on a magnetic-resonance based distortion characterizing imaging information whose characterizing can vary, at least in part, based on the at least one relative orientation of the at least the portion of the at least one distorting feature relative to the at least one magnetic-resonance based image information.

8. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:

obtaining at least one nuclear resonant image information that can be distorted at least partially resulting from the at least the portion of the at least one distorting feature, wherein the at least the portion of the at least one distorting feature can be characterized based at least in part on a nuclear resonant distortion characterizing imaging information whose characterizing can vary, at least in part, based on the at least one relative orientation of the at least the portion of the at least one distorting feature relative to the at least one nuclear resonant image information.

9. The method of claim 1, wherein the obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information further comprises:

obtaining at least one tomography-based image information that can be distorted at least partially resulting from the at least the portion of the at least one distorting feature, wherein the at least the portion of the at least one distorting feature can be characterized based at least in part on a tomography-based distortion characterizing imaging information whose characterizing can vary, at least in part, based on the at least one relative orientation of the at least the portion of the at least one distorting feature relative to the at least one tomography-based image information.

10. The method of claim 1, wherein the determining the at least one relative orientation of the at least the portion of the at least one distorting feature relative to an area to be imaged further comprises:

determining an at least one relative position of the at least the portion of the at least one distorting feature relative to the area to be imaged.

11. The method of claim 1, wherein the determining the at least one relative orientation of the at least the portion of the at least one distorting feature relative to an area to be imaged further comprises:

determining an at least one relative angle of the at least the portion of the at least one distorting feature relative to the area to be imaged.

12. The method of claim 1, wherein the determining the at least one relative orientation of the at least the portion of the at least one distorting feature relative to an area to be imaged further comprises:

determining an at least one surface characteristic or material characteristic of the at least the portion of the at least one distorting feature relative to the area to be imaged.

13. The method of claim 1, wherein the determining the at least one relative orientation of the at least the portion of the at least one distorting feature relative to an area to be imaged further comprises:

determining the at least one relative orientation of the at least the portion of the at least one distorting feature relative to the area to be imaged, the at least one relative orientation as provided by another device.

14. The method of claim 1, wherein the obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information further comprises:

obtaining at least some input time domain/frequency domain transform compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input time domain/frequency domain transform compensating information is based at least in part on the at least one relative orientation of the at least the portion of the at least one distorting feature relative to the at least one image information.

15. The method of claim 1, wherein the obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information further comprises:

obtaining at least some input Maxwell solver compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input Maxwell solver compensating information is based at least in part on the at least one relative orientation of the at least the portion of the at least one distorting feature relative to the at least one image information.

16. The method of claim 1, wherein the obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information further comprises:

obtaining at least some input particle tracker compensating information at least partially based on the distortion characterizing imaging information that when applied to the imaging modality used to obtain the at least one image information can limit the distortions to the at least the portion of the at least one image information resulting from the at least the portion of the at least one distorting feature, wherein the obtaining the at least some input particle tracker compensating information is based at least in part on the at least one relative orientation of the at least the portion of the at least one distorting feature relative to the at least one image information.

17. The method of claim 1, further comprising:
predicting the at least some input compensating information based at least in part on an orientation of the at least the portion of the at least one distorting feature.

18. The method of claim 1, further comprising:
predicting the at least some input compensating information based at least in part on a position of the at least the portion of the at least one distorting feature.

19. The method of claim 1, further comprising:
predicting the at least some input compensating information based at least in part on an angle of the at least the portion of the at least one distorting feature.

20. The method of claim 1, further comprising:
predicting the at least some input compensating information based at least in part on a surface or material characteristic of the at least the portion of the at least one distorting feature.

21. The method of claim 1, further comprising:
predicting the at least some input compensating information based at least in part on a degrading environment which the at least the portion of the at least one distorting feature has been exposed.

22. The method of claim 1, further comprising:
predicting the at least some input compensating information based at least in part on a duration which the at least the portion of the at least one distorting feature has been exposed to a degrading environment.

23. The method of claim 1, further comprising:
predicting the at least some input compensating information based at least in part on at least one other element which the at least the portion of the at least one distorting feature at least partially contacts.

24. The method of claim 1, further comprising:
establishing a library of the distortion characterizing imaging information associated with at least some of the at least the portion of the at least one distorting feature.

25. The method of claim 1, further comprising:
establishing a library of the at least some input compensating information associated with at least some of the at least the portion of the at least one distorting feature.

26. The method of claim 1, further comprising:
modifying the at least some input compensating information associated with at least some of the at least the portion of the at least one distorting feature.

27. The method of claim 1, further comprising:
associating the at least some input compensating information with the at least one image information.

28. The method of claim 1, further comprising:
modifying a non-optical electromagnetic field at least partially generated utilizing the at least some input compensating information in a dynamic fashion.

29. The method of claim 1, further comprising:
filtering the distortion at least partially resulting from the at least the portion of the at least one distorting feature at least partially based upon the at least some input compensating information.

30. The method of claim 1, further comprising:
filtering out the distortion at least partially resulting from the at least the portion of the at least one distorting feature at least partially based upon the at least some input compensating information.

31. The method of claim 1, further comprising:
filtering out the distortion at least partially resulting from the at least the portion of the at least one distorting feature at least partially based upon the at least some input compensating information to limit at least some effects of the distortion on imaging of the at least the portion of the at least one distorting feature.

32. The method of claim 1, further comprising:
filtering out the distortion at least partially resulting from the at least the portion of the at least one distorting feature at least partially based upon the at least some input compensating information to limit at least some effects of the distortion on imaging of an at least a portion of an individual.

33. The method of claim 1, further comprising:
observing an interface between one or more surfaces of the at least the portion of the at least one distorting feature and at least a portion of an individual.

34. The method of claim 1, further comprising:
observing an interface between two or more surfaces of at least one of the at least the portion of the at least one distorting feature.

35. The method of claim 1, further comprising:
altering a non-optical electromagnetic, magnetic, or X-ray effect as applied in proximity to the at least the portion of the at least one distorting feature at least partially in response to the at least the portion of the at least one image information.

36. The method of claim 1, wherein obtaining at least one image information can be at least partially obtained by imaging an individual.

37. The method of claim 1, wherein obtaining at least one image information can be at least partially obtained by imaging an individual, and wherein the individual can include at least one from a human, an animal, an organism, a medical patient, or a dental patient.

38. An apparatus, comprising:
a distortion compensator configurable to obtain at least one image information that can be distorted at least partially resulting from an at least a portion of at least one distorting feature, wherein the at least the portion of the at least one distorting feature can be characterized based at least in part on a distortion characterizing imaging information whose characterizing can vary, at least in part, based on an at least one relative orientation of the at least the portion of the at least one distorting feature relative to the at least one image information;

the distortion compensator configurable to determine the at least one relative orientation of the at least the portion of the at least one distorting feature relative to an area to be imaged; and the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information.

39. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises:
the distortion compensator configurable to obtain at least some input particle tracking analysis-based compensating information that when applied to the imaging modality used to obtain the at least one image information can limit distortions to the at least one image information resulting from the at least the portion of the at least one distorting feature.

40. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises:
the distortion compensator configurable to obtain at least some input Maxwell solvers-based compensating information that when applied to the imaging modality used to obtain the at least one image information can limit distortions to the at least one image information resulting from the at least the portion of the at least one distorting feature.

41. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises:
the distortion compensator configurable to obtain at least some input non-optical electromagnetic-based compensating information that when applied to the imaging modality used to obtain the at least one image information can limit distortions to the at least one image information resulting from the at least the portion of the at least one distorting feature.

42. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises:
the distortion compensator configurable to obtain at least some input filter-based compensating information that when applied to the imaging modality used to obtain the at least one image information can limit distortions to the at least one image information resulting from the at least the portion of the at least one distorting feature.

43. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises:

the distortion compensator configurable to obtain at least some input X-ray-based compensating information that when applied to the imaging modality used to obtain the at least one image information can limit distortions to the at least one image information resulting from the at least the portion of the at least one distorting feature.

44. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises the distortion compensator configurable to computationally compensate for at least some of the distortion of the imaging of the at least the portion of the at least one distorting feature considering, at least in part, the at least some input compensating information.

45. The apparatus of claim 38, wherein the distortion compensator configurable to obtain at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the at least one image information further comprises the distortion compensator configurable to computationally compensate for at least some of the distortion of the imaging of the at least the portion of the at least one distorting feature considering, at least in part, the at least some input compensating information.

46. The apparatus of claim 38, wherein the distortion compensator can be configured to obtain at least some input compensating information that can limit distortions to imaging resulting from the at least the portion of the at least one distorting feature as applied to imaging an individual, wherein the individual can include at least one of a person, an animal, or an organism.

47. The apparatus of claim 38, wherein the distortion compensator can be configured to temporally detect a change in the distortion.

48. The apparatus of claim 38, wherein the distortion compensator can be configured to operate automatically.

49. A system, comprising:

circuitry for obtaining at least one image information that can be distorted at least partially resulting from an at least a portion of at least one distorting feature, wherein the at least the portion of the at least one distorting feature can be characterized based at least in part on a distortion characterizing imaging information whose characterizing can vary, at least in part, based on an at least one relative orientation of the at least the portion of the at least one distorting feature relative to the at least one image information;

circuitry for determining the at least one relative orientation of the at least the portion of the at least one distorting feature relative to an area to be imaged; and circuitry for obtaining at least some input compensating information based at least in part on the distortion characterizing imaging information that when applied to an imaging modality used to obtain the at least one image information can limit distortions to the at least one image information resulting from the at least the portion of the at least one distorting feature, wherein the at least some input compensating information is based at least in part on the at least one relative orientation of the at least the portion of the at least one distorting feature relative to the imaging of the at least one image information.

50. A non-transitory computer-readable storage medium carrying one or more sequences of instructions for evaluating an expression set that is stored as data in a table, wherein execution of the one or more sequences of instructions by one or more processors causes the one or more processors to perform the steps of:

(a) obtaining at least one image information that can be distorted at least partially resulting from an at least a portion of at least one distorting feature, wherein the at least the portion of the at least one distorting feature can be characterized such as be based at least in part on a distortion characterizing imaging information whose characterizing can vary, at least in part, based on an at least one relative orientation of the at least the portion of the at least one distorting feature relative to the at least one image information;

(b) determining the at least one relative orientation of the at least the portion of the at least one distorting feature relative to an area to be imaged; and (c) obtaining at least some input compensating information at least partially based on the distortion characterizing imaging information that when applied to an imaging modality used to obtain the at least one image information can limit distortions to the at least one image information resulting from the at least the portion of the at least one distorting feature, wherein the obtaining the at least some input compensating information is based at least in part on the at least one relative orientation of the at least the portion of the at least one distorting feature relative to the at least one image information.

* * * * *